United States Patent
Bai et al.

(10) Patent No.: US 11,955,088 B2
(45) Date of Patent: Apr. 9, 2024

(54) DISPLAY SUBSTRATE AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Lu Bai, Beijing (CN); Yang Zhou, Beijing (CN); Yi Qu, Beijing (CN); Chang Luo, Beijing (CN); Huijuan Yang, Beijing (CN); Yi Zhang, Beijing (CN); Junxiu Dai, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/086,524

(22) Filed: Dec. 21, 2022

(65) Prior Publication Data
US 2023/0126436 A1 Apr. 27, 2023

Related U.S. Application Data

(63) Continuation-in-part of application No. PCT/CN2021/124137, filed on Oct. 15, 2021.

(51) Int. Cl.
*G09G 3/3266* (2016.01)
*H10K 59/121* (2023.01)
*H10K 59/131* (2023.01)

(52) U.S. Cl.
CPC ....... *G09G 3/3266* (2013.01); *H10K 59/1213* (2023.02); *H10K 59/1216* (2023.02); *H10K 59/131* (2023.02)

(58) Field of Classification Search
CPC ............... G09G 3/3266; H10K 59/131; H10K 59/1213; H10K 59/1216
See application file for complete search history.

(56) References Cited

U.S. PATENT DOCUMENTS

| 8,269,696 B2 * | 9/2012 | Tomida | G09G 3/3266 |
| | | | 315/169.3 |
| 2002/0089626 A1 | 7/2002 | Kwak et al. | |

(Continued)

FOREIGN PATENT DOCUMENTS

| WO | WO-2019176085 A1 * | 9/2019 | ......... G02F 1/13452 |
| WO | WO-2022028132 A1 * | 2/2022 | ............. G09G 3/006 |

OTHER PUBLICATIONS

Nianmao Wang, Research of Large Size 8K LCD Panel Driving Technology, A Dissertation Submitted for the Degree of Master, Oct. 2020, South China University of Technology, Guangzhou, China.

(Continued)

*Primary Examiner* — Stephen G Sherman
(74) *Attorney, Agent, or Firm* — Ling Wu; Stephen Yang; Ling and Yang Intellectual Property

(57) ABSTRACT

A display substrate includes a base substrate, multiple sub-pixels, multiple first gate drive circuits, and at least one auxiliary structure. The base substrate includes a display region and a peripheral region located at a periphery of the display region. The multiple sub-pixels are located in the display region. The multiple first gate drive circuits and the at least one auxiliary structure are located in the peripheral region. The multiple first gate drive circuits are configured to provide first gate drive signals to the multiple sub-pixels. One auxiliary structure is disposed between adjacent first gate drive circuits.

18 Claims, 27 Drawing Sheets

(56) References Cited

U.S. PATENT DOCUMENTS

| | | |
|---|---|---|
| 2006/0289939 A1 | 12/2006 | Kim et al. |
| 2011/0234932 A1 | 9/2011 | Jung et al. |
| 2015/0177546 A1 | 6/2015 | Wu |
| 2015/0380349 A1 | 12/2015 | Yan |
| 2016/0329015 A1 | 11/2016 | Ji et al. |
| 2017/0352328 A1 | 12/2017 | Jeong et al. |
| 2018/0031937 A1* | 2/2018 | Takahashi ......... G02F 1/136286 |
| 2021/0005144 A1 | 1/2021 | Long et al. |
| 2021/0020727 A1* | 1/2021 | Lin ..................... H10K 59/131 |
| 2022/0077273 A1 | 3/2022 | Qing et al. |
| 2022/0415998 A1* | 12/2022 | Liu ......................... H01L 27/12 |

OTHER PUBLICATIONS

Zhangwei Hao, Research and Design of a Ultra-wideband Low Noise Amplifier and a Mixer in SiGe BiCMOS, A Dissertation Submitted for the Degree of Master, May 2017, Xidian University, China.

\* cited by examiner

DISPLAY SUBSTRATE AND DISPLAY APPARATUS

CROSS-REFERENCE TO RELATED APPLICATION

The present application is a continuation-in-part application of International Application PCT/CN2021/124137 having an international filing date of Oct. 15, 2021, the contents of the above-mentioned application are hereby incorporated as a part of this application.

TECHNICAL FIELD

The present disclosure relates to, but is not limited to, the field of display technology, in particular to a display substrate and a display apparatus.

BACKGROUND

An Organic light-emitting Diode (OLED) and a Quantum-dot light-emitting Diode (QLED) are active light-emitting display device and have advantages such as self-illumination, wide angle of view, high contrast ratio, low power consumption, very high reaction speed, lightness and thinness, bendability, and low cost, etc.

SUMMARY

The following is a summary of subject matter described herein in detail. The summary is not intended to limit the protection scope of claims.

Embodiments of the present disclosure provide a display substrate and a display apparatus.

In one aspect, an embodiment of the present disclosure provides a display substrate including a base substrate, multiple sub-pixel circuits, multiple first gate drive circuits, and at least one auxiliary structure. The base substrate includes a display region and a peripheral region located at a periphery of the display region. The multiple sub-pixels are located in the display region. The multiple first gate drive circuits and the at least one auxiliary structure are located in the peripheral region. The multiple first gate drive circuits are configured to provide a first gate drive signal for the multiple sub-pixels. One auxiliary structure is disposed between adjacent first gate drive circuits.

In some exemplary embodiments, the auxiliary structure is located between output transistors of the adjacent first gate drive circuits.

In some exemplary implementations, the at least one auxiliary structure includes at least one first auxiliary structure. A first auxiliary structure is located between a first gate drive circuit in n-th stage and a first gate drive circuit in (n−1)-th stage, and the first gate drive circuit in the n-th stage and the first gate drive circuit in the (n−1)-th stage are not cascaded. The first gate drive circuit in the n-th stage is electrically connected to a first start signal line through the first auxiliary structure, where n is an integer.

In some exemplary implementations, the first start signal line is located at a side of the plurality of first gate drive circuits close to the display region.

In some exemplary implementations, the first gate drive circuits are electrically connected to a first power supply line and a second power supply line, the first power supply line is located at a side of the first gate drive circuits away from the display region, the second power supply line is located at a side of the first gate drive circuits close to the display region, and the first start signal line is located at a side of the second power supply line close to the display region.

In some exemplary implementations, the first auxiliary structure includes a first auxiliary semiconductor block, a first connection electrode, and a second connection electrode. The first auxiliary semiconductor block is electrically connected to an output terminal of the first gate drive circuit in the n-th stage and the second connection electrode, the second connection electrode is electrically connected to the first connection electrode, and the first connection electrode is electrically connected to the first start signal line.

In some exemplary implementations, the second connection electrode is in a same layer structure as the first start signal line, and the first auxiliary semiconductor block and the first connection electrode are located at a side of the second connection electrode close to the base substrate.

In some exemplary implementations, the at least one auxiliary structure includes at least one second auxiliary structure located between two first gate drive circuits which are cascaded.

In some exemplary implementations, the second auxiliary structure includes at least one second auxiliary semiconductor block, and an inorganic composite insulation layer covering the second auxiliary semiconductor block is provided with at least one auxiliary via exposing a surface of the second auxiliary semiconductor block.

In some exemplary implementations, an orthographic projection of the second auxiliary semiconductor block is rectangular with a length along a first direction being greater than a length along a second direction. The multiple first gate drive circuits are sequentially arranged along the second direction, wherein the first direction intersects the second direction.

In some exemplary implementations, a density of the at least one auxiliary vias of the second auxiliary structure is substantially the same as a density of the vias formed on the inorganic composite insulation layer on an active layer of the output transistors of the adjacent first gate drive circuits.

In some exemplary implementations, the second auxiliary structure includes two second auxiliary semiconductor blocks. Shapes of the two second auxiliary semiconductor blocks are substantially same, or the two second auxiliary semiconductor blocks are formed into an integrated structure.

In some exemplary embodiments, the at least one second auxiliary structure is electrically connected to the second power supply line or the first start signal line.

In some exemplary embodiments, the at least one second auxiliary structure includes at least one third auxiliary semiconductor block electrically connected to the second power supply line.

In some exemplary implementations, the at least one second auxiliary structure includes a fourth auxiliary semiconductor block, a fifth connection electrode, and a sixth connection electrode. The fourth auxiliary semiconductor block is electrically connected with the fifth connection electrode. The fifth connection electrode is electrically connected to the sixth connection electrode, and the sixth connection electrode is electrically connected to the first start signal line.

In some exemplary embodiments, the at least one second auxiliary structure includes at least one first auxiliary conductive block electrically connected to the second power supply line.

In some exemplary embodiments, the display substrate further includes at least one third auxiliary structure located on a side of the two output transistors of the at least one first gate drive circuit close to the first power supply line.

In some exemplary embodiments, the at least one third auxiliary structure includes at least one second auxiliary conductive block electrically connected to a first output of the first gate drive circuit.

In some exemplary implementations, the multiple first gate drive circuits are divided into two groups with each group including multiple cascaded first gate drive circuits; the first group of first gate drive circuits includes first gate drive circuits from the first stage to the (n−1)-th stage, and the second group of first gate drive circuits includes first gate drive circuits from the n-th stage to k-th stage. In the first group of first gate drive circuits, a first input terminal of the first gate drive circuit in the first stage is electrically connected to a second start signal line, a first output terminal of the first gate drive circuit in the k-th stage is electrically connected to a first input terminal of a first gate drive circuit in (k+1)-th stage, where k is an integer greater than 0 and less than (n−1), and K is an integer greater than n.

In some exemplary implementations, the base substrate further includes a bonding region located at a side of the display region. In the peripheral region, a first gate drive circuit in i-th stage is located at a side of a first gate drive circuit in (i−1)-th stage away from the bonding region, where i is an integer.

In some exemplary implementations, the first gate drive circuit at least includes an input transistor, an output transistor, and multiple storage capacitors, wherein the input transistor is located at a side of the output transistor away from the display region and at a side of the multiple storage capacitors close to the bonding region.

In some exemplary implementations, the display substrate further includes multiple cascaded second gate drive circuits located in the peripheral region, the second gate drive circuits are electrically connected to a second group of clock signal lines. The first gate drive circuits are electrically connected to a first group of clock signal lines, wherein a line width of at least one clock signal line in the second group of clock signal lines is larger than 1.4 times of a line width of at least one clock signal line in the first group of clock signal lines.

In some exemplary implementations, the line width of the at least one clock signal line in the second group of clock signal lines is about 15 microns to 25 microns.

In some exemplary implementations, the line width of the at least one clock signal line in the first group of clock signal lines is about 10 microns, and the line width of the at least one clock signal line in the second group of clock signal lines is about 15 microns.

In some exemplary implementations, the second gate drive circuits are located at a side of the first gate drive circuits close to the display region, the second group of clock signal lines are located at a side of the second gate drive circuits close to the first gate drive circuits, and the first group of clock signal lines are located at a side of the first gate drive circuits away from the second gate drive circuits.

In some exemplary implementations, the first gate drive signal provided by the first gate drive circuits for the multiple sub-pixels is a light-emitting control signal, and the second gate drive circuits are configured to provide a scan signal for the multiple sub-pixels.

In another aspect, an embodiment of the present disclosure provides a display apparatus, which includes the aforementioned display substrate.

Other aspects may be understood upon reading and understanding of the drawings and the detailed description.

BRIEF DESCRIPTION OF DRAWINGS

Accompanying drawings are used for providing further understanding of technical solutions of the present disclosure, constitute a part of the specification, and are used for explaining the technical solutions of the present disclosure together with the embodiments of the present disclosure, but not to constitute limitations on the technical solutions of the present disclosure. Shapes and sizes of one or more components in the drawings do not reflect actual scales, and are only intended to schematically describe contents of the present disclosure.

DETAILED DESCRIPTION

Figure 1:
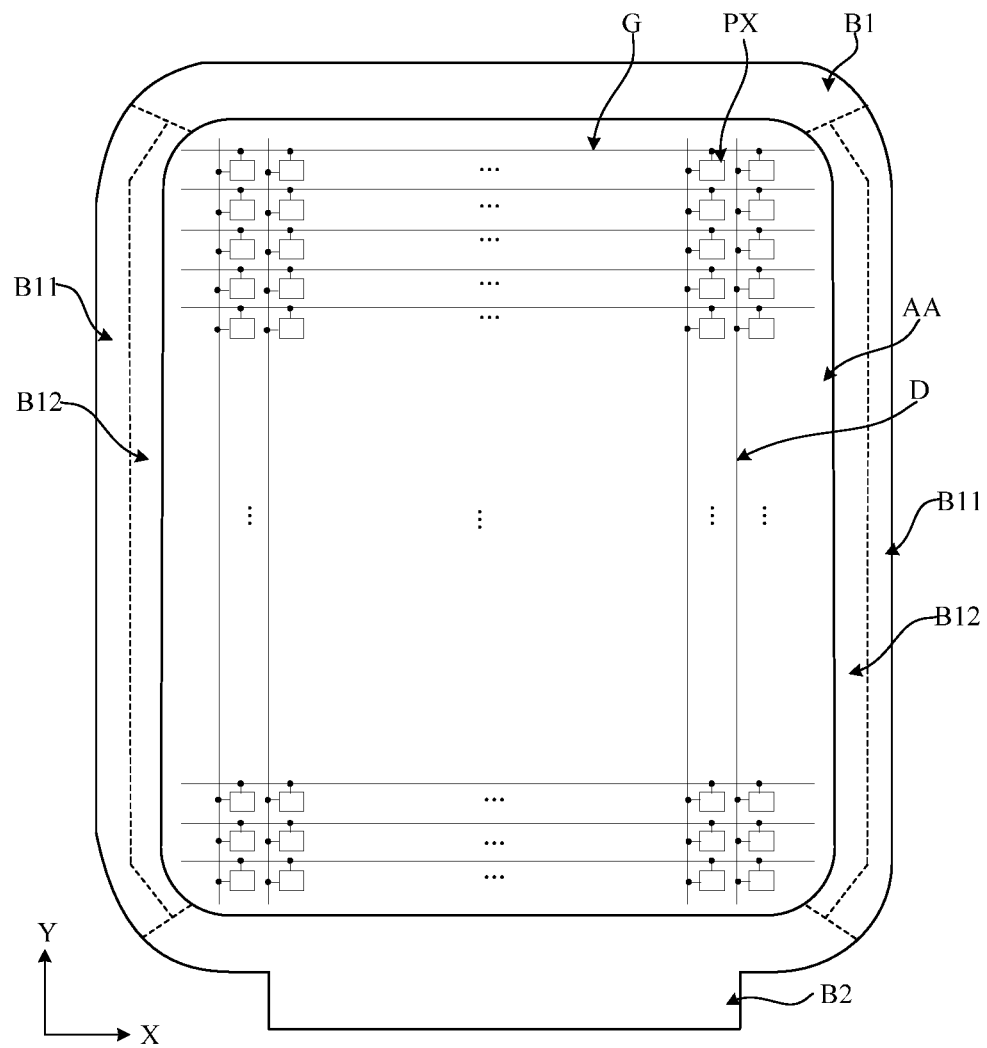
FIG. 1 is a schematic diagram of a display substrate according to at least one embodiment of the present disclosure.

The embodiments of the present disclosure will be described below in combination with the drawings in detail. Implementation modes may be implemented in multiple different forms. Those of ordinary skills in the art may easily understand such a fact that implementation modes and contents may be transformed into one or more forms without departing from the purpose and scope of the present disclosure. Therefore, the present disclosure should not be explained as being limited to contents described in following implementation modes only. The embodiments in the present disclosure and features in the embodiments may be combined randomly with each other without conflict.

In the drawings, a size of one or more constituent elements, a thickness of a layer, or a region is sometimes exaggerated for clarity. Therefore, an implementation mode of the present disclosure is not necessarily limited to the size, and a shape and a size of one or more components in the drawings do not reflect an actual scale. In addition, the drawings schematically illustrate ideal examples, and one embodiment of the present disclosure is not limited to the shapes, numerical values, or the like shown in the drawings.

Ordinal numerals such as "first", "second" and "third" in the present disclosure are set to avoid confusion between constituents, but not intended for restriction in quantity. In the present disclosure, "multiple" represents two or more than two.

In the present disclosure, sometimes for convenience, wordings "central", "up", "down", "front", "back", "vertical", "horizontal", "top", "bottom", "inside", "outside" and the like indicating orientation or positional relationships are used to illustrate positional relationships between constituent elements with reference to the drawings. These terms are not intended to indicate or imply that involved devices or elements must have specific orientations and be structured and operated in the specific orientations but only to facilitate describing the present specification and simplify the description, and thus should not be understood as limitations on the present disclosure. The positional relationships between the constituent elements may be changed as appropriate based on the directions according to which the constituent elements are described. Therefore, appropriate replacements may be made according to situations without being limited to the wordings described in the specification.

In the present disclosure, unless otherwise specified and defined, terms "mounting", "mutual connection" and "connection" should be understood in a broad sense. For example, a connection may be a fixed connection, or a detachable connection, or an integrated connection. It may be a mechanical connection or an electrical connection. It may be a direct mutual connection, or an indirect connection through middleware, or internal communication between two components. Those of ordinary skills in the art may understand meanings of the above-mentioned terms in the present disclosure according to situations. An "electrical connection" includes a case where constituent elements are connected together through an element with some electric action. The "element having some electrical function" is not particularly limited as long as electrical signals between the connected constituent elements can be transmitted. Examples of the "element with the certain electrical action" not only include electrodes and wirings, but also include switching elements such as transistors, resistors, inductors, capacitors, other elements with one or more functions, etc.

In the present disclosure, a transistor refers to an element at least including three terminals, i.e., a gate electrode (gate), a drain electrode, and a source electrode. The transistor has a channel area between the drain electrode (drain electrode terminal, drain region, or drain) and the source electrode (source electrode terminal, source region, or source), and a current can flow through the drain electrode, the channel area, and the source electrode. In the present disclosure, the channel area refers to a region through which a current mainly flows.

In the present disclosure, to distinguish two electrodes of a transistor except a gate electrode, one of the electrodes is referred to as a first electrode and the other electrode is referred to as a second electrode. The first electrode may be a source electrode or a drain electrode, and the second electrode may be a drain electrode or a source electrode. In addition, the gate electrode of the transistor is referred to as a control electrode. In cases that transistors with opposite polarities are used, a current direction changes during operation of a circuit, or the like, functions of the "source electrode" and the "drain electrode" are sometimes interchangeable. Therefore, the "source electrode" and the "drain electrode" are interchangeable in the present disclosure.

In the present disclosure, "parallel" refers to a state in which an angle formed by two straight lines is above −10 degrees and below 10 degrees, and thus may include a state in which the angle is above −5 degrees and below 5 degrees. In addition, "perpendicular" refers to a state in which an angle formed by two straight lines is above 80 degrees and below 100 degrees, and thus may include a state in which the angle is above 85 degrees and below 95 degrees.

In the present disclosure, "film" and "layer" are interchangeable. For example, a "conductive layer" may be replaced with a "conductive film" sometimes. Similarly, an "insulation film" may be replaced with an "insulation layer" sometimes.

In the present disclosure, "about", "approximate" and "approximately" refer to a case that a boundary is defined not so strictly and a process and measurement error within a range is allowed.

At least one embodiment of the present disclosure provides a display substrate including a base substrate, multiple sub-pixel circuits, multiple first gate drive circuits, and at least one auxiliary structure. The base substrate includes a display region and a peripheral region located at a periphery of the display region. The multiple sub-pixels are located in the display region. The multiple first gate drive circuits and the at least one auxiliary structure are located in the peripheral region. The multiple first gate drive circuits are configured to provide a first gate drive signal for the multiple sub-pixels. One auxiliary structure is disposed between adjacent first gate drive circuits.

In some examples, each first gate drive circuit may be a light-emitting drive circuit, and the first gate drive signal may be a light-emitting control signal. However, this embodiment is not limited thereto.

The display substrate according to this embodiment can optimize circuit pattern arrangement in the peripheral region by arranging an auxiliary structure between adjacent first gate drive circuits, thereby improving electrical performance of the display substrate.

In some exemplary implementations, the auxiliary structure may be located between output transistors of adjacent first gate drive circuits. In this example, the auxiliary structure may be adjacent to the output transistors of the first gate drive circuits.

In some exemplary implementations, the at least one auxiliary structure includes at least one first auxiliary structure. A first auxiliary structure is located between the first gate drive circuit in the n-th stage and the first gate drive circuit in the (n−1)-th stage. The first gate drive circuit in the n-th stage and the first gate drive circuit in the (n−1)-th stage are not cascaded. The first gate drive circuit in the n-th stage is electrically connected to a first start signal line through a first auxiliary structure, where n is an integer. In some examples, there is no connection between an output terminal of the first gate drive circuit in the (n−1)-th stage and an input terminal of the first gate drive circuit in the n-th stage. The first gate drive circuit in the n-th stage is electrically connected to the first start signal line through the first auxiliary structure, such that influence of static electricity accumulated by the first start signal line on the first gate drive circuit can be avoided. In some examples, the first start signal line may be located at a side of the multiple first gate drive circuits close to the display region. However, this embodiment is not limited thereto.

In the present disclosure, two gate drive circuits being in cascade connection means that there is a connection between an input terminal and an output terminal of the two gate drive circuits.

In some exemplary implementations, the first gate drive circuit is electrically connected to a first power supply line and a second power supply line. The first power supply line is located at a side of the first gate drive circuit away from the display region, and the second power supply line is located at a side of the first gate drive circuit close to the display region. The first start signal line is located at a side of the second power supply line close to the display region. In some example, the first power supply line is configured to provide a high level signal, and the second power supply line is configured to provide a low level signal.

In some exemplary implementations, a first auxiliary structure includes a first auxiliary semiconductor block, a first connection electrode, and a second connection electrode. The first auxiliary semiconductor block is electrically connected to an output terminal of the first gate drive circuit in the n-th stage and the second connection electrode. The second connection electrode is electrically connected to the first connection electrode, and the first connection electrode is electrically connected to the first start signal line. In some examples, an orthographic projection of the first auxiliary semiconductor block on the base substrate does not overlap with an orthographic projection of the first connection electrode on the base substrate. In this example, electrostatic breakdown can be avoided by connecting a first auxiliary semiconductor block having a larger resistance between the first gate drive circuit in the n-th stage and the first start signal line. In some examples, the orthographic projection of the first auxiliary semiconductor block on the base substrate may be rectangular. However, this embodiment is not limited thereto.

In some exemplary implementations, the second connection electrode is in a same layer as the first start signal line. The first auxiliary semiconductor block and the first connection electrode are located at a side of the second connection electrode close to the base substrate. For example, in a direction perpendicular to the display substrate, the peripheral region may include a base substrate, and a semiconductor layer, a first conductive layer, a second conductive layer, and a third conductive layer which are disposed on the base substrate. The second connection electrode and the first start signal line may be located in the third conductive layer, the first auxiliary semiconductor block may be located in the semiconductor layer, and the first connection electrode may be located in the first conductive layer. However, this embodiment is not limited thereto. For example, the first connection electrode may be located in the second conductive layer.

In some exemplary implementations, the at least one auxiliary structure includes at least one second auxiliary structure. A second auxiliary structure is located between the two first gate drive circuits which are cascaded. In this example, by providing a second auxiliary structure between adjacent first gate drive circuits which are cascaded, a pattern density between adjacent first gate drive circuits can be improved to ensure etching uniformity and reduce influence of an etching process on the electrical performance of the display substrate.

In some exemplary implementations, a second auxiliary structure may include at least one second auxiliary semiconductor block, and an inorganic composite insulation layer covering the second auxiliary semiconductor block is provided with at least one auxiliary via exposing a surface of the at least one second auxiliary semiconductor block. In this example, there is no electrical connection between the at least one second auxiliary semiconductor block and remaining components of the display substrate. In some examples, the inorganic composite insulation layer may include multiple inorganic layers which are stacked. In some examples, an orthographic projection of a second auxiliary semiconductor block on the base substrate may be elongated or in other shapes. An orthographic projection of an auxiliary via on the base substrate may be circular, elliptical or hexagonal. However, this embodiment is not limited thereto.

In some exemplary implementations, a density of the auxiliary vias of the second auxiliary structure may be substantially the same as a density of the vias formed on the inorganic composite insulation layer on an active layer of an output transistor of the adjacent first gate drive circuit. In this example, by configuring the density of the auxiliary vias to be approximately the same as the density of the vias of its adjacent circuit, density consistency of etched patterns in the preparation process can be ensured to reduce the influence of the etching process.

In some exemplary implementations, the base substrate may further include a bonding region located at a side of the display region. In the peripheral region, a first gate drive circuit in the i-th stage is located at a side of a first gate drive circuit in the (i−1)-th stage away from the bonding region, where i is an integer. In this example, the first gate drive circuit provides an input signal from bottom to top (i.e. from a side close to the bonding region to a side away from the bonding region), such that that arrangement of an excessively long start signal line can be avoided. However, this embodiment is not limited thereto.

In some exemplary implementations, the first gate drive circuit at least includes: an input transistor, a drive transistor and multiple storage capacitors. The input transistor is located at a side of the output transistor away from the display region and at a side of the multiple storage capacitors close to the bonding region. In this example, an input transistor of the first gate drive circuit in the i-th stage may be close to an output transistor of the first gate drive circuit in the (i−1)-th stage, so as to receive a signal from an output transistor of the first gate drive circuit in the (i−1)-th stage.

In some exemplary implementations, the display substrate may further include multiple cascaded second gate drive circuits located in the peripheral region. Multiple second gate drive circuits are electrically connected to a second group of clock signal lines, and multiple first gate drive circuits are electrically connected to a first group of clock signal lines. A line width of at least one clock signal line in the second group of clock signal lines is greater than 1.4 times of a line width of at least one clock signal line in the first group of clock signal lines. For example, the line width of the at least one clock signal line in the second group of clock signal lines may be 1.5 times of the line width of the at least one clock signal line in the first group of clock signal lines. Line widths of multiple clock signal lines within a same group of clock signal lines may be substantially the same. For example, at least one clock signal line in the second group of clock signal lines has a line width of about 11 microns to 25 microns. The line width of at least one clock signal line in the first group of clock signal lines is about 10 microns, and the line width of at least one clock signal line in the second group of clock signal lines is about 15 microns. In this example, by configuring the second group of clock signal lines to have a wider line width, load of the second group of clock signal lines can be reduced, thereby reducing an rising edge and an falling edge of the output signal of the second gate drive circuit, thus improving a display effect of the display region.

In some exemplary implementations, the second gate drive circuit is located at a side of the first gate drive circuit close to the display region. The second group of clock signal lines is located at a side of the second gate drive circuit close to the first gate drive circuit, and the first group of clock signal lines is located at a side of the first gate drive circuit away from the second gate drive circuit.

In some examples, the first gate drive circuit may be a light-emitting drive circuit configured to provide a light-emitting control signal for a sub-pixel of the display region, and the second gate drive circuit may be a scan drive circuit configured to provide a scan signal for a sub-pixel of the display region. However, this embodiment is not limited thereto.

Solutions of the embodiment will be described below through some examples. Illustration is made by taking an example in which the first gate drive circuit is a light-emitting drive circuit and the second gate drive circuit is a scanning drive circuit. The first light-emitting start signal line is the first start signal line described above, and the second light-emitting start signal line is the second start signal line described above. The first group of clock signal lines described above may include a first clock signal line ECK and a second clock signal line ECB, and the second group of clock signal lines described above may include a third clock signal line GCK and a fourth clock signal line GCB.

FIG. 1 is a schematic diagram of a display substrate according to at least one embodiment of the present disclosure. In some exemplary implementations, as shown in FIG. 1, the display substrate includes a display region AA, a peripheral region B1 located at a periphery of the display region AA, and a bonding region B2 located at a side of the display region AA. The peripheral region B1 is in communication with the bonding region B2, and the bonding region B2 is located at a side of the peripheral region B1 away from the display region AA.

In some exemplary implementation modes, the display substrate may be in an approximately rectangular shape. As shown in FIG. 1, the display substrate may include a pair of long edges that are parallel to each other in a first direction X and a pair of edges that are parallel to each other in a second direction Y. The first direction X intersects the second direction Y, for example, the first direction X is perpendicular to the second direction Y. However, this embodiment is not limited thereto. In some examples, the display substrate may be a closed polygon including linear edges, a circle or an ellipse including a curved edge, a semicircle or semi-ellipse including a linear edge and a curved edge, or the like. In some examples, at least some corners of the display substrate may be curves when the display substrate has linear edges. An intersection of adjacent linear edges may be replaced with a curve with a predetermined curvature when the display substrate is rectangular. Among them, the curvature may be set according to different positions of the curve. For example, the curvature may be changed according to a starting position of the curve, a length of the curve, etc.

In some exemplary embodiments, as shown in FIG. 1, the display region AA at least includes multiple sub-pixels PX, multiple gate lines G, and multiple data lines D. The multiple gate lines G extend along the first direction X and are arranged in turn along the second direction Y, the multiple data lines D extend in the second direction Y and are arranged in sequence in the first direction X. An orthographic projection of the multiple gate lines G on the base substrate intersect an orthographic projection of the multiple data lines D on the base substrate to form multiple sub-pixel regions, and one sub-pixel PX is arranged in each sub-pixel region. The multiple data lines D are electrically connected to multiple sub-pixels PX and the multiple data lines D are configured to provide data signals for the multiple sub-pixels PX. The multiple gate lines G are electrically connected to the multiple sub-pixels PX and the multiple gate lines G are configured to provide a gate control signal (e.g. a scan signal) for the multiple sub-pixels PX. However, this embodiment is not limited thereto.

In some exemplary implementation modes, one pixel unit may include three sub-pixels, i.e., a red sub-pixel, a green sub-pixel, and a blue sub-pixel respectively. However, this embodiment is not limited thereto. In some examples, one pixel unit may include four sub-pixels, and the four sub-pixels may be a red sub-pixel, a green sub-pixel, a blue sub-pixel, and a white sub-pixel respectively. In some examples, the sub-pixel may be shaped into a rectangle, a rhombus, a pentagon, or a hexagon. In a case that one pixel unit includes three sub-pixels, the three sub-pixels may be arranged side by side horizontally, side by side vertically, or in a delta shape. In a case that one pixel unit includes four sub-pixels, the four sub-pixels may be arranged side by side horizontally, side by side vertically, or in a shape of a square. However, this embodiment is not limited thereto.

In some exemplary implementations, as shown in FIG. 1, the peripheral region B1 may include a first circuit area B11 and a second circuit area B12. The second circuit area B12 is located at opposite sides of the display region AA in the first direction X. The first circuit area B11 is located at opposite sides of the display region AA in the first direction X. In the first direction X, the first circuit area B11 may be located at a side of the second circuit area B12 away from the display region AA. However, this embodiment is not limited thereto.

Figure 2:
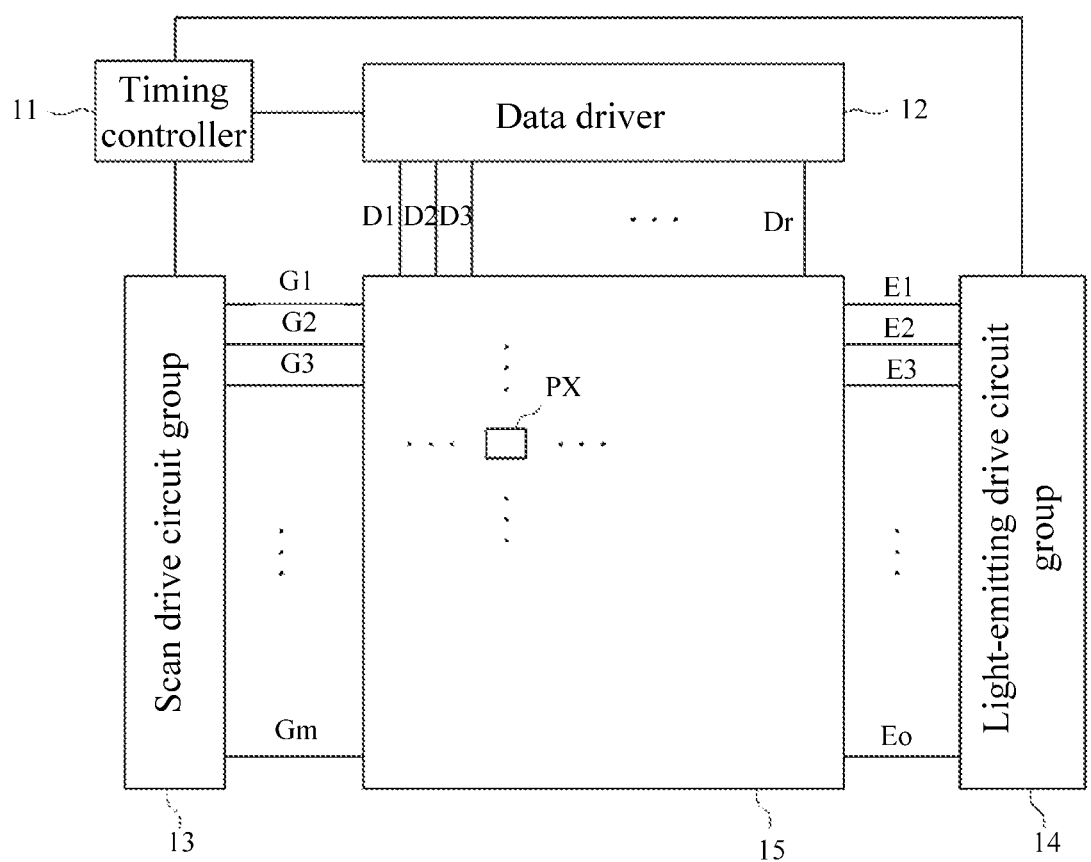
FIG. 2 is a schematic diagram of a structure of a display substrate according to at least one embodiment of the present disclosure.

FIG. 2 is a schematic diagram of a structure of a display substrate according to at least one embodiment of the present disclosure. In some exemplary implementations, as shown in FIG. 2, the display substrate may include a timing controller 11, a data driver 12, a gate drive circuit group, and a sub-pixel array 15. The gate drive circuit group may include, for example, a scan drive circuit group 13 and a light-emitting drive circuit group 14. The sub-pixel array 15 is located in the display region AA and may include multiple sub-pixels PX arranged regularly. Each sub-pixel PX may include a pixel circuit and a light-emitting element connected to the pixel circuit. The pixel circuit may include multiple transistors and at least one capacitor. For example, the pixel circuit may be of a 3T1C (three transistors and one capacitor) structure, a 7T1C (seven transistors and one capacitor) structure, or a 5T1C (five transistors and one capacitor) structure. The gate drive circuit group is located in the peripheral region B1. For example, the scan drive circuit group 13 may be located in the second circuit area B12, and the light-emitting drive circuit group 14 may be located in the first circuit area B11. The scan drive circuit group 13 includes multiple cascaded scan drive circuits configured to provide a scan signal for the sub-pixel PX along a scan line. The light-emitting drive circuit group 14 includes multiple cascaded light-emitting drive circuits configured to provide a light-emitting control signal for the sub-pixels PX along light-emitting control lines. The data driver 12 is configured to provide a data signal for a sub-pixel along a data line. The timing controller 11 is configured to control the scan drive circuit group 13, the light-emitting drive circuit group 14 and the data driver 12.

In some exemplary implementations, the timing controller 11 may provide the data driver 12 with a gray-scale value and a control signal suitable for a specification of the data driver 12. The timing controller 11 may provide the scan drive circuit 13 with a clock signal, a start signal and the like suitable for a specification of the scan drive circuit 13. The timing controller 11 may provide the light-emitting drive circuit 14 with a clock signal, a start signal and the like suitable for a specification of the light-emitting drive circuit 14. The data driver 12 may generate a data voltage to be provided to data lines D1 to Dr, using the gray-scale value and the control signal received from the timing controller 11. For example, the data driver 12 may sample the gray-scale value using the clock signal and apply a data signal corresponding to the gray-scale value on the data lines D1 to Dr by taking a row of sub-pixels as a unit. The scan drive circuit group 13 may generate a scan signal to be provided to scan lines G1 to Gm, by the clock signal and the start signal received from the timing controller 11. For example, the scan drive circuit group 13 may sequentially provide the scan signals with turn-on level pulses for the scanning lines. In some examples, the scan drive circuit group 13 may include multiple cascaded scan drive circuits and may generate a scan signal by sequentially transmitting a scan start signal provided in a form of a turn-on level pulse to a next-stage circuit under control of a clock signal. The light-emitting drive circuit 14 may receive the clock signal, the start signal, etc., from the timing controller 11 to generate a light-emitting control signal to be provided to light-emitting control lines E1 to Eo. For example, the light-emitting drive circuit group 14 may sequentially provide a light-emitting control signal with a turned-off level pulse for the light-emitting control lines. The light-emitting drive circuit group 14 may include multiple cascaded light-emitting drive circuits and may generate a light-emitting control signal by sequentially transmitting a light-emitting start signal provided in a form of a turned-off level pulse to a next-stage circuit under control of a clock signal. Among them, r, m, and o are all natural numbers.

In some exemplary implementations, the data driver 12 may be disposed on a separate chip or a printed circuit board so as to be connected to a sub-pixel through a signal access pin disposed in the bonding region of the base substrate. For example, the data driver 12 may be formed and disposed on a base substrate by employing a chip-on-glass, chip-on-plastic, chip-on-film or the like. The timing controller 11 may be provided separately from or provided integrally with the data driver 12. However, this embodiment is not limited thereto.

In some exemplary implementations, the light-emitting drive circuit and the scan drive circuit may be directly disposed on the base substrate. Multiple light-emitting drive circuits and multiple scan drive circuits may be formed together with sub-pixels in a process of forming pixel circuits of the sub-pixels.

Figure 3A:
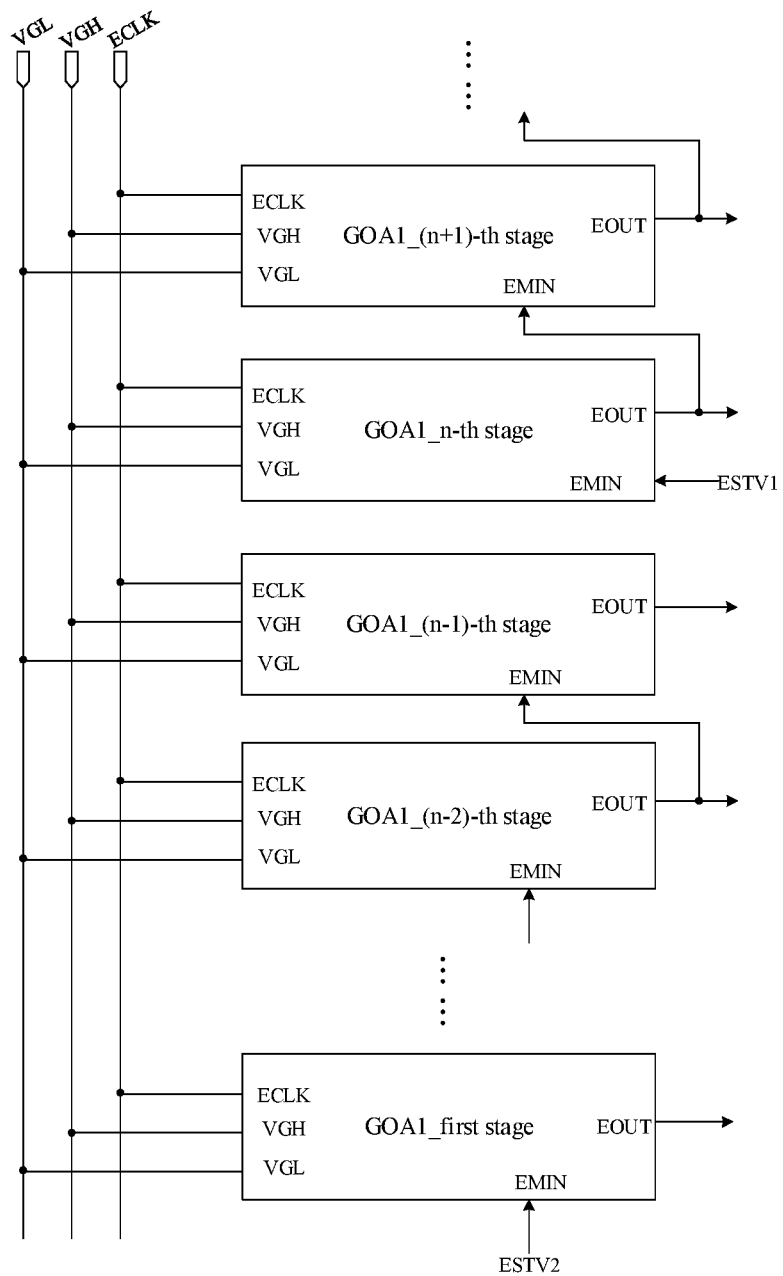
FIG. 3A is a schematic cascaded diagram of a light-emitting drive circuit according to at least one embodiment of the present disclosure.

FIG. 3A is a schematic cascaded diagram of a light-emitting drive circuit according to at least one embodiment of the present disclosure. In some exemplary implementations, as shown in FIG. 3A, a first circuit area of the peripheral region may be provided with multiple light-emitting drive circuits GOA1. The multiple light-emitting drive circuits GOA1 may be divided into two groups, wherein each group includes multiple cascaded light-emitting drive circuits GOAL Taking k light-emitting drive circuits GOA1 as an example, cascaded light-emitting drive circuits in first stage GOA1 (l) to (n−1)-th stage GOA1 (n−1) are a first group, and cascaded light-emitting drive circuits in n-th stage GOA1 (n) to k-th stage GOA1 (k) are a second group, where n is an integer less than k. In the first group of light-emitting drive circuits, a first input terminal EMIN of the light-emitting drive circuit in the first stage GOA1 (l) is electrically connected to a second light-emitting start signal line ESTV2, and a first output terminal EOUT of a light-emitting drive circuit in the (k−1)-th stage GOA1 (k−1) is electrically connected to a first input terminal EMIN of a light-emitting drive circuit in the k-th stage GOA1 (k), where k is an integer greater than 0 and less than n−1. In the second group of light-emitting drive circuits, a first input terminal EMIN of the light-emitting drive circuit in the n-th stage GOA1 (n) is electrically connected to a first light-emitting start signal line ESTV1, and a first output terminal EOUT of a light-emitting drive circuit in j-th stage GOA1 (j) is electrically connected to a first input terminal EMIN of a light-emitting drive circuit in (j+1)-th stage GOA1 (j+1), where j is an integer greater than n−1 and less than K. In this example, the two groups of light-emitting drive circuits provide light-emitting start signals by different light-emitting start signal lines. There is no cascade relationship between the light-emitting drive circuit in the (n−1)-th stage GOA1 (n−1) and the light-emitting drive circuit in the n-th stage GOA1 (n). However, this embodiment is not limited thereto. For example, the multiple light-emitting drive circuits may be divided into three groups or more, or not grouped.

In some exemplary implementations, in the first circuit area, multiple light-emitting drive circuits GOA1 may be sequentially arranged in a direction away from the bonding region. For example, a light-emitting drive circuit in i-th stage may be located at a side of a light-emitting drive circuit in (i−1)-th stage away from the bonding region, where i is an integer. The first light-emitting start signal line ESTV1 and the second light-emitting start signal line ESTV2 may be electrically connected to the drive chip disposed in the bonding region. In some examples, the light-emitting drive circuit in any stage may provide light-emitting control signals to pixel circuits of two rows of sub-pixels within the display region. However, this embodiment is not limited thereto.

Figure 3B:
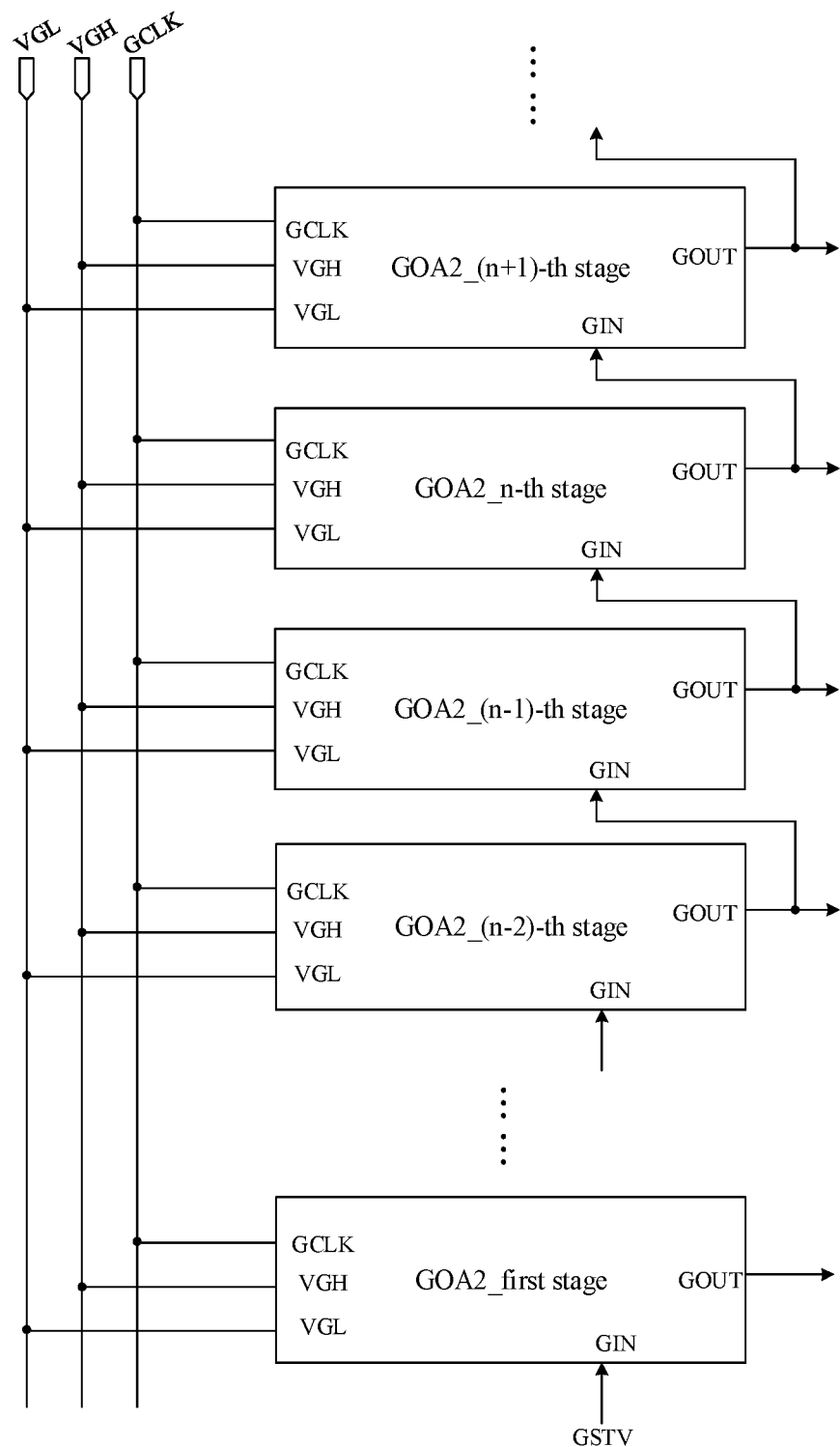
FIG. 3B is a schematic cascaded diagram of a scan drive circuit according to at least one embodiment of the present disclosure.

FIG. 3B is a schematic cascaded diagram of a scan drive circuit according to at least one embodiment of the present disclosure. In some exemplary implementations, as shown in FIG. 3B, a second circuit area of the peripheral region may be provided with multiple cascaded scan drive circuits GOA2. A second output terminal GOUT of a scan drive circuit in i-th stage GOA2 (i) is electrically connected to a second input terminal GIN of a scan drive circuit in (i+1)-th stage GOA2 (i+1), where i is an integer. A second input terminal GIN of a scan drive circuit in a first stage GOA2 (l) is electrically connected to a scan start signal line GSTV. However, this embodiment is not limited thereto. For example, the multiple scan drive circuits may be grouped to provide different scan start signals.

In some exemplary implementations, in the second circuit area, multiple scan drive circuits GOA2 may be sequentially arranged in a direction away from the bonding region. For example, a scan drive circuit in i-th stage may be located at a side of a scan driver circuit in (i−1)-th stage away from the bonding region. The scan start signal line GSTV may be electrically connected to the drive chip disposed in the bounding region. In some examples, scan drive circuit in any stage may provide a scan signal for pixel circuits of a row of sub-pixels in the display region. However, this embodiment is not limited thereto. For example, the scan drive circuit in the i-th stage may provide a scan signal for pixel circuits of a row of sub-pixels of the display region and a reset control signal to pixel circuits of a previous row of sub-pixels.

In this exemplary implementations, both the light-emitting drive circuits and the scan drive circuits are arranged in a cascade manner from bottom to top, and the scan start signal line and the second light-emitting start signal line may be electrically connected to the corresponding drive circuit in the first stage after extending from the bonding region to the peripheral region, without requiring relatively long traces.

Figure 4:
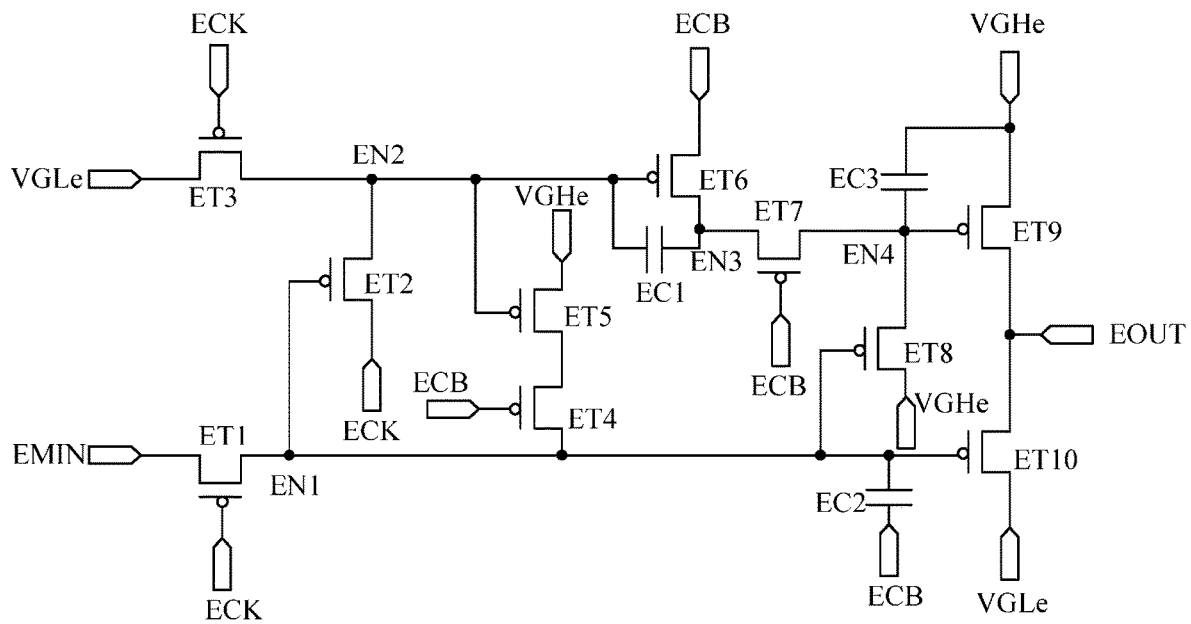
FIG. 4 is an equivalent circuit diagram of a light-emitting drive circuit according to at least one embodiment of the present disclosure.

FIG. 4 is an equivalent circuit diagram of a light-emitting drive circuit according to at least one embodiment of the present disclosure. As shown in FIG. 4, the light-emitting drive circuit according to this exemplary embodiment includes a first control transistor ET1 to a tenth control transistor ET10, a first control storage capacitor EC1, a second control storage capacitor EC2, and a third control storage capacitor EC3. The ninth control transistor ET9 and the tenth control transistor ET10 are output transistors of the light-emitting drive circuit. The first control transistor ET1 is an input transistor of the light-emitting drive circuit.

In this exemplary embodiment, as shown in FIG. 4, a control electrode of the first control transistor ET1 is electrically connected to a first clock signal terminal ECK1, a first electrode of the first control transistor ET1 is electrically connected to a first input terminal EMIN, and a second electrode of the first control transistor ET1 is electrically connected to a first control node EN1. A control electrode of the second control transistor ET2 is electrically connected to the first control node EN1, a first electrode of the second control transistor ET2 is electrically connected to the first clock signal line ECK, and a second electrode of the second control transistor ET2 is electrically connected to a second control node EN2. A control electrode of the third control transistor ET3 is electrically connected to the first clock signal line ECK, a first electrode of the third control transistor ET3 is electrically connected to a second power supply line VGLe, and a second electrode of the second control transistor ET3 is electrically connected to the second control node EN2. A control electrode of the fourth control transistor ET4 is electrically connected to a second clock signal line ECB, a first electrode of the fourth control transistor ET4 is electrically connected to a second electrode of the fifth control transistor ET5, and a second electrode of the fourth control transistor ET4 is electrically connected to the first control node EN1. A control electrode of the ninth transistor ET5 is electrically connected to the second control node EN2, and a first electrode of the ninth transistor ET5 is electrically connected to a first power supply line VGHe. A control electrode of the sixth control transistor ET6 is electrically connected to the second control node EN2, a first electrode of the sixth control transistor ET6 is electrically connected to the second clock signal line ECB, and a second electrode of the sixth control transistor ET6 is electrically connected to a third control node EN3. A control electrode of the seventh control transistor ET7 is electrically connected to the second clock signal line ECB, a first electrode of the seventh control transistor ET7 is electrically connected to the third control node EN3, and a second electrode of the seventh control transistor ET7 is electrically connected to a fourth control node EN4. A control electrode of the eighth control transistor ET8 is electrically connected to the first control node EN1, a first electrode of the eighth control transistor ET8 is electrically connected to the first power supply line VGHe, and a second electrode of the eighth control transistor ET8 is electrically connected to the fourth control node EN4. A control electrode of the ninth control transistor ET9 is electrically connected to the fourth control node EN4, a first electrode of the ninth control transistor ET9 is electrically connected to the first power supply line VGHe, and a second electrode of the ninth control transistor ET9 is electrically connected to a first output terminal EOUT. A control electrode of the tenth control transistor ET10 is electrically connected to the first control node EN1, a first electrode of the tenth control transistor ET10 is electrically connected to the second power supply line VGLe, and a second electrode of the tenth control transistor ET10 is electrically connected to the second control node EN2. A first electrode of the first control storage capacitor EC1 is electrically connected to the control electrode of the sixth control transistor ET6, and a second electrode of the first control storage capacitor EC1 is electrically connected to the third control node EN3. A first electrode of the second control storage capacitor EC2 is electrically connected to the control electrode of the tenth control transistor ET10, and a second electrode of the second control storage capacitor EC2 is electrically connected to the second clock signal line ECB. A first electrode of the third control storage capacitor EC3 is electrically connected to the control electrode of the ninth control transistor ET9, and a second electrode of the third control storage capacitor EC3 is electrically connected to the first power supply line VGHe.

In this exemplary implementation, the first control node EN1 is a connection point for the first control transistor ET1, the second control transistor ET2, the fourth control transistor ET4, the eighth control transistor ET8, the tenth control transistor ET10 and the second control storage capacitor EC2. The second control node EN2 is a connection point for the third control transistor ET3, the second control transistor ET2, the fifth control transistor ET5, the sixth control transistor ET6 and the first control storage capacitor EC1. The third control node EN3 is a connection point for the sixth control transistor ET6, the seventh control transistor ET7 and the first control storage capacitor EC1. The fourth control node EN4 is a connection point for the seventh control transistor ET7, the eighth control transistor ET8, the ninth control transistor ET9 and the third control storage capacitor EC3.

Figure 5:
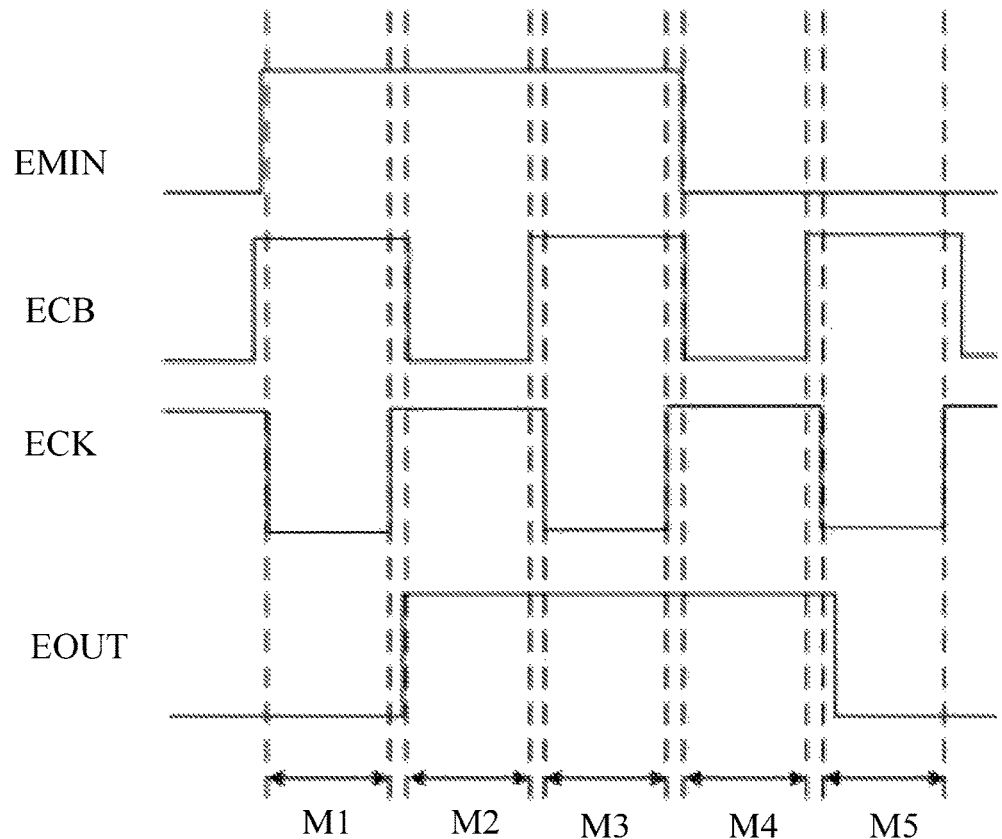
FIG. 5 is an operating timing diagram of the light-emitting drive circuit shown in FIG. 4.

The following illustration is made only with an example that the first control transistor ET1 to the tenth control transistor ET10 are all P-type transistors. The light-emitting drive circuit in the first stage is taken as an example for illustration. The first input terminal EMIN of the light-emitting drive circuit in the first stage is electrically connected to the second light-emitting start signal line ESTV2. FIG. 5 is an operating timing diagram of the light-emitting drive circuit shown in FIG. 4. As shown in FIG. 4 and FIG. 5, the light-emitting drive circuit of this exemplary embodiment includes ten transistor units (i.e., the first control transistor ET1 to the tenth control transistor ET10), three capacitor units (i.e., the first control capacitor EC1 to the third control capacitor EC3), three input terminals (i.e., the first clock signal line ECK, the second clock signal line ECB, the first input terminal EMIN), one output terminal (i.e., the first output terminal EOUT1), and two power supply terminals (i.e., the first power supply line VGHe and the second power supply line VGLe). The first power supply line VGHe keeps providing a high-level signal. The second power supply line VGLe keeps providing a low-level signal.

As shown in FIG. 4 and FIG. 5, a working process of the light-emitting drive circuit of this exemplary embodiment includes the following phases.

In a first phase M1, a first clock signal provided by the first clock signal line ECK is at a low level, so the first control transistor ET1 and the third control transistor ET3 are turned on, and the turned-on first control transistor ET1 transmits a signal of the first input terminal EMIN with a high level to the first control node EN1, such that a level of the first control node EN1 turns into high level, then the second control transistor ET2, the eighth control transistor ET8 and the tenth control transistor ET10 are turned off. In addition, the turned-on third control transistor ET3 transmits a signal of the second power supply line VGLe with a low level to the second control node EN2, such that a level of the second control node EN2 turns into low level, then the fifth control transistor ET5 and the sixth control transistor ET6 are turned on. Since the second clock signal provided by the second clock signal line ECB is at a high level, the fourth control transistor ET7 and the seventh control transistor ET4 are turned off. In addition, the ninth control transistor ET9 is turned off due to a storage effect of the third control storage capacitor EC3. In the first phase M1, since both the ninth control transistor ET9 and the tenth control transistor ET10 are turned off, a signal of the first output terminal EOUT is kept at a previous low level.

In a second phase M2, the second clock signal provided by the second clock signal line ECB is at a low level, so the fourth control transistor ET4 and the seventh control transistor ET7 are turned on. Since the signal of the first clock signal line ECK is at the high level, the first control transistor ET1 and the third control transistor ET3 are turned off. Due to the storage effect of the first control storage capacitor EC1, the second control node EN2 may maintain the low level of the previous phase, so the fifth control transistor ET5 and the sixth control transistor ET6 are turned on. A signal of the first power supply line VGHe with a high level is transmitted to the first control node EN1 through the fifth control transistor ET5 and the fourth control transistor ET4 which are turned on, such that a level of the first control node EN1 continues to be kept at the high level of the previous phase, so the second control transistor ET2, the eighth control transistor ET8 and the tenth control transistor ET10 are turned off. In addition, the signal of the second clock signal line ECB with the low level is transmitted to the control electrode of the ninth control transistor ET9 through the sixth control transistor ET6 and the seventh control transistor ET7 which are turned on, the ninth control transistor ET9 is turned on and the turned-on ninth control transistor ET9 outputs the signal of the first power supply line VGHe with a high level, so the signal of the first output terminal EOUT is at a high level.

In a third phase M3, the first clock signal of the first clock signal line ECK is at the low level, so the first control transistor ET1 and the third control transistor ET3 are turned on. Since the signal of the second clock signal line ECB is at a high level, the fourth control transistor ET4 and the seventh control transistor ET7 are turned off. Due to a storage effect of the third control storage capacitor EC3, the ninth control transistor ET9 maintains a turned-on state, and the turned-on ninth control transistor ET9 outputs the signal of the first power supply line VGHe with the high level, and the signal of the first output terminal EOUT is still at the high level.

In a fourth stage M4, the first clock signal of the first clock signal line ECK is at a high level, so the first control transistor ET1 and the third control transistor ET3 are turned off. The signal of the second clock signal line ECB is at a low level, so the fourth control transistor ET4 and the seventh control transistor ET7 are turned on. Due to a storage effect of the second control storage capacitor EC2, the level of the first control node EN1 maintains the high level of the previous phase, such that the second control transistor ET2, the eighth control transistor ET8 and the tenth control transistor ET10 are turned off. Due to a storage effect of the first control storage capacitor EC1, the second control node EN2 continues to be kept at the low level of the previous phase, such that the fifth control transistor ET5 and the sixth control transistor ET6 are turned on. In addition, the signal of the second clock signal line ECB with a low level is transmitted to the control electrode of the ninth control transistor ET9 through the sixth control transistor ET6 and the seventh control transistor ET7 which are turned on, so the ninth control transistor ET9 is turned on and the turned-on ninth control transistor ET9 outputs the signal of the first power supply line VGHe with a high level, so the signal of the first output terminal EOUT is still at a high level.

In a fifth phase M5, the signal of the first clock signal line ECK is at a low level, so the first control transistor ET1 and the third control transistor ET3 are turned on. Since the signal of the second clock signal line ECB is at a high level, the fourth control transistor ET4 and the seventh control transistor ET7 are turned off. The turned-on first control transistor ET1 transmits a signal of the control input terminal EMIN with a low level to the first control node EN1, such that the level of the first control node EN1 turns into low level, then the second control transistor ET2, the eighth control transistor ET8, and the tenth control transistor ET10 are turned on. The turned-on second control transistor ET2 transmits the signal of the first clock signal line ECK with the low level to the second control node EN2, such that the level of the second control node EN2 may be further lowered and the second control node EN2 continues to be kept at the low level of the previous phase, and thus the fifth control transistor ET5 and the sixth control transistor ET6 are turned on. In addition, the turned-on eighth control transistor ET8 transmits the signal of the first power supply line VGHe with the high level to the control electrode of the ninth control transistor ET9, so the ninth control transistor ET9 is turned off. The turned-on tenth control transistor ET10 outputs the signal of the second power supply line VGLe with the low level, and then the signal of the first output terminal EOUT turns into a low level.

The first output terminal EOUT of the light-emitting drive circuit provided in this exemplary embodiment can provide a light-emitting control signal for a pixel circuit of the display region through the light-emitting control line.

Figure 6A:
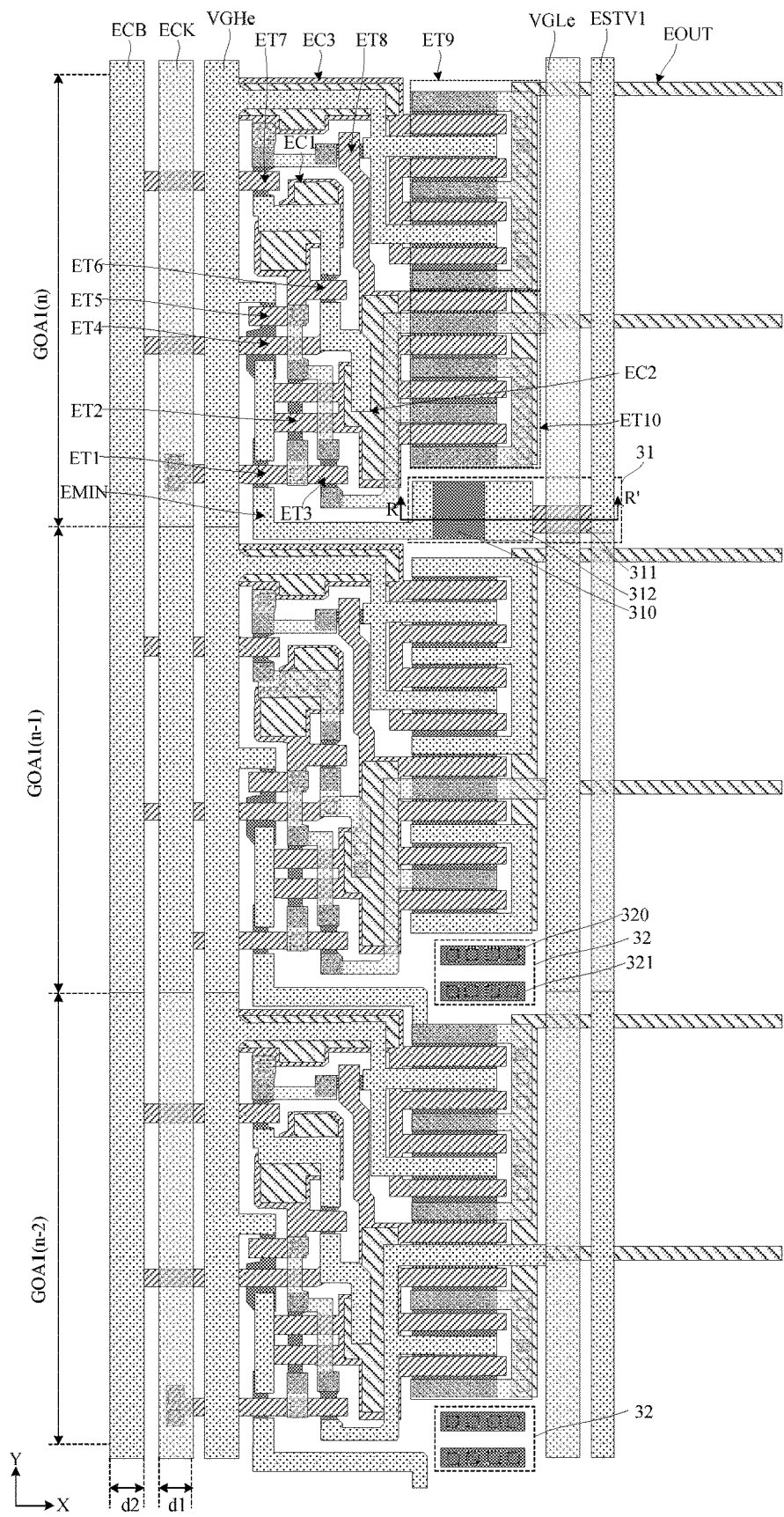
FIG. 6A is a schematic top view of a first circuit area according to at least one embodiment of the present disclosure.

FIG. 6A is a schematic top view of a first circuit area according to at least one embodiment of the present disclosure. FIG. 6A illustrates three light-emitting drive circuits (i.e. a light-emitting drive circuit in (n−2)-th stage to a light-emitting drive circuit in n-th stage) of the first circuit area as an example. A first output terminal of the light-emitting drive circuit in the (n−2)-th stage GOA1 (n−2) is electrically connected to a first input terminal of the light-emitting drive circuit in (n−1)-th stage GOA1 (n−1), and a first input terminal of the light-emitting drive circuit in the n-th stage GOA1 (n) is electrically connected to the first light-emitting start signal line ESTV1. The following will explain the structure in top view of the light-emitting drive circuit in the n-th stage as an example.

In some exemplary implementations, as shown in FIG. 6A, in a direction parallel to the display substrate, the first power supply line VGHe, the first clock signal line ECK, and the second clock signal line ECB are located at a side of the light-emitting drive circuit away from the display region along the first direction X, and are arranged in sequence along a direction away from the display region. The second power supply line VGLe and the first light-emitting start signal line ESTV1 are located at a side of the light-emitting drive circuit close to the display region in the first direction X. The first light-emitting start signal line ESTV1 is located at a side of the second power supply line VGLe close to the display region. The first power supply line VGHe, the first clock signal line ECK, the second clock signal line ECB, the second power supply line VGLe, and the first light-emitting start signal line ESTV1 all extend along the second direction Y.

In some exemplary implementations, as shown in FIG. 6A, a line width d1 of the first clock signal line ECK and a line width d2 of the second clock signal line ECB may be substantially the same. For example, d1 and d2 may be about 8 μm to 12 μm, such as about 10 μm. In some examples, a line width of the first power supply line VGHe and a second power supply line VGLe may be about 5 μm, and a line width of the first light-emitting start signal line ESTV1 may be about 3.5 μm. However, this embodiment is not limited thereto.

In the present disclosure, "line width" is a size of wiring in a direction perpendicular to its extension direction in a direction parallel to the display substrate.

In some exemplary implementations, as shown in FIG. 6A, the light-emitting drive circuit is located between the second power supply line VGLe and the first power supply line VGHe. The seventh control transistor ET7, the fifth control transistor ET5, the fourth control transistor ET4, and the first control transistor ET1 are arranged in sequence along the second direction Y and are located at a side of the first power supply line VGHe close to the display region. The eighth control transistor ET8 is located between the seventh control transistor ET7 and the ninth control transistor ET9 in the first direction X. The sixth control transistor ET6 is located at a side of the fifth control transistor ET5 away from the first power supply line VGHe. The first control transistor ET1, the second control transistor ET2, and the third control transistor ET3 are sequentially arranged along the first direction X and are located between the first power supply line VGLe and the second control storage capacitor EC2. The tenth control transistor ET10 is located between the second control storage capacitor EC2 and the second power supply line VGLe. The ninth control transistor ET9 and the tenth control transistor ET10 are sequentially arranged along the second direction Y. The third control storage capacitor EC3, the first control storage capacitor EC1, and the second control storage capacitor EC2 are sequentially arranged along the second direction Y. The third control storage capacitor EC3 is located at a side of the seventh control transistor ET7 and the eighth control transistor ET8 away from the first control storage capacitor EC1. The first control storage capacitor EC1 is located between the seventh control transistor ET7 and the sixth control transistor ET6. The first control transistor ET1 is located at a side of the tenth control transistor ET10 away from the display region and at a side of the second control storage capacitor EC2 close to the light-emitting drive circuit in the previous stage.

In some exemplary implementations, an auxiliary structure is provided between adjacent light-emitting drive circuits. As shown in FIG. 6A, a first auxiliary structure 31 is provided between the light-emitting drive circuit in the (n−1)-th stage GOA1 (n−1) and the light-emitting drive circuit in the n-th stage GOA1 (n). A first input terminal EMIN of the light-emitting drive circuit in the n-th stage GOA1 (n) is electrically connected to the first light-emitting start signal line ESTV1 through the first auxiliary structure 31. The first auxiliary structure 31 may be located between the tenth control transistor ET10 of the light-emitting drive circuit in the n-th stage GOA1 (n) and the ninth control transistor of the light-emitting drive circuit in the (n−1)-th stage GOA1 (n−1)th.

In some exemplary implementations, as shown in FIG. 6A, the first auxiliary structure 31 may include a first auxiliary semiconductor block 310, a first connection electrode 311 and a second connection electrode 312. Two ends of the first auxiliary semiconductor block 310 are electrically connected to the first input terminal EMIN of the light-emitting drive circuit in n-th stage and the second connection electrode 312 respectively, and the second connection electrode 312 is further electrically connected to the first connection electrode 311. The first connection electrode 311 is electrically connected to the first light-emitting start signal line ESTV1. An orthographic projection of the first auxiliary semiconductor block 310 on the base substrate may be rectangular. For example, a length of the first auxiliary semiconductor block 310 along the first direction X may be greater than its length in the second direction Y. An orthographic projection of the first auxiliary semiconductor block 310 on the base substrate does not overlap with an orthographic projection of the first connection electrode 311 on the base substrate.

In this exemplary implementation, two light-emitting start signal lines are used to provide a light-emitting start signal for multiple light-emitting drive circuits to reduce power consumption. The light-emitting drive circuit in the n-th stage is electrically connected to the first light-emitting start signal line ESTV1, and the light-emitting drive circuit in the first stage is electrically connected to the second light-emitting start signal line ESVT2. Since the light-emitting drive circuit in the n-th stage is located at a side of the light-emitting drive circuit in the first stage away from the bonding region, the first light-emitting start signal line ESTV1 extends from the bonding region to the first circuit area, requiring a longer wiring and being readily to accumulate static electricity. In the design of present example, the first light-emitting start signal line ESTV1 is electrically connected to the light-emitting drive circuit in the n-th stage through the first auxiliary structure 31, and the first auxiliary structure 31 includes a first auxiliary semiconductor block 310 with a relative large resistance, such that electrostatic breakdown caused by electrostatic accumulation of the longer first light-emitting start signal line ESTV1 can be avoided, thereby protecting the light-emitting drive circuit.

In some exemplary implementation, as shown in FIG. 6A, a second auxiliary structure 32 is provided between the light-emitting drive circuit in the (n−2)-th stage GOA1 (n−2) and the light-emitting drive circuit in the (n−1)-th stage GOA1 (n−1), and a second auxiliary structure 32 is also provided between the light-emitting drive circuit in the (n−2)-th stage GOA1 (n−2) and the light-emitting drive circuit in (n−3)-th stage. The second auxiliary structure 32 between the light-emitting drive circuit in the (n−2)-th stage GOA1 (n−2) and the light-emitting drive circuit in the (n−1)-th stage GOA1 (n−1) may be located between the ninth control transistor ET9 of the light-emitting drive circuit in the (n−2)-th stage GOA1 (n−2) and the tenth control transistor ET10 of the light-emitting drive circuit in the (n−1)-th stage GOA1 (n−1).

In some exemplary embodiments, as shown in FIG. 6A, the second auxiliary structure 32 may include two second auxiliary semiconductor blocks 320 and 321. The inorganic composite insulation layer covering each second auxiliary semiconductor block is provided with multiple auxiliary vias (e.g. four auxiliary vias) exposing a surface of the second auxiliary semiconductor block. In some examples, orthographic projections of the second auxiliary semiconductor blocks 320 and 321 on the base substrate may be rectangular, and a length thereof along the first direction X is greater than a length thereof along the second direction Y. Shapes of the two second auxiliary semiconductor blocks 320 and 321 may be substantially the same. The two second auxiliary semiconductor blocks 320 and 321 may be sequentially arranged along the second direction Y. However, this embodiment is not limited thereto. In some examples, the second auxiliary semiconductor blocks 320 and 321 may be formed into an integrated structure. The second auxiliary structure 32 is not electrically connected to the light-emitting drive circuits and only fills an empty region between two adjacent cascaded light-emitting drive circuits. In this example, by providing the second auxiliary structure between the cascaded light-emitting drive circuits, consistency of pattern density of the first circuit area can be ensured, and influence of the etching process on the wiring of the first circuit area and the electrical performance of the transistor due to a difference of pattern density can be avoided.

In some examples, density or arrangement of the auxiliary vias may be consistent with the density or arrangement of the vias in the regions where the tenth control transistor and the ninth control transistor of the light-emitting drive circuit are located that expose the active layer. However, this embodiment is not limited thereto.

Figure 6B:
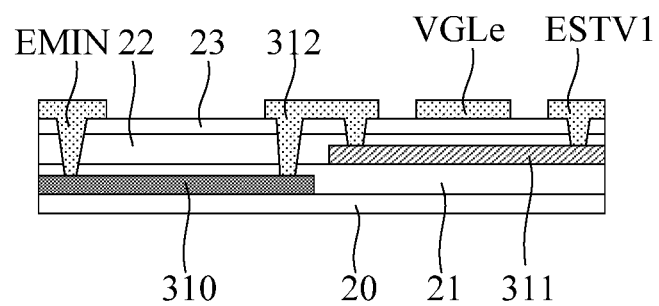
FIG. 6B is a schematic partial sectional view along an R-R' direction in FIG. 6A.

FIG. 6B is a schematic partial sectional view along R-R' direction in FIG. 6A. In some exemplary implementations, as shown in FIG. 6B, in a direction perpendicular to the display substrate, the peripheral region of the display substrate may include a semiconductor layer, a first conductive layer, a second conductive layer, and a third conductive layer that are disposed on the base substrate 20 sequentially. In some examples, a first insulation layer 21 is disposed between the semiconductor layer and the first conductive layer, a second insulation layer 22 is disposed between the first conductive layer and the second conductive layer, and a third insulation layer 23 is disposed between the second conductive layer and the third conductive layer. In this example, the inorganic composite insulation layer covering the semiconductor layer may include the first insulation layer 21 to the third insulation layer 23. The first insulation layer 21 to the third insulation layer 23 are each made of an inorganic material. However, this embodiment is not limited thereto. In some examples, a planarization layer, an anode layer, a pixel definition layer, an organic light-emitting layer, a cathode layer, and an encapsulating layer may further be sequentially disposed at a side of the third conductive layer of the display region of the display substrate away from the base substrate.

Figure 7A:
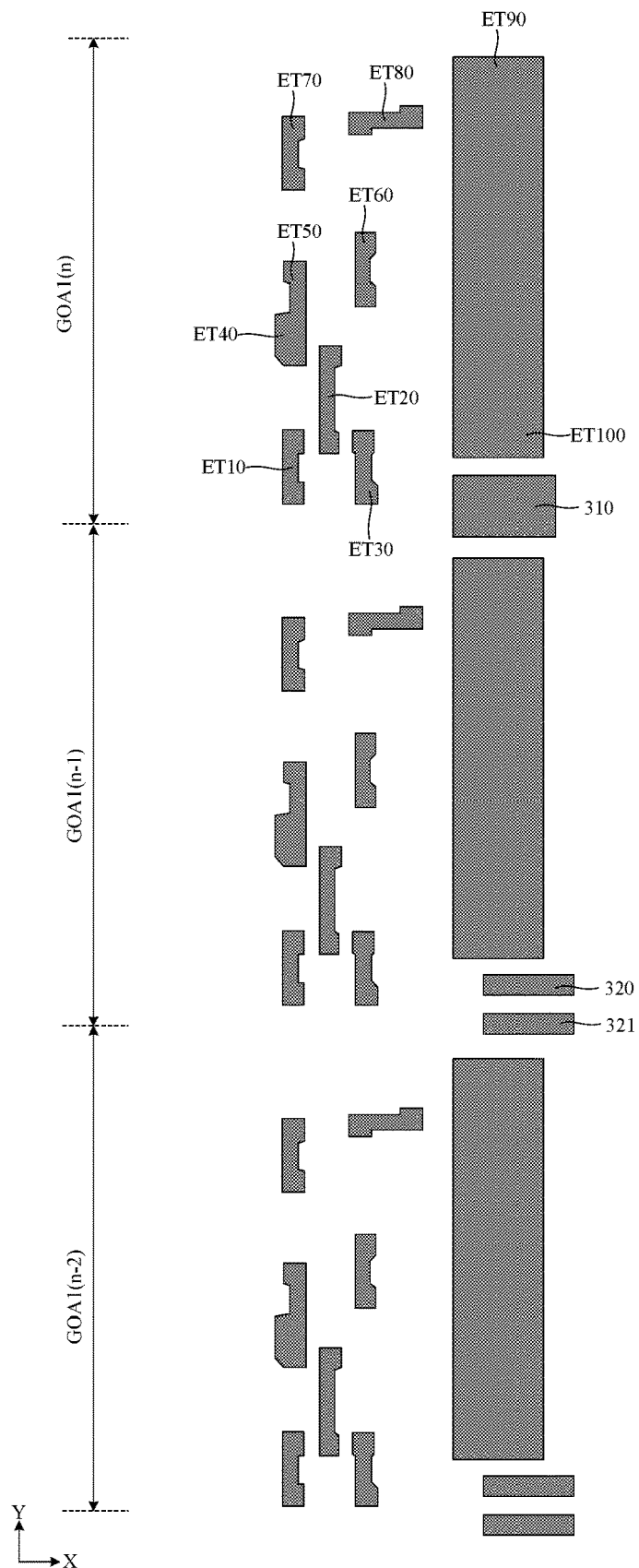
FIG. 7A is a schematic partial planar view of a first circuit area after a semiconductor layer is formed according to at least one embodiment of the present disclosure.

FIG. 7A is a schematic partial planar view of a first circuit area after a semiconductor layer is formed according to at least one embodiment of the present disclosure. In some exemplary implementations, as shown in FIG. 7A, the semiconductor layer of the first circuit area of the peripheral region at least includes: active layers of multiple transistors of a light-emitting drive circuit (e.g., an active layer ET10 of the first control transistor, an active layer ET20 of the second control transistor, an active layer ET30 of the third control transistor, an active layer ET40 of the fourth control transistor, an active layer ET50 of the fifth control transistor, an active layer ET60 of the sixth control transistor, an active layer ET70 of the seventh control transistor, an active layer ET80 of the eighth control transistor, an active layer ET90 of the ninth control transistor, and an active layer ET100 of the tenth control transistor), a first auxiliary semiconductor block 310 of a first auxiliary structure, and two second auxiliary semiconductor blocks 320 and 321 of a second auxiliary structure.

In some exemplary implementations, as shown in FIG. 7A, the active layer ET40 of the fourth control transistor and the active layer ET50 of the fifth control transistor may be formed into an integrated structure. The active layer ET90 of the ninth control transistor and the active layer ET100 of the tenth control transistor may be formed into an integrated structure. The first auxiliary semiconductor block 310 is located between the active layer ET100 of the tenth control transistor and the active layer of the ninth control transistor of two adjacent light-emitting drive circuits. An orthographic projection of the first auxiliary semiconductor block 310 on the base substrate may be rectangular. Two second auxiliary semiconductor blocks 320 and 321 of the second auxiliary structure are sequentially arranged along the second direction Y. In some examples, the two second auxiliary semiconductor blocks 320 and 321 of the second auxiliary structure may be formed into an integrated structure. However, this embodiment is not limited thereto.

In some exemplary embodiments, a material of the semiconductor layer may include, for example, polysilicon. An active layer may include at least one channel area and multiple doped areas. The channel area may not be doped with an impurity, and has characteristics of a semiconductor. The multiple doped areas may be on two sides of the channel area and are doped with impurities, and thus have conductivity. The impurities may be changed according to types of transistors. In some examples, a doped area of an active layer may be interpreted as a source electrode or drain electrode of a transistor. A part of the active layer between the transistors may be interpreted as a wiring doped with an impurity, and may be used for electrically connecting the transistors.

Figure 7B:
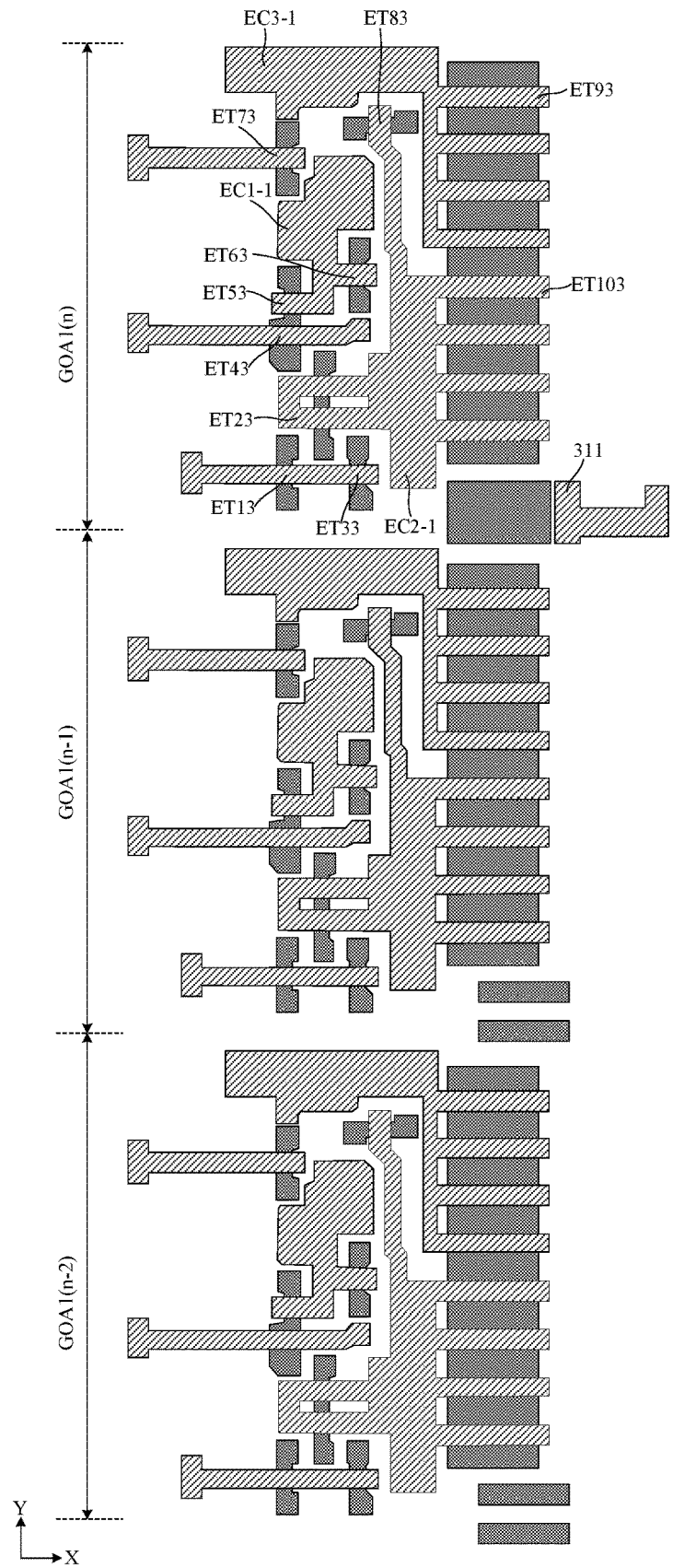
FIG. 7B is a schematic partial planar view of a first circuit area after a first conductive layer is formed according to at least one embodiment of the present disclosure.

FIG. 7B is a schematic partial planar view of a first circuit area after a first conductive layer is formed according to at least one embodiment of the present disclosure. In some exemplary implementation, as shown in FIG. 7B, the first conductive layer of the first circuit area includes at least: a control electrode of multiple transistors of a light-emitting drive circuit (e.g., a control electrode ET 13 of the first control transistor, a control electrode ET23 of the second control transistor, a control electrode ET33 of the third control transistor, a control electrode ET43 of the fourth control transistor, a control electrode ET53 of the fifth control transistor, a control electrode ET63 of the sixth control transistor, a control electrode ET73 of the seventh control transistor, a control electrode ET83 of the eighth control transistor, a control electrode ET93 of the ninth control transistor, and a control electrode ET103 of the tenth control transistor), a first electrode EC1-1 of a first control storage capacitor, a first electrode EC2-1 of a second control storage capacitor, a first electrode EC3-1 of a third control storage capacitor of a light-emitting drive circuit, and a first connection electrode 311. The first connection electrode 311 is located at a side of the first auxiliary semiconductor block 310 close to the display region along the first direction X. An orthographic projection of the first connection electrode 311 on the base substrate may be U-shaped. However, this embodiment is not limited thereto.

In some exemplary embodiments, as shown in FIG. 7B, the control electrode ET53 of the fifth control transistor, the control electrode ET63 of the sixth control transistor, and the first electrode EC1-1 of the first control storage capacitor may be formed into an integrated structure. The control electrode ET23 of the second control transistor, the control electrode ET83 of the eighth control transistor, the control electrode ET103 of the tenth control transistor, and the first electrode EC2-1 of the second control storage capacitor may be formed into an integrated structure. The control electrode ET13 of the first control transistor and the control electrode ET33 of the third control transistor may be formed into an integrated structure. The control electrode ET93 of the ninth control transistor and the first electrode EC3-1 of the third control storage capacitor may be formed into an integrated structure.

Figure 7C:
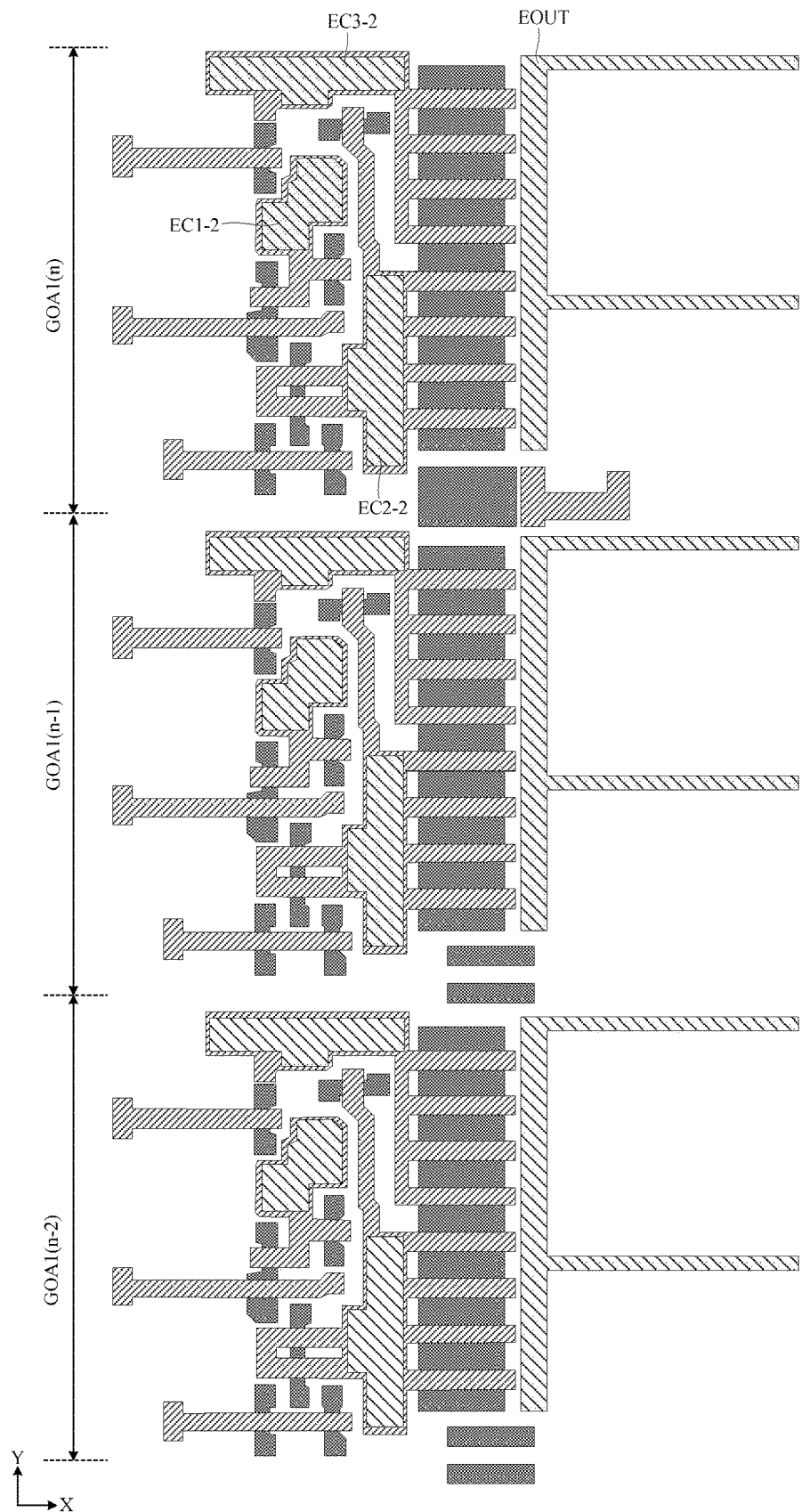
FIG. 7C is a schematic partial planar view of a first circuit area after a second conductive layer is formed according to at least one embodiment of the present disclosure.

FIG. 7C is a schematic partial planar view of a first circuit area after a second conductive layer is formed according to at least one embodiment of the present disclosure. In some exemplary implementations, as shown in FIG. 7C, the second conductive layer of the first circuit area of the peripheral region at least includes: a second electrode EC1-2 of the first control storage capacitor, a second electrode EC2-2 of the second control storage capacitor, a second electrode EC3-2 of the third control storage capacitor, and a first output terminal EOUT of the light-emitting drive circuit. An orthographic projection of the second electrode EC1-2 of the first control storage capacitor on the base substrate is within an orthographic projection of the first electrode EC1-1 on the base substrate. An orthographic projection of the second electrode EC2-2 of the second control storage capacitor on the base substrate is within an orthographic projection of the first electrode EC2-1 on the base substrate. An orthographic projection of the second electrode EC3-2 of the third control storage capacitor on the base substrate is within an orthographic projection of the first electrode EC3-1 on the base substrate. The first output terminal EOUT is located at a side of the active layer ET90 of the ninth control transistor and the active layer ET100 of the tenth control transistor close to the display region. An orthographic projection of the first output terminal EOUT on the base substrate may be F-shaped. The first output terminal EOUT may extend to the second circuit area and is electrically connected to two light-emitting control lines arranged in the display region, configured to provide a light-emitting control signal for pixel circuits of two rows of sub-pixels of the display region. However, this embodiment is not limited thereto.

Figure 7D:
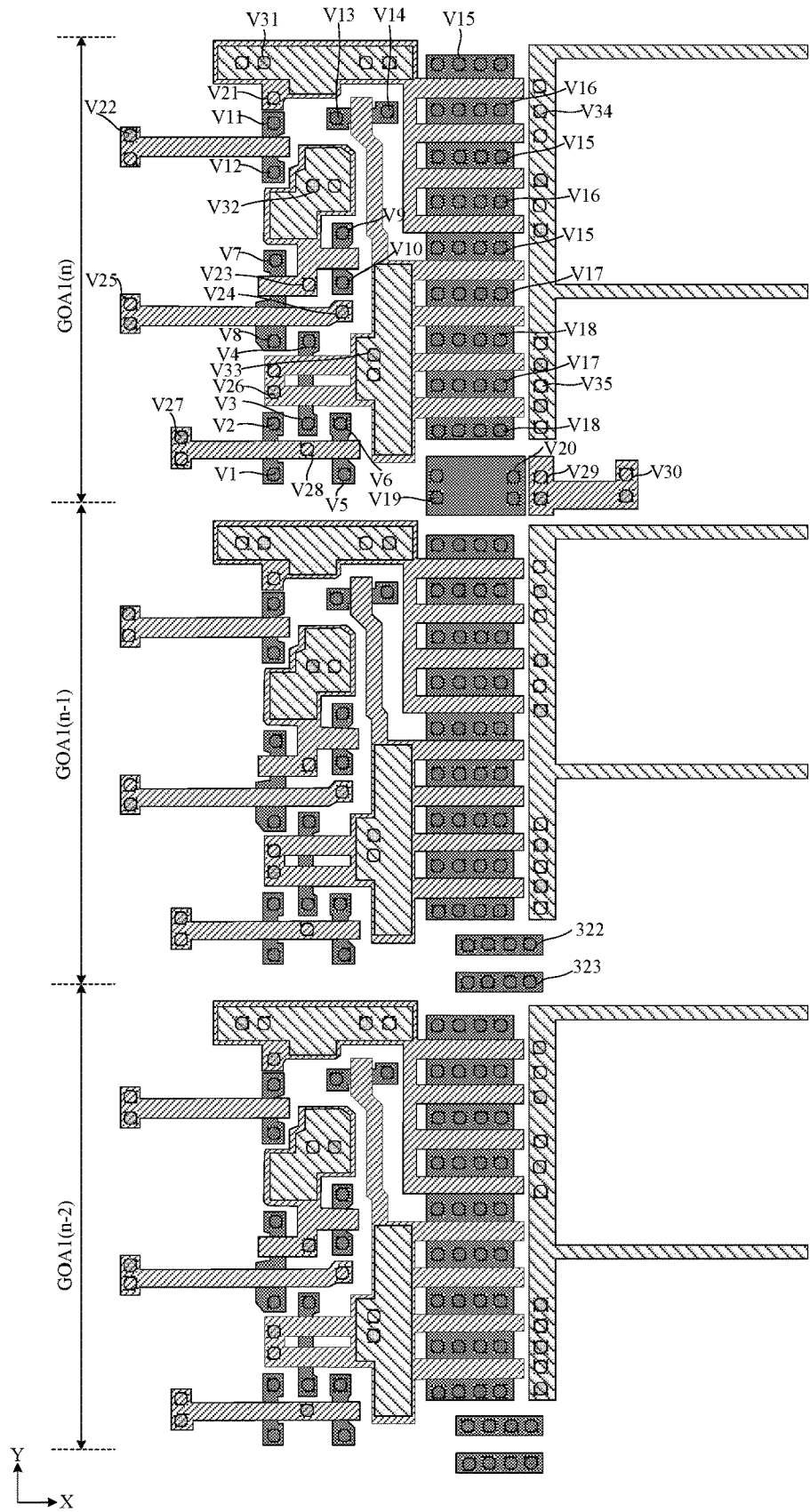
FIG. 7D is a schematic partial planar view of a first circuit area after a third insulation layer is formed according to at least one embodiment of the present disclosure.

FIG. 7D is a schematic partial planar view of a first circuit area after a third insulation layer is formed according to at least one embodiment of the present disclosure. In some exemplary implementations, as shown in FIG. 7D, multiple vias are provided on the third insulation layer of the first circuit area, which may include, for example, a first via V1 to a thirty-fifth via V35, and multiple first auxiliary vias 322 and multiple second auxiliary vias 323. The third insulation layer, the second insulation layer, and the first insulation layer in the first via V1 to the twentieth via V20 and the multiple first auxiliary vias 322 and multiple second auxiliary vias 323 are etched away to expose a surface of the semiconductor layer. The third insulation layer and the second insulation layer in the twenty-first via V21 to the thirtieth via V30 are etched away to expose a surface of the first conductive layer. The third insulation layer in the thirty-first via V31 to the thirty-fifth via V35 is etched away to expose a surface of the second conductive layer.

In some exemplary implementations, four horizontally arranged first auxiliary vias 322 expose a surface of the second auxiliary semiconductor block 320, and four horizontally arranged second auxiliary vias 323 expose a surface of the second auxiliary semiconductor block 321. In this example, a density of the first auxiliary vias 322 and the second auxiliary vias 323 may be approximately the same as a density of the eighteenth via V18 and the seventeenth via V17 exposing the surface of the active layer ET100 of the tenth control transistor, thereby ensuring consistency of the etching process of the first circuit area.

In the present disclosure, "vertical arrangement" means sequentially arranged along the second direction Y, and "horizontal arrangement" means sequentially arranged along the first direction X.

Figure 7E:
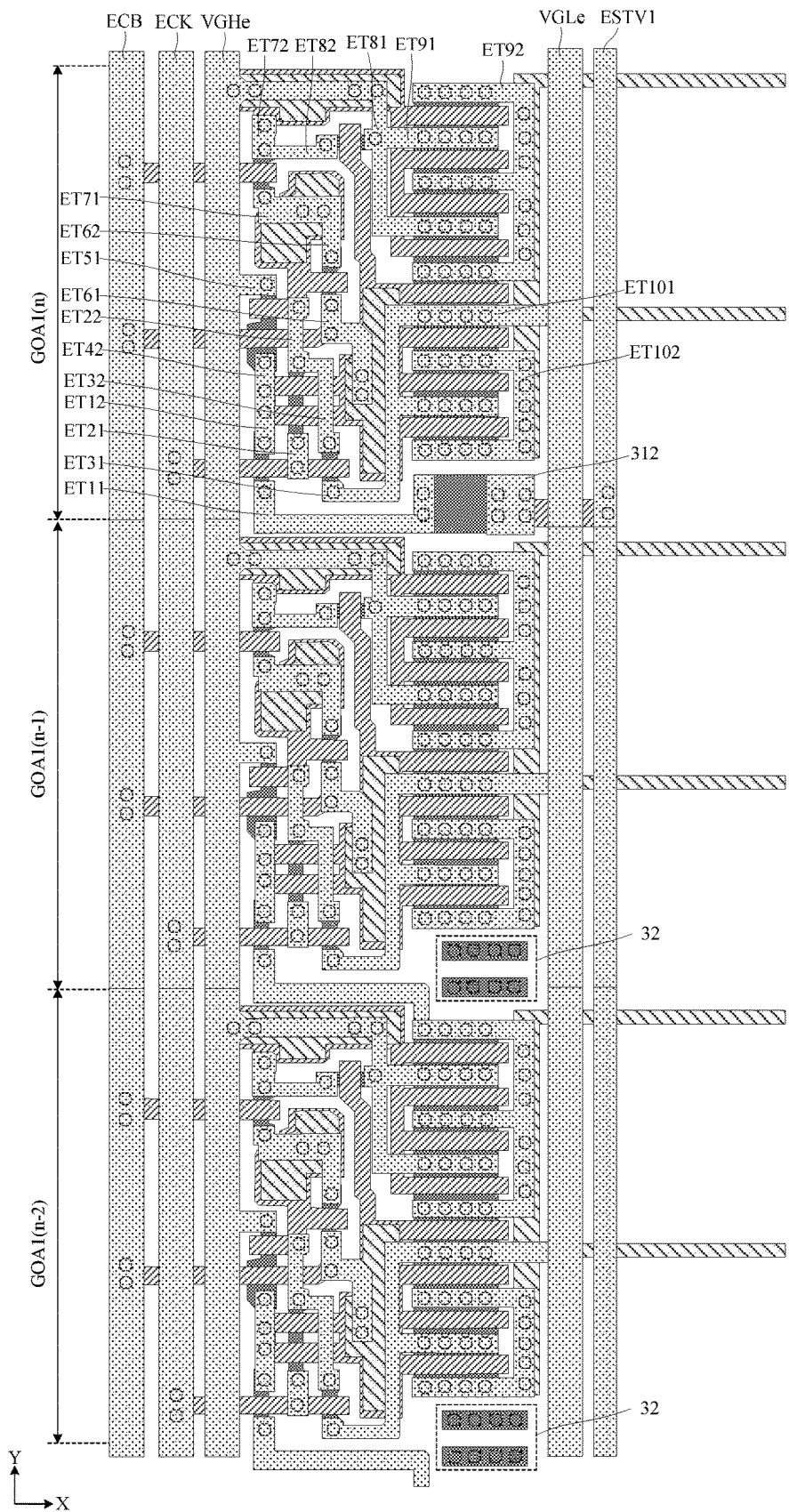
FIG. 7E is a schematic partial planar view of a first circuit area after a third conductive layer is formed according to at least one embodiment of the present disclosure.

FIG. 7E is a schematic partial planar view of a first circuit area after a third conductive layer is formed according to at least one embodiment of the present disclosure. In some exemplary implementations, as shown in FIG. 7E, the third conductive layer of the first circuit area at least includes: first electrodes and second electrodes of multiple transistors of a light-emitting drive circuit (for example, a first electrode ET11 and a second electrode ET12 of the first control transistor, a first electrode ET21 and a second electrode ET22 of the second control transistor, a first electrode ET31 and a second electrode ET32 of the third control transistor, a second electrode ET42 of the fourth control transistor, a first electrode ET51 of the fifth control transistor, a first electrode ET61 and a second electrode ET62 of the sixth control transistor, a first electrode ET71 and a second electrode ET72 of the seventh control transistor, a first electrode ET81 and a second electrode ET82 of the eighth control transistor, a first electrode ET91 and a second electrode ET92 of the ninth control transistor, a first electrode ET101 and a second electrode ET102 of the tenth control transistor), a first clock signal line ECK, a second clock signal line ECB, a first power supply line VGHe, a second power supply line VGLe, a first light-emitting start signal line ESTV1, and a second connection electrode 312. The first clock signal line ECK, the second clock signal line ECB, the first power supply line VGHe, the second power supply line VGLe, and the first light-emitting start signal line ESTV1 extend along the second direction Y.

In some exemplary implementations, as shown in FIG. 7E, the first electrode ET11 of the first control transistor and the first input terminal EMIN are formed into an integrated structure. The first electrode ET11 of the first control transistor is electrically connected to a first doped area of the active layer ET10 of the first control transistor through the first via V1, and is also electrically connected to the first auxiliary semiconductor block 310 through two nineteenth vias V19. The second connection electrode 312 is electrically connected to the first auxiliary semiconductor block 310 through two twentieth via V20, and is further electrically connected to the first connection electrode 311 through two twenty-ninth vias V29 arranged vertically. The first light-emitting start signal line ESTV1 is electrically connected to the first connection electrode 311 through two thirtieth vias V30 arranged vertically. Thus, the first input terminal EMIN of the light-emitting drive circuit in the n-th stage GOA1 (n) may be electrically connected to the first light-emitting start signal line ESTV1 through the first auxiliary structure. The first input terminal of the light-emitting drive circuit in the (n−1)-th stage GOA1 (n−1) is electrically connected to the second electrode of the ninth control transistor of the light-emitting drive circuit in the (n−2)-th stage GOA1 (n−2), thus electrical connection with the first output terminal of the light-emitting drive circuit in the (n−2)-th stage GOA1 (n−2) is achieved.

In some exemplary implementations, as shown in FIG. 7E, the second electrode ET12 of the first control transistor is electrically connected to a second doped area of the active layer ET10 of the first control transistor through a second via V2, and is also electrically connected to the control electrode ET23 of the second control transistor through two twenty-sixth vias V26 vertically arranged. The second electrode ET12 of the first control transistor and the second electrode ET42 of the fourth control transistor may be formed into an integrated structure. The second electrode ET42 of the fourth control transistor is electrically connected to a second doped area of the active layer ET40 of the fourth control transistor through an eighth via V8. The first electrode ET21 of the second control transistor is electrically connected to a first doped area of the active layer ET20 of the second control transistor through a third via V3, and also electrically connected to the control electrode ET13 of the first control transistor through a twenty-eighth via V28. The control electrode ET13 of the first control transistor is electrically connected to the first clock signal line ECK through a twenty-seventh via V27. The second electrode ET22 of the second control transistor is electrically connected to a second doped area of the active layer ET20 of the second control transistor through a fourth via V4, and electrically connected to the control electrode ET53 of the fifth transistor through a twenty-third via V23. The second electrode ET22 of the second control transistor and the second electrode ET32 of the third control transistor are formed into an integrated structure. The first electrode ET31 of the third control transistor is electrically connected to a first doped area of the active layer ET30 of the third control transistor through a fifth via V5. The first electrode ET31 of the third control transistor and the first electrode ET101 of the tenth control transistor may be formed into an integrated structure. The second electrode ET32 of the third control transistor is electrically connected to a second doped area of the active layer ET30 of the third control transistor through a sixth via V6. The first electrode ET51 of the fifth control transistor is electrically connected to a first doped area of the active layer ET50 of the fifth control transistor through a seventh via V7. The first electrode ET51 of the fifth control transistor and the first power supply line VGHe are formed into an integrated structure. The first electrode ET61 of the sixth control transistor is electrically connected to a first doped area of the active layer ET60 of the sixth control transistor through a tenth via V10, and is also electrically connected to the control electrode ET43 of the fourth control transistor through a twenty-fourth via V24, and is also electrically connected to the second electrode EC2-2 of the second control storage capacitor through two thirty-third vias V33 arranged vertically. The control electrode ET43 of the fourth control transistor is electrically connected to the second clock signal line ECB through two twenty-fifth vias V25 arranged vertically. The second electrode ET62 of the sixth control transistor is electrically connected to a second doped area of the active layer ET60 of the sixth control transistor through a ninth via V9, and is also electrically connected to the second electrode EC1-2 of the first control storage capacitor through two thirty-second vias V32 arranged horizontally. The second electrode ET62 of the sixth control transistor and the first electrode ET71 of the seventh control transistor are formed into an integrated structure. The first electrode ET71 of the seventh control transistor is electrically connected to a first doped area of the active layer ET70 of the seventh control transistor through a twelfth via V12. The second electrode 32 of the seventh control transistor is electrically connected to a second doped area of the active layer ET70 of the seventh control transistor through the eleventh via V11, and also electrically connected to the first electrode ETC-1 of the third storage capacitor through a twenty-first via V21. The second electrode ET72 of the seventh control transistor and the second electrode ET82 of the eighth control transistor are formed into an integrated structure. The control electrode ET73 of the seventh control transistor is electrically connected to the second clock signal line ECB through two twenty-second vias V22 arranged vertically. The first electrode ET81 of the eighth control transistor is electrically connected to a first doped area of the active layer ET80 of the eighth control transistor through the fourteenth via V14, and is also electrically connected to the second electrode EC3-2 of the third control storage capacitor through four thirty-first vias V31 arranged horizontally. The first electrode ET81 of the eighth control transistor, the first electrode ET91 of the ninth control transistor and the first power supply line VGHe may be formed into an integrated structure. The second electrode ET82 of the eighth control transistor is electrically connected to a second doped area of the active layer ET80 of the eighth control transistor through the thirteenth via V13. The first electrode ET91 of the ninth control transistor is electrically connected to a first doped area of the active layer ET90 of the ninth control transistor through two groups of sixteenth vias V16 (for example, each group includes four sixteenth vias arranged horizontally). The second electrode ET92 of the ninth control transistor may be electrically connected to a second doped area of the active layer ET90 of the ninth control transistor through three groups of fifteenth vias V15 (e.g., each group includes four fifteenth vias horizontally arranged), and also electrically connected to the first output terminal EOUT through six thirty-fourth vias V34 vertically arranged. The first electrode ET101 of the tenth control transistor is electrically connected to a first doped area of the active layer ET100 of the tenth control transistor through two groups of seventeenth vias V17 (for example, each group includes four seventeenth vias horizontally arranged). The second electrode ET102 of the tenth control transistor is electrically connected to a second doped area of the active layer ET100 of the tenth control transistor through two groups of eighteenth vias V18 (for example, each group includes four eighteenth vias horizontally arranged), and is also electrically connected to the first output terminal EOUT through five thirty-fifth vias V35 vertically arranged.

In the display substrate according to this embodiment, by disposing a first auxiliary structure between adjacent light-emitting drive circuits which are not cascaded, an electrical connection between the light-emitting drive circuits and the first light-emitting start signal line may be established and the electrostatic breakdown may be avoided, and by disposing a second auxiliary structure between adjacent light-emitting drive circuits which are not cascaded, the consistency of pattern density of the first circuit area can be ensured, and the influence of etching process on the electrical performance of wiring and devices can be reduced.

Figure 8A:
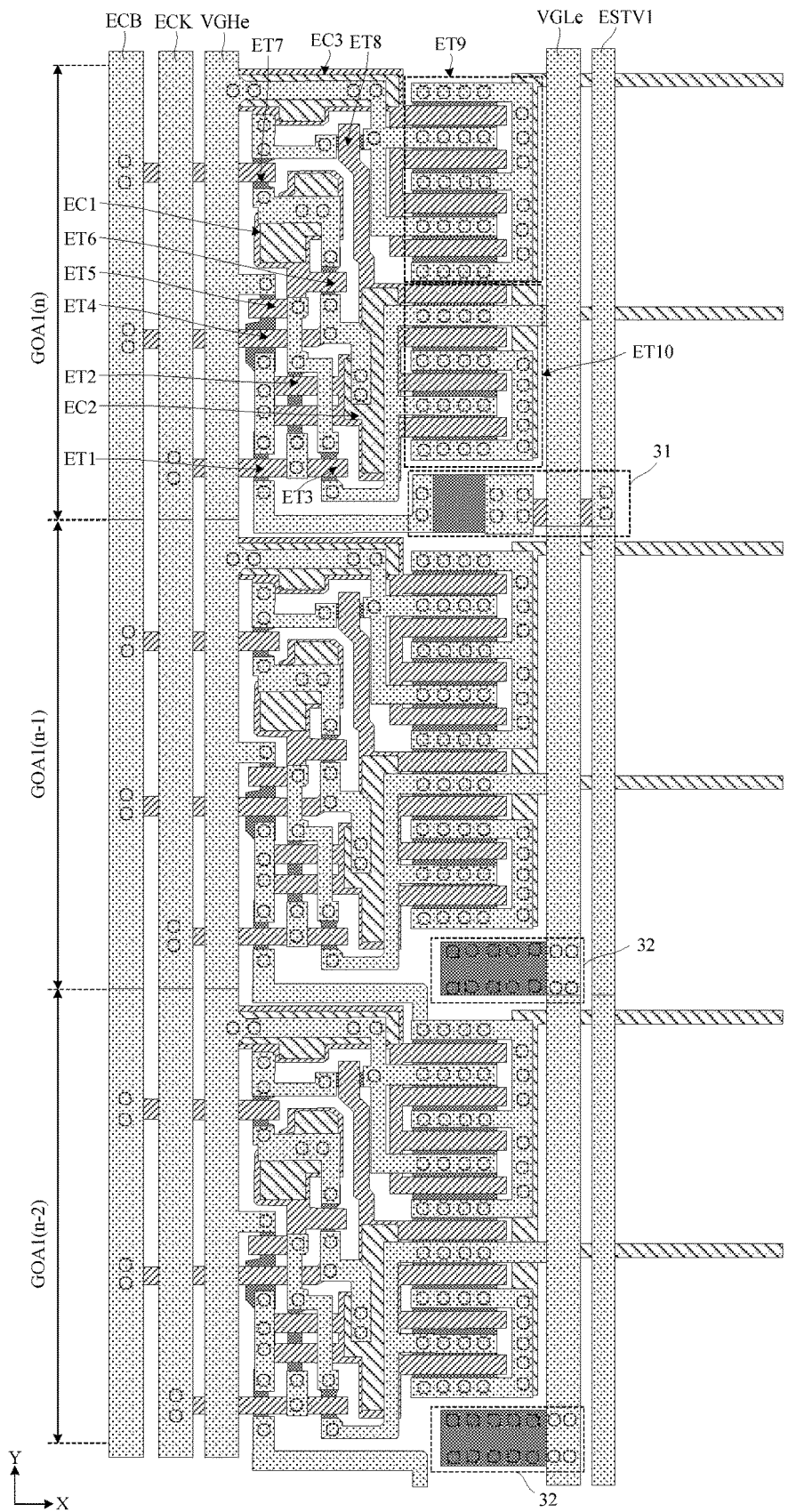
FIG. 8A is another partial top view of a first circuit area according to at least one embodiment of the present disclosure.
Figure 8B:
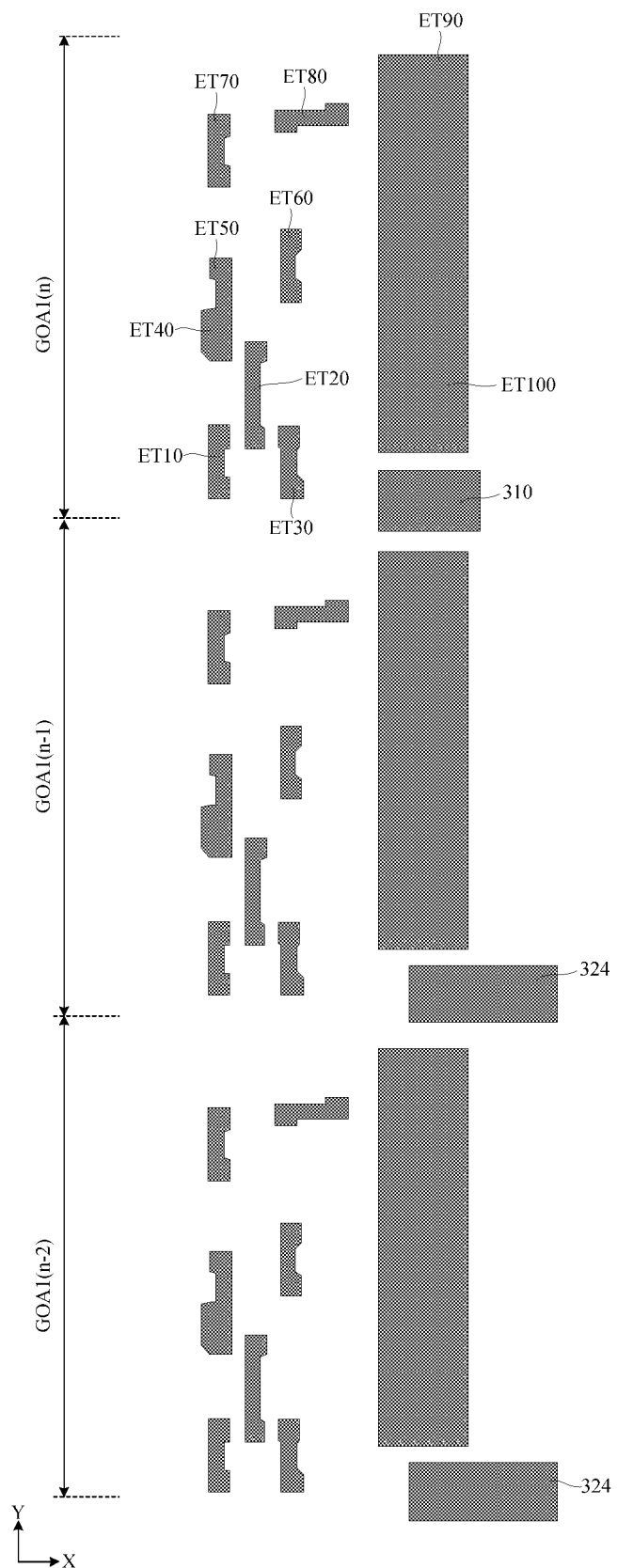
FIG. 8B is a partial plan view of a first circuit area after a semiconductor layer is formed in FIG. 8A.
Figure 8C:
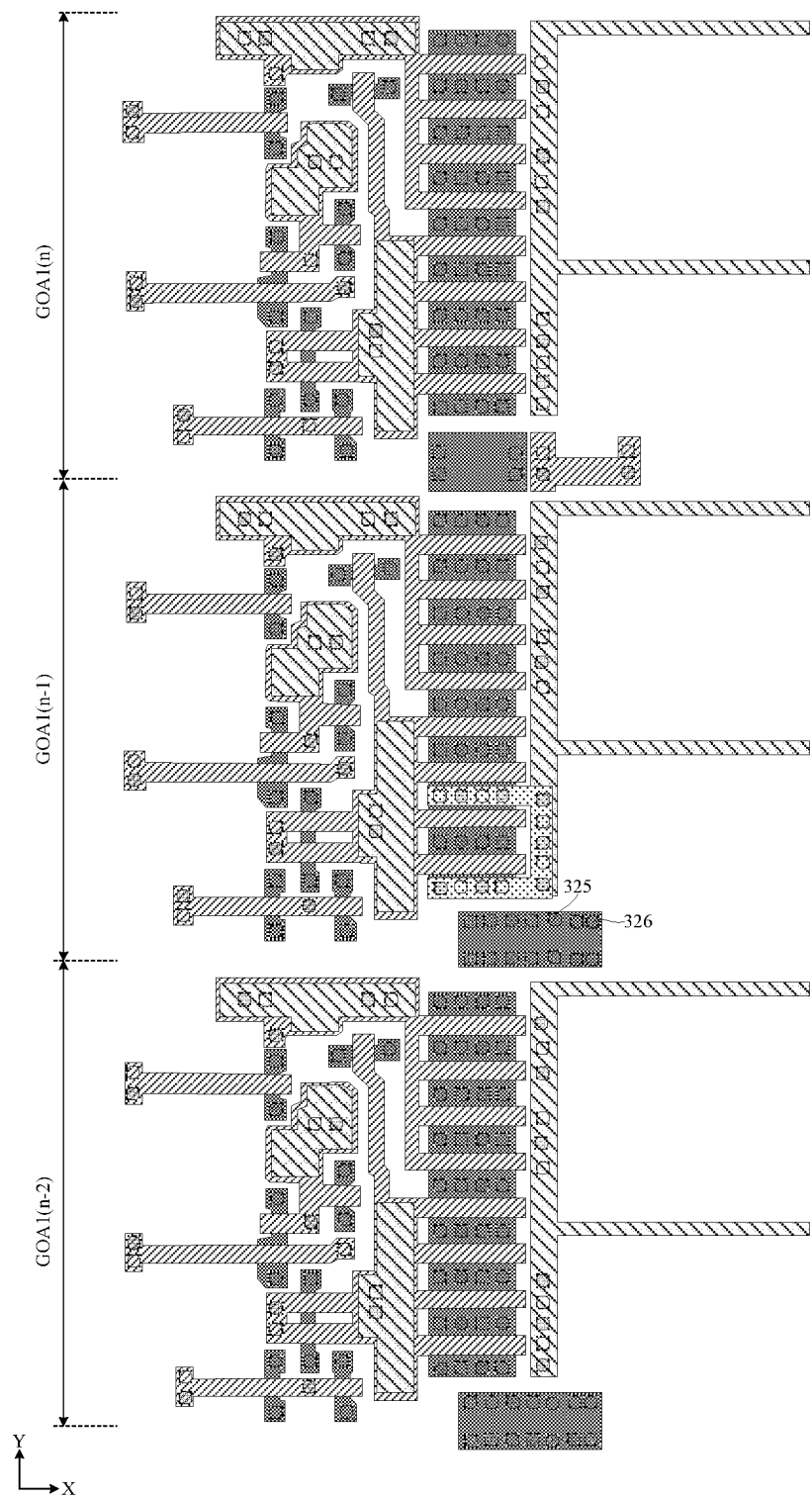
FIG. 8C is a partial plan view of a first circuit area after a third insulation layer is formed in FIG. 8A.

FIG. 8A is a schematic top view of a first circuit area according to at least one embodiment of the present disclosure. FIG. 8B is a partial plan view of the first circuit area after the semiconductor layer is formed in FIG. 8A. FIG. 8C is a partial plan view of the first circuit area after a third insulation layer is formed in FIG. 8A.

In some exemplary implementations, as shown in FIG. 8A, a second auxiliary structure 32 is provided between a light-emitting drive circuit in the (n−2)-th stage GOA1 (n−2) and a light-emitting drive circuit in the (n−1)-th stage GOA1 (n−1), and a second auxiliary structure 32 is further provided between the light-emitting drive circuit in the (n−2)-th stage GOA1 (n−2) and a light-emitting drive circuit in (n−3)-th stage. The second auxiliary structure 32 between the light-emitting drive circuit in the (n−2)-th stage GOA1 (n−2) and the light-emitting drive circuit in the (n−1)-th stage GOA1 (n−1) may be between a ninth control transistor ET9 of the light-emitting drive circuit in the (n−2)-th stage GOA1 (n−2) and a tenth control transistor ET10 of the light-emitting drive circuit in the (n−1)-th stage GOA1 (n−1).

In some exemplary embodiments, as shown in FIG. 8A and FIG. 8B, the second auxiliary structure 32 may include a third auxiliary semiconductor block 324. The third auxiliary semiconductor block 324 is in the semiconductor layer. An orthographic projection of the third auxiliary semiconductor block 324 on the base substrate may be rectangular. A length of the third auxiliary semiconductor block 324 in the second direction Y may be smaller than a length in the first direction X. The orthographic projection of the third auxiliary semiconductor block 324 on the base substrate may be between an active layer of ninth control transistor ET9 of the light-emitting drive circuit in the (n−2)-th stage GOA1 (n−2) and an active layer of tenth control transistor ET10 of the light-emitting drive circuit in the (n−1)-th stage GOA1 (n−1). The orthographic projection of the third auxiliary semiconductor block 324 on the base substrate may overlap with an orthographic projection of the second power supply line VGLe on the base substrate, and may not overlap with an orthographic projection of the first light-emitting start signal line ESTV1 on the base substrate.

In some exemplary implementations, as shown in FIG. 8C, multiple vias are provided on the third insulation layer of the first circuit area, which may include, for example, multiple third auxiliary vias 325 and multiple fourth auxiliary vias 326. The third insulation layer, the second insulation layer, and the first insulation layer in the multiple third auxiliary vias 325 and the multiple fourth auxiliary vias 326 may be removed to expose a portion of a surface of each third auxiliary semiconductor block 324. For example, the multiple third auxiliary vias 325 may be arranged in an array, for example, in two rows and five columns. The multiple fourth auxiliary vias 326 may be arranged in an array, for example, in two rows and two columns. The second power supply line VGLe may be electrically connected to the third auxiliary semiconductor blocks 324 through multiple (e.g. four) fourth auxiliary vias 326. Rest of structures of the display substrate according to this embodiment may be referred to descriptions of the aforementioned embodiments, and will not be repeated here.

In the display substrate provided by this embodiment, by arranging the second auxiliary structure in the semiconductor layer in a blank area between two adjacent cascaded light-emitting drive circuits, a consistency of the pattern density of the first circuit area can be ensured, and influence of the etching process on the wiring of the first circuit area and the electrical performance of the transistors caused by difference of pattern densities can be avoided.

Figure 9A:
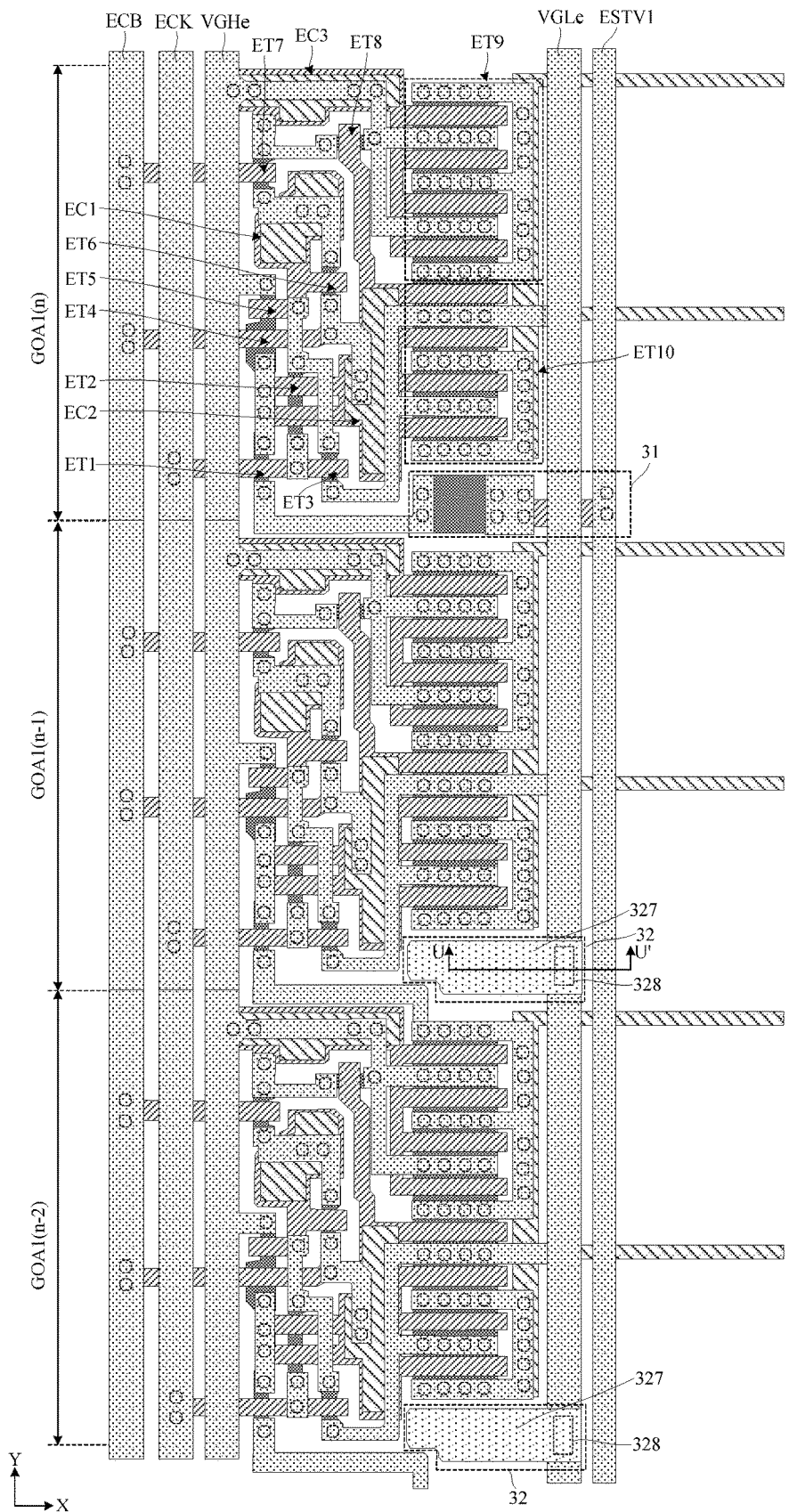
FIG. 9A is another schematic sectional view of a first circuit area according to at least one embodiment of the present disclosure.
Figure 9B:
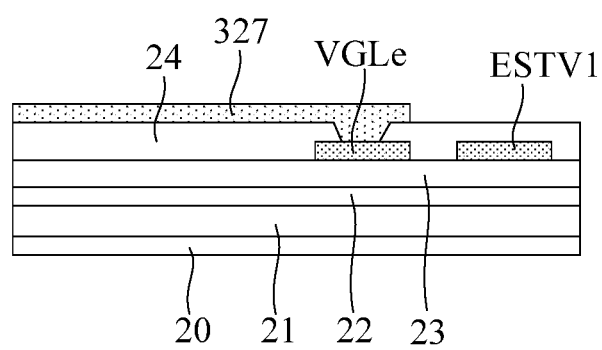
FIG. 9B is a partial schematic sectional view along U-U' direction in FIG. 9A.

FIG. 9A is another partial top view of a first circuit area according to at least one embodiment of the present disclosure. FIG. 9B is a partial sectional view along R-R' direction in FIG. 9A.

In some exemplary implementation, as shown in FIG. 9A and FIG. 9B, a second auxiliary structure 32 is provided between the light-emitting drive circuit in the (n−2)-th stage GOA1 (n−2) and the light-emitting drive circuit in the (n−1)-th stage GOA1 (n−1), and a second auxiliary structure 32 is further provided between the light-emitting drive circuit in the (n−2)-th stage GOA1 (n−2) and the light-emitting drive circuit in (n−3)-th stage. The second auxiliary structure 32 between the light-emitting drive circuit in the (n−2)-th stage GOA1 (n−2) and the light-emitting drive circuit in the (n−1)-th stage GOA1 (n−1) may be between the ninth control transistor ET9 of the light-emitting drive circuit in the (n−2)-th stage GOA1 (n−2) and the tenth control transistor ET10 of the light-emitting drive circuit in the (n−1)-th stage GOA1 (n−1).

In some exemplary implementations, as shown in FIG. 9B, in a direction perpendicular to the display substrate, a peripheral region of the display substrate may include a semiconductor layer, a first conductive layer, a second conductive layer, a third conductive layer and a fourth conductive layer that are disposed on the base substrate 20 sequentially. In some examples, a first insulation layer 21 may be disposed between the semiconductor layer and the first conductive layer, a second insulation layer 22 is disposed between the first conductive layer and the second conductive layer, a third insulation layer 23 is disposed between the second conductive layer and the third conductive layer, and a fourth insulation layer 24 is disposed between the third conductive layer and the fourth conductive layer. The first to third insulation layers 21 to 23 may all be made of an inorganic material and the fourth insulation layer 24 may be made of an inorganic material or an organic material. However, this embodiment is not limited thereto.

In some exemplary implementations, as shown in FIG. 9A and FIG. 9B, the second auxiliary structure 32 may include a first auxiliary conductive block 327. The first auxiliary conductive block 327 may be located in the fourth conductive layer, and an orthographic projection of the first auxiliary conductive block 327 on the base substrate may overlap with the orthographic projection of the second power supply line VGLe on the base substrate, and may not overlap with the orthographic projection of the first light-emitting start signal line ESTV1 on the base substrate. The orthographic projection of the first auxiliary conductive block 327 on the base substrate may be a rectangle having a notch. The fourth insulation layer may be provided with a fifth auxiliary via 328, and the fourth insulation layer within the fifth auxiliary via 328 may be removed to expose a portion of a surface of the second power supply line VGLe in the third conductive layer. The first auxiliary conductive block 327 may be electrically connected to the second power supply line VGLe in the third conductive layer through the fifth auxiliary via 328. The first auxiliary conductive block 327 is electrically connected to the second power supply line VGLe, so that the risk of electrostatic breakdown caused by floating of the first auxiliary conductive block 327 can be avoided. However, this embodiment is not limited thereto. In some other examples, the first auxiliary conductive block may be located in the first conductive layer or the second conductive layer, electrically connected to the second power supply line or the first light-emitting start signal line through a via formed in the third insulation layer. As another example, the first auxiliary conductive block may be located in the third conductive layer and electrically connected to the second power supply line or the first light-emitting start signal line through connection electrodes located in the first conductive layer, the second conductive layer or the fourth conductive layer. As another example, the first auxiliary conductive block may be electrically connected to a second electrode of the tenth control transistor ET10 of the light-emitting drive circuit in the (n−1)-stage GOA1 (n−1), thereby achieving electrical connection to a first output terminal of the light-emitting drive circuit in the (n−1)-stage GOA1 (n−1). Alternatively, the first auxiliary conductive block may be electrically connected to a second electrode of the ninth control transistor ET9 of the light-emitting drive circuit in the (n−2)-stage GOA1 (n−2), thereby achieving electrical connection with the first output terminal of the light-emitting drive circuit in the (n−2)-stage GOA1 (n−2). Therefore, the risk of electrostatic breakdown caused by floating of the second auxiliary structure can be avoided.

Rest of the structures of the display substrate according to this embodiment may be referred to descriptions of the aforementioned embodiments, and will not be repeated here.

In the display substrate provided by this embodiment, by arranging a second auxiliary structure in a blank area between two adjacent cascaded light-emitting drive circuits, the consistency of the pattern density of the first circuit area can be ensured, the influence of the etching process on the wirings of the first circuit area and the electrical performance of the transistors caused by the difference of pattern densities can be avoided, and the risk of electrostatic breakdown caused by the floating of the second auxiliary structure can be avoided.

Figure 10A:
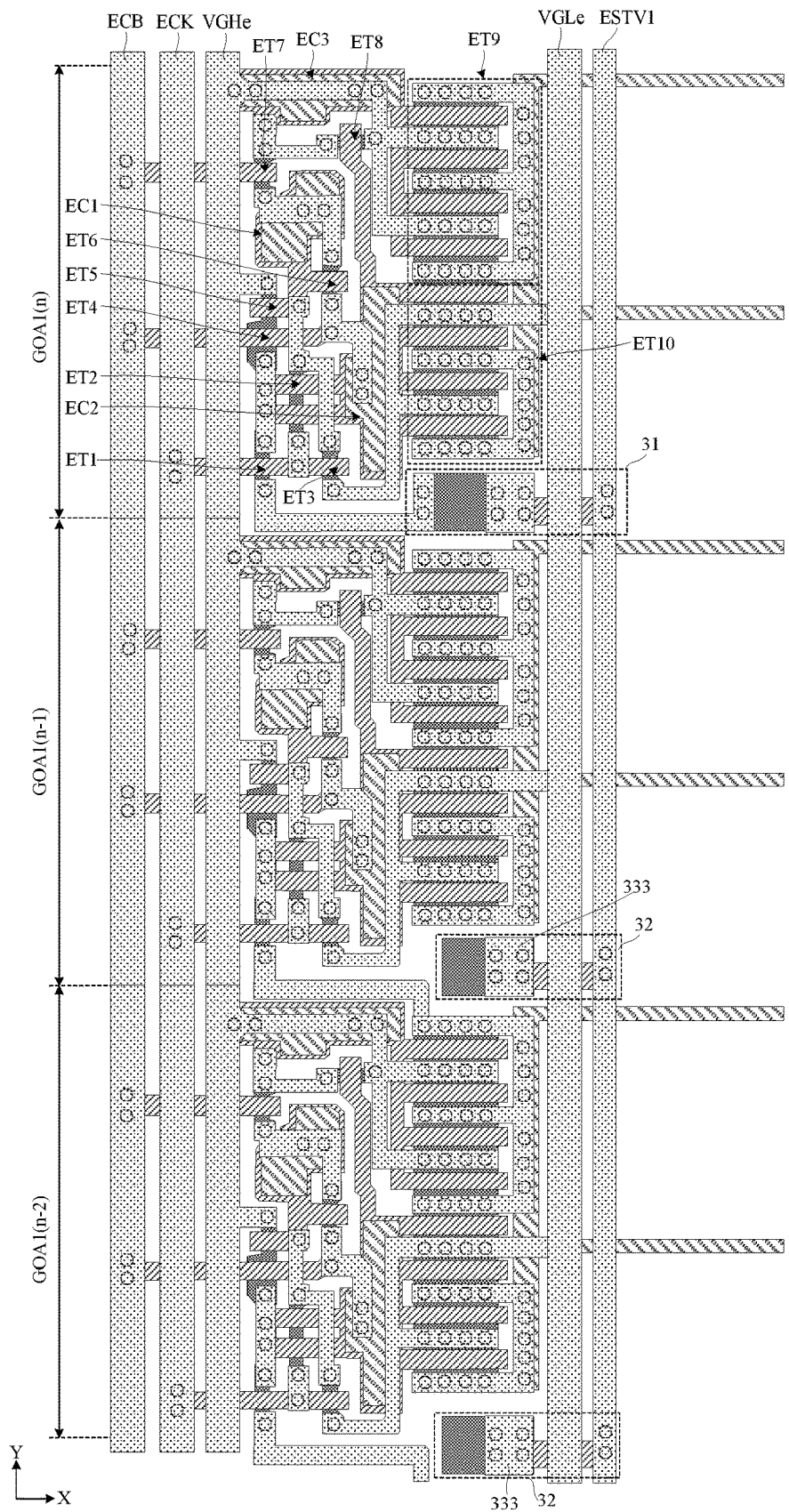
FIG. 10A is another partial sectional view of a first circuit area according to at least one embodiment of the present disclosure.
Figure 10B:
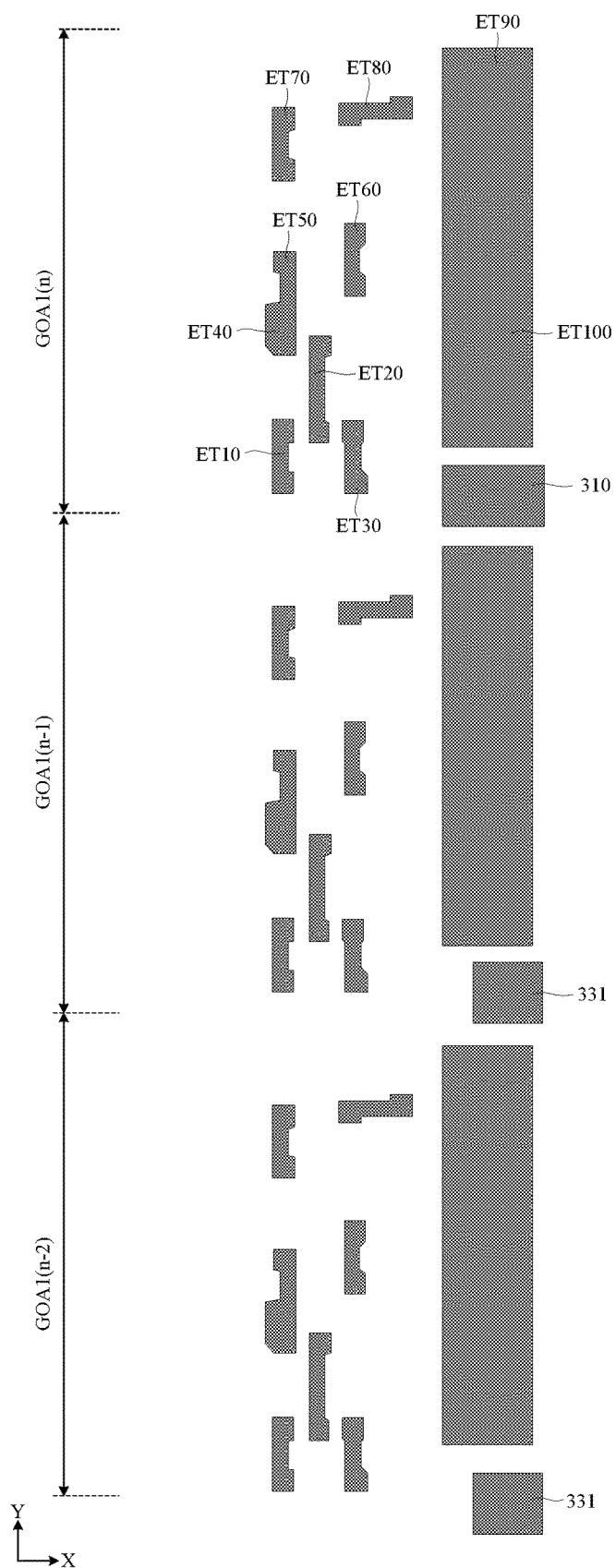
FIG. 10B is a partial plan view of a first circuit area after a semiconductor layer is formed in FIG. 10A.
Figure 10C:
FIG. 10C is partial plan view of a first circuit area after a first conductive layer is formed in FIG. 10A.
Figure 10D:
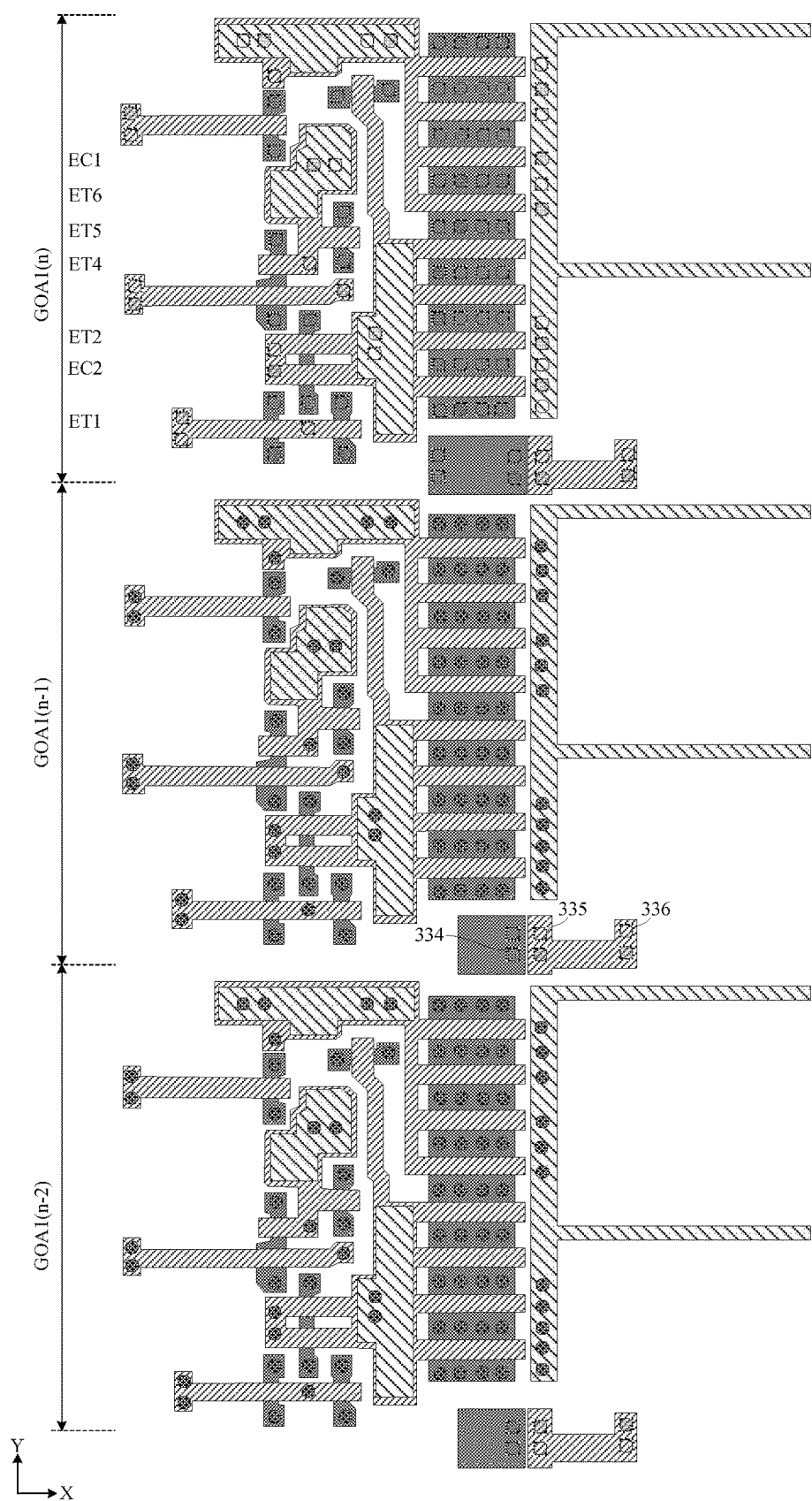
FIG. 10D is a partial plan view of a first circuit area after a third insulation layer is formed in FIG. 10A.

FIG. 10A is another partial top view of a first circuit area according to at least one embodiment of the present disclosure. FIG. 10B is a partial plan view of the first circuit area after a semiconductor layer is formed in FIG. 10A. FIG. 10C is a partial plan view of the first circuit area after a first conductive layer is formed in FIG. 10A. FIG. 10D is a partial plan view of the first circuit area after a third insulation layer is formed in FIG. 10A.

In some exemplary implementation, as shown in FIG. 10A to FIG. 10D, a second auxiliary structure 32 is provided between the light-emitting drive circuit in the (n−2)-th stage GOA1 (n−2) and the light-emitting drive circuit in the (n−1)-th stage GOA1 (n−1), and a second auxiliary structure 32 is further provided between the light-emitting drive circuit in the (n−2)-th stage GOA1 (n−2) and the light-emitting drive circuit in (n−3)-th stage. The second auxiliary structure 32 between the light-emitting drive circuit in the (n−2)-th stage GOA1 (n−2) and the light-emitting drive circuit in the (n−1)-th stage GOA1 (n−1) may be between the ninth control transistor ET9 of the light-emitting drive circuit in the (n−2)-th stage GOA1 (n−2) and the tenth control transistor ET10 of the light-emitting drive circuit in the (n−1)-th stage GOA1 (n−1).

In some exemplary implementations, as shown in FIG. 10A to FIG. 10D, the second auxiliary structure 32 may include a fourth auxiliary semiconductor block 331, a fifth connection electrode 332 and a sixth connection electrode 333. One end of the fourth auxiliary semiconductor block 331 may be electrically connected to the sixth connection electrode 333, the sixth connection electrode 333 may be electrically connected to the fifth connection electrode 332, and the fifth connection electrode 332 may be electrically connected to the first light-emitting start signal line ESTV1. In other words, the fourth auxiliary semiconductor block 331 may be electrically connected to the first light emitting start signal line ESTV1 through the fifth connection electrode 332 and the sixth connection electrode 333. However, this embodiment is not limited thereto. In some other examples, the fourth auxiliary semiconductor block may be electrically connected to the second power supply line VGLe. For example, the fourth auxiliary semiconductor block may be electrically connected to the second power supply line VGLe through the fifth and sixth connection electrodes, or the fourth auxiliary semiconductor may be electrically connected to the second power supply line VGLe through a connection electrode located in the fourth conductive layer.

In some exemplary implementations, as shown in FIG. 10B, the fourth auxiliary semiconductor block 331 may be in the semiconductor layer. An orthographic projection of the first auxiliary semiconductor block 331 on the base substrate may be rectangular. For example, the orthographic projection of the first auxiliary semiconductor block 331 on the base substrate may be square. As shown in FIG. 10C, the fifth connection electrode 332 may be in the first conductive layer. The orthographic projection of the fourth auxiliary semiconductor block 331 on the base substrate does not overlap with an orthographic projection of the fifth connection electrode 332 on the base substrate. An orthographic projection of the fifth connection electrode 332 on the base substrate may be U-shaped. As shown in FIG. 10D, the third insulation layer may be provided with multiple vias including, for example, a sixth auxiliary via 334, a seventh auxiliary via 335, and an eighth auxiliary via 336. The third insulation layer, the second insulation layer, and the first insulation layer in the sixth auxiliary via 334 may be removed to expose a portion of a surface of the fourth auxiliary semiconductor block 331 in the semiconductor layer. The third insulation layer and the second insulation layer in the seventh auxiliary via 335 and the eighth auxiliary via 336 may be removed to expose a portion of a surface of the fifth connection electrode 332 located in the first conductive layer. As shown in FIG. 10A, the sixth connection electrode 333 may be in the third conductive layer. The sixth connection electrode 333 may be electrically connected to the fourth auxiliary semiconductor block 331 through two sixth auxiliary vias 334 and may also be electrically connected to the fifth connection electrode 332 through two seventh auxiliary vias 335. The fifth connection electrode 332 may also be electrically connected to the first light-emitting start signal line ESTV1 located in the third conductive layer through two eighth auxiliary vias 336. Rest of the structures of the display substrate according to this embodiment may be referred to descriptions of the aforementioned embodiments, and will not be repeated here.

In the display substrate provided by the embodiment, the second auxiliary structure electrically connected to the first light-emitting start signal line is arranged in the blank area between two adjacent cascaded light-emitting drive circuits, so that consistency of the pattern density of the first circuit area can be ensured, and uniformity of the etching process can be improved. Furthermore, by electrically connecting the second auxiliary structure to the first light-emitting start signal line, the risk of electrostatic breakdown caused by floating of the second auxiliary structure can be avoided, and electrostatic breakdown caused by electrostatic accumulation of the longer first light-emitting start signal line ESTV1 can also be avoided, thereby protecting the light-emitting drive circuit.

Figure 11A:
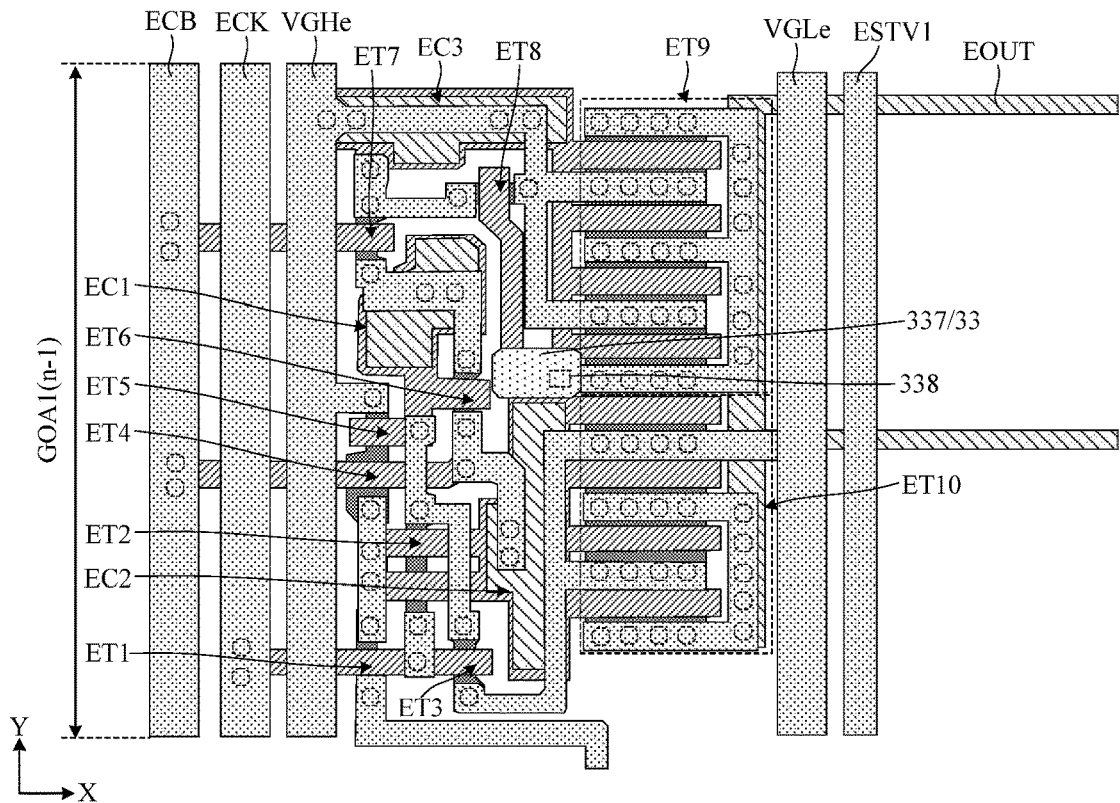
FIG. 11A is another partial top view of a first circuit area according to at least one embodiment of the present disclosure.
Figure 11B:
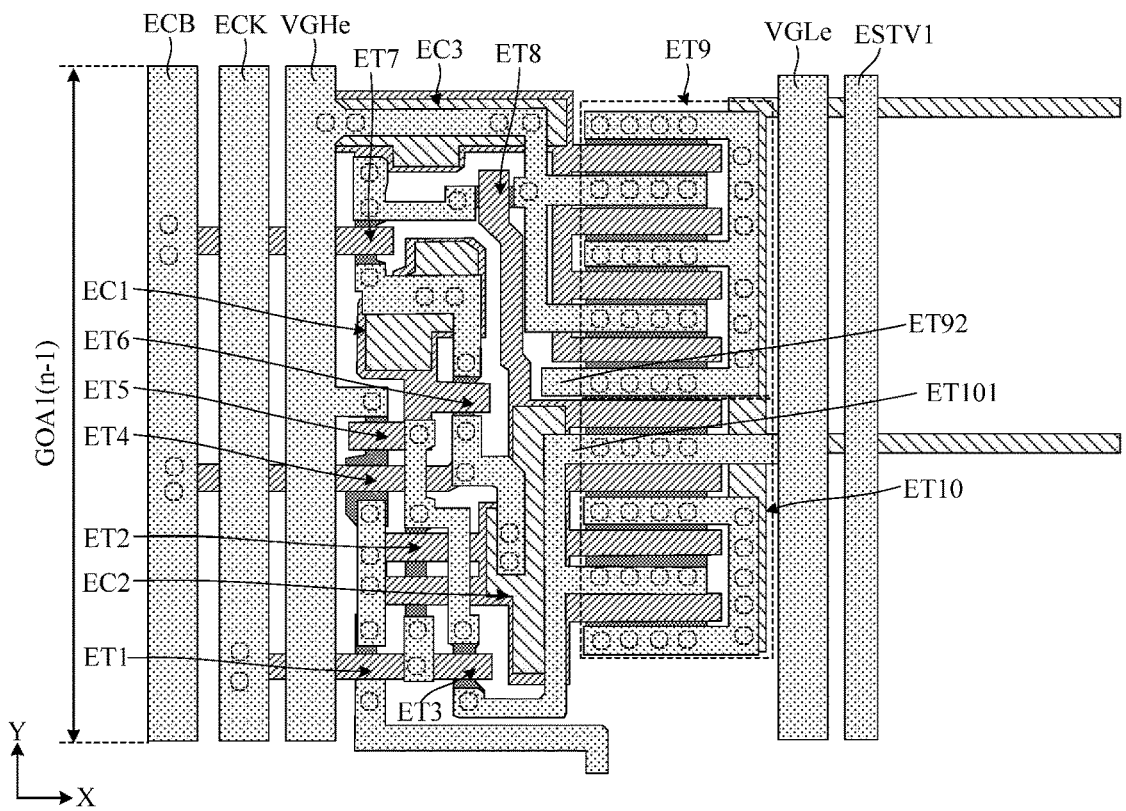
FIG. 11B is a partial plan view of a first circuit area after a third conductive layer is formed in FIG. 11A.

FIG. 11A is another partial top view of a first circuit area according to at least one embodiment of the present disclosure. FIG. 11B is a partial plan view of the first circuit area after a first conductive layer is formed in FIG. 11A. FIG. 11A illustrates one light-emitting drive circuit (i.e. a light-emitting drive circuit in the (n−1)-th stage) of the first circuit area as an example.

In some exemplary embodiments, a third auxiliary structure may be provided in an area where at least one stage of the light-emitting drive circuit is located. FIG. 11A illustrates a third auxiliary structure 33 provided in an area where the light-emitting drive circuit in the (n−1)-th stage GOA1 (n−1) is located as an example. The third auxiliary structure 33 may be located on a side of the ninth control transistor ET9 and the tenth control transistor ET10 of the light-emitting drive circuit in the (n−1)-th stage GOA1 (n−1) close to the first power supply line VGHe, for example, on a side close to the sixth control transistor ET6. The third auxiliary structure 33 may include a second auxiliary conductive block 337. The second auxiliary conductive block 337 may be in the fourth conductive layer. An orthographic projection of the second auxiliary conductive block 337 on the base substrate may be rectangular, for example, a length of the second auxiliary conductive block 337 in the first direction X may be greater than a length in the second direction Y. The orthographic projection of the second auxiliary conductive block 337 on the base substrate may not overlap with orthographic projections of the active layer of the ninth control transistor ET9, the active layer of the tenth control transistor ET10, and the active layer of the sixth control transistor ET6 on the base substrate. As shown in FIG. 11B, one end of a connection section of the second electrode ET92 of the ninth control transistor ET9 closest to the tenth control transistor ET10 in the first direction X may extend to the sixth control transistor ET10 to form a connection portion. An orthographic projection of the connection portion on the base substrate may not overlap with the orthographic projection of the active layer of the ninth control transistor ET9, the active layer of the tenth control transistor ET10, and the active layer of the sixth control transistor ET6 on the base substrate. The fourth insulation layer may be provided with a ninth auxiliary via 338. The second auxiliary conductive block 337 may be electrically connected to the connection portion of the second electrode ET92 of the ninth control transistor ET9 through the ninth auxiliary via 338, so that the second auxiliary conductive block 337 may be electrically connected to a first output terminal EOUT. However, this embodiment is not limited thereto. In some other examples, the second auxiliary conductive block 337 of the third auxiliary structure 33 may be electrically connected to a first electrode ET101 of the tenth control transistor ET10, thereby achieving electrical connection with the second power supply line VGLe.

Rest of the structures of the display substrate according to this embodiment may be referred to descriptions of the aforementioned embodiments, and will not be repeated here. In some other examples, this embodiment may be combined with the structures of the foregoing embodiments, for example, the display substrate may include a first auxiliary structure, a second auxiliary structure and a third auxiliary structure; Alternatively, the display substrate may include a first auxiliary structure and a third auxiliary structure. This embodiment is not limited thereto.

Figure 12:
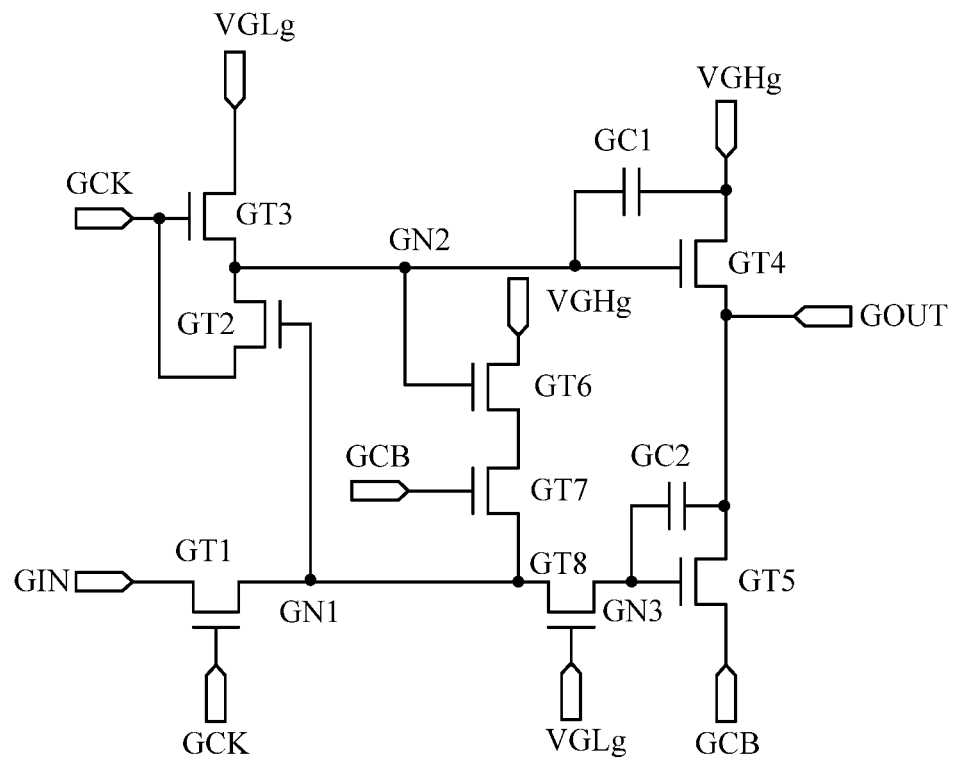
FIG. 12 is an equivalent circuit diagram of a scan drive circuit according to at least one embodiment of the present disclosure.

In the display substrate provided by this embodiment, the third auxiliary structure is arranged in an area where the light-emitting drive circuit is located, so that consistency of the pattern density of the first circuit area can be ensured, and the uniformity of the etching process can be improved. Moreover, by electrically connecting the third auxiliary structure with the first output terminal, the risk of electrostatic breakdown caused by floating of the third auxiliary structure can be avoided. FIG. 12 is an equivalent circuit diagram of a scan drive circuit according to at least one embodiment of the present disclosure. As shown in FIG. 8, the scan drive circuit according to this exemplary embodiment may include: a first shift transistor GT1 to an eighth shift transistor GT8, a first shift storage capacitor GC1 and a second shift storage capacitor GC2. The fourth shift transistor GT4 and the fifth shift transistor GT5 are output transistors of the scan drive circuit.

In some examples, as shown in FIG. 12, a control electrode of the first shift transistor GT1 is electrically connected to a third clock signal line GCK, a first electrode of the first shift transistor GT1 is electrically connected to a second input terminal GIN, and a second electrode of the first shift transistor GT1 is electrically connected to a first shift node GN1. A control electrode of the second shift transistor GT2 is electrically connected to the first shift node GN1, a first electrode of the second shift transistor GT2 is electrically connected to a third clock signal line GCK, and a second electrode of the second shift transistor GT2 is electrically connected to a second shift node GN2. A control electrode of the third shift transistor GT3 is electrically connected to the third clock signal line GCK, a first electrode of the third shift transistor GT3 is electrically connected to a fourth power supply line VGLg, and a second electrode of the third shift transistor GT3 is electrically connected to the second shift node GN2. A control electrode of the fourth shift transistor GT4 is electrically connected to the second shift node GN2, a first electrode of the fourth shift transistor GT4 is electrically connected to a third power supply line VGHg, and a second electrode of the fourth shift transistor GT4 is electrically connected to a second output terminal GOUT. A control electrode of the fifth shift transistor GT5 is electrically connected to a third shift node GN3, a first electrode of the fifth shift transistor GT5 is electrically connected to the fourth clock signal line GCB, and a second electrode of the fifth shift transistor GT5 is electrically connected to the second output terminal GOUT. A control electrode of the sixth shift transistor GT6 is electrically connected to the second shift node GN2, a first electrode of the sixth shift transistor GT6 is electrically connected to the third power supply line VGHg, and a second electrode of the sixth shift transistor GT6 is electrically connected to a first electrode of the seventh shift transistor GT7. A control electrode of the seventh shift transistor GT7 is electrically connected to the fourth clock signal line GCB, and a second electrode of the seventh shift transistor GT7 is electrically connected to the first shift node GN1. A control electrode of the eighth shift transistor GT8 is electrically connected to a fourth power supply terminal VGLg, a first electrode of the eighth shift transistor GT8 is electrically connected to the first shift node GN1, and a second electrode of the eighth shift transistor GT8 is electrically connected to the third shift node GN3. A first electrode of the first shift storage capacitor GC1 is electrically connected to the third power supply line VGHg, and a second electrode of the first shift storage capacitor GC1 is electrically connected to the second shift node GN2. A second electrode of the second shift storage capacitor GC2 is electrically connected to the second output terminal GOUT, and a first electrode of the second shift storage capacitor GC2 is electrically connected to the third shift node GN3.

In this example, the first shift node GN1 is a connection point for the first shift transistor GT1, the second shift transistor GT2, the seventh shift transistor GT7, and the eighth shift transistor GT8. The second shift node GN2 is a connection point for the second shift transistor GT2, the third shift transistor GT3, the fourth shift transistor GT4 and the first shift storage capacitor GC1. The third shift node GN3 is a connection point for the eighth shift transistor GT8, the fifth shift transistor GT5, and the second shift storage capacitor GC2.

In some exemplary implementations, the first shift transistor GT1 to the eighth shift transistors GT8 of the scan drive circuit shown in FIG. 12 may all be P-type transistors or N-type transistors. However, this embodiment is not limited thereto.

Figure 13:
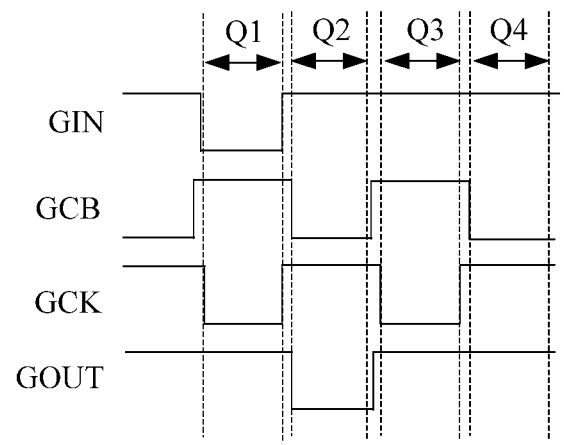
FIG. 13 is an operating timing diagram of the scan drive circuit shown in FIG. 12.

In some exemplary implementations, illustration is made by taking an example in which the first shift transistor GT1 to the eighth shift transistors GT8 of the scan drive circuit shown in FIG. 12 are all P-type transistors. Illustration is made by taking an example in which the second input terminal GIN of the scan drive circuit in the first stage is electrically connected to a scan start signal line GSTV. FIG. 13 is an operating timing diagram of the scan drive circuit shown in FIG. 12. As shown in FIG. 12 and FIG. 13, the scan drive circuit of this exemplary embodiment includes eight transistor units (i.e., the first control transistor GT1 to the eighth control transistor GT8), two capacitor units (i.e., the first shift capacitor GC1 to the second control capacitor GC2), three input terminals (i.e., the third clock signal line GCK, the fourth clock signal line GCB and the second input terminal GIN), one output terminal (i.e., the second output terminal EOUT1), and two power supply terminals (i.e., the third power supply line VGHg and the fourth power supply line VGLg). The third power supply line VGHg keeps providing a high-level signal, and the fourth power supply line VGHg keeps providing a low-level signal.

As shown in FIG. 12 and FIG. 13, the working process of the scan drive circuit of this embodiment may include the following phases.

In a first phase Q1, the third clock signal line GCK provides a third clock signal with a low level, the second input terminal GIN receives a trigger signal with a low level, therefore, the first shift transistor GT1 and the third shift transistor GT3 are turned on, and the turned-on first shift transistor GT1 transmits a trigger signal with a low level to the first shift node GN1 such that a level of the first shift node GN1 becomes a low level, so the second shift transistor GT2 and the fifth shift transistor GT5 are turned on. Since the eighth shift transistor GT8 is always being turned-on in response to a fourth voltage (low level) provided by the fourth power supply line VGLg, the level of the third shift node GN3 is the same as that of the first shift node GN1, i.e. the low level, and this low level is stored in the second shift storage capacitor GC2. In addition, the turned-on third shift transistor GT3 transmits the fourth voltage with the low level to the second shift node GN2, the turned-on second shift transistor GT2 transmits the low level of the third clock signal to the second shift node GN2, such that the level of the second shift node GN2 becomes a low level, and is stored in the first shift storage capacitor GC1, therefore, the fourth shift transistor GT4 is turned-on in response to the low level of the second shift node GN2. A third voltage with a high level provided by the third power supply line VGHg is output to the second output terminal GOUT, while the fifth shift transistor GT5 is turned-on in response to the low level of the third shift node GN3, so as to transmit a fourth clock signal with high level provided by the fourth clock signal line GCB to the second output terminal GOUT, such that the scan drive circuit outputs a high level in this phase.

In a second phase Q2, the fourth clock signal line GCB provides a fourth clock signal with a low level, so the seventh shift transistor GT7 is turned on, and the third clock signal line GCK provides a third clock signal with a high level, so the first shift transistor GT1 and the third shift transistor GT3 are turned off. Due to a storage effect of the second shift storage capacitor GC2, the first shift node GN1 may be kept at the low level of the previous phase, so the second shift transistor GT2 and the fifth shift transistor GT5 are turned on. Since the second shift transistor GT2 is turned on, the third clock signal of the third clock signal line GCK with thr high level is transmitted to the second shift node GN2, such that the level of the second shift node GN2 becomes a high level, and therefore, the sixth shift transistor GT6 and the fourth shift transistor GT4 are turned off, thereby avoiding the high level provided by the third power supply line VGHg from being output to the second output terminal GOUT and the first shift node GN1. Meanwhile, since the fifth shift transistor GT5 is turned on, in this phase, the second output terminal GOUT outputs the low level transmitted by the fourth clock signal line GGB.

In a third phase Q3, the third clock signal line GCK provides a third clock signal with a low level, so the first shift transistor GT1 and the third shift transistor GT3 are turned on, and at this point, the high level provided by the scan start signal line GSTV is transmitted to the first shift node GN1 and the third shift node GN3, so the fifth shift transistor GT5 and the second shift transistor GT2 are turned off. The fourth clock signal line GCB receives a fourth clock signal with a high level, so the seventh shift transistor GT7 is turned off. Since the third shift transistor GT3 is turned on, the low level provided by the fourth power supply line VGLg is transmitted to the second shift node GN2 and stored in the first shift storage capacitor GC1, such that the fourth shift transistor GT4 and the sixth shift transistor GT6 are turned on, and in this phase, the second output terminal GOUT outputs the high level provided by the third power supply line VGHg.

In a fourth phase Q4, the third clock signal line GCK provides a third clock signal with a high level, so the first shift transistor GT1 and the third shift transistor GT3 are turned off. The fourth clock signal line GCB provides a fourth clock signal with a low level, so the seventh shift transistor GT7 is turned on. Due to a storage effect of the second shift storage capacitor GC2, the level of the first shift node GN1 maintains the high level of the previous phase, such that the second shift transistor GT2 and the fifth shift transistor GT5 are turned off. Due to a storage effect of the first shift storage capacitor GC1, the second shift node GN2 continues to be kept at the low level of the previous phase, such that the sixth shift transistor GT6 is turned on, then the high level provided by the third power supply line VGHg is transmitted to the first shift node GN1 and the third shift node GN3 through the turned-on sixth shift transistor GT6 and the seventh shift transistor GT7, thus the first shift node GN1 and the third shift node GN3 continue to be kept at high level, and the fifth shift transistor GT5 is effectively prevented from being turned on, thereby avoiding an erroneous output.

Figure 14:
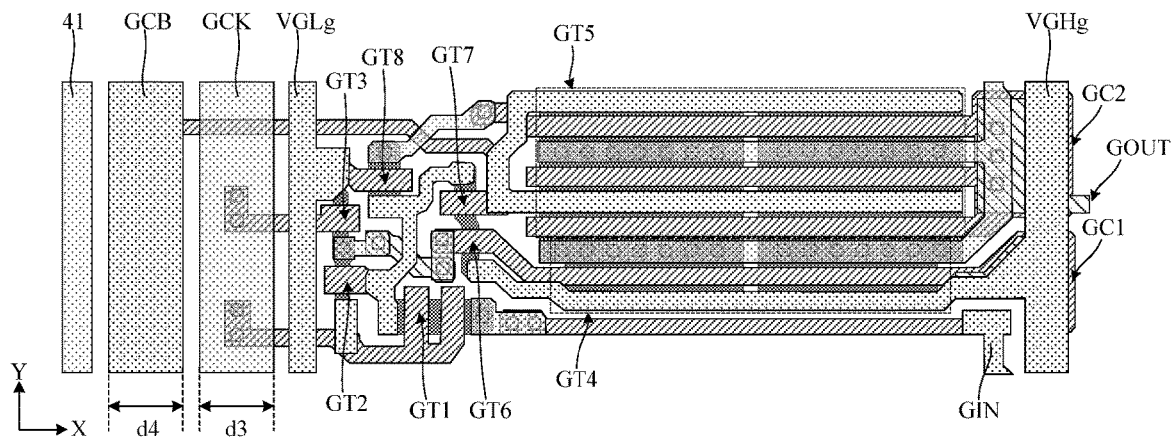
FIG. 14 is a schematic top view of a second circuit area according to at least one embodiment of the present disclosure.

FIG. 14 is a schematic top view of a structure of a scan drive circuit according to at least one embodiment of the present disclosure. FIG. 14 is illustrated by taking one scan drive circuit as an example. In some exemplary implementations, as shown in FIG. 14, in a direction parallel to the display substrate, the third clock signal line GCK, the fourth clock signal line GCB, the third power supply line VGHg, and the fourth power supply line VGLg all extend along the second direction Y. The third clock signal line GCK, the fourth clock signal line GCB, and the fourth power supply line VGLg are located at a side of the scan drive circuit away from the display region, and the third power supply line VGHg is located at a side of the scan drive circuit close to the display region. The third clock signal line GCK is located between the fourth clock signal line GCB and the fourth power supply line VGLg. The third clock signal line GCK is located at a side of the fourth clock signal line GCB close to the display region. A test connection line 41 extending along the second direction Y is further provided at a side of the fourth clock signal line GCB away from the display region. The test connection line 41 may be connected to an output terminal of the scan drive circuit in a last stage and extend to the bonding region so as to detect an output signal of the scan drive circuit.

In some exemplary implementations, as shown in FIG. 14, a line width d3 of the third clock signal line GCK and a line width d4 of the fourth clock signal line GCB may be substantially the same. The line width d3 of the third clock signal line GCK and the line width d4 of the fourth clock signal line GCB may be about 11 μm to 25 μm. The line width of the third clock signal line GCK may be greater than 1.4 times of a line width of the first clock signal line ECK. For example, the line width of the third clock signal line GCK may be greater than or equal to 1.5 times of the line width of the first clock signal line ECK. For example, the line widths of the first clock signal line ECK and the second clock signal line ECB may be about 10 μm, and the line widths of the third clock signal line GCK and the fourth clock signal line GCB may be about 15 μm. However, this embodiment is not limited thereto.

In some exemplary implementations, as shown in FIG. 14, the scan drive circuit is located between the third power supply line VGHg and the fourth power supply line VGLg. The first shift storage capacitor GC1 is located at a side of the fourth shift transistor GT4 close to the third power supply line VGHg, and orthographic projections of the first shift storage capacitor GC1 and the third power supply line VGHg on the base substrate have an overlapped region therebetween. The second shift storage capacitor GC2 is located at a side of the fifth shift transistor GT5 close to the third power supply line VGHg, and orthographic projections of the second shift storage capacitor GC2 and the third power supply line VGHg on the base substrate have an overlapped region therebetween. The second shift storage capacitor GC2 and the first shift storage capacitor GC1 are sequentially arranged along the second direction Y. The fifth shift transistor GT5 and the fourth shift transistor GT4 are sequentially arranged along the second direction Y. The third shift transistor GT3 is located at a side of the eighth shift transistor GT8 close to the fourth power supply line VGLg, and the third shift transistor GT3 and the second shift transistor GT2 are sequentially arranged along the second direction Y. The first shift transistor GT1 is located at a side of the second shift transistor GT2 away from the fourth power supply line VGLg. The seventh shift transistor GT7 is located at a side of the eighth shift transistor GT8 away from the fourth power supply line VGLg, and the sixth shift transistor GT6 is located between the seventh shift transistor GT7 and the first shift transistor GT1 in the second direction Y.

Figure 15A:
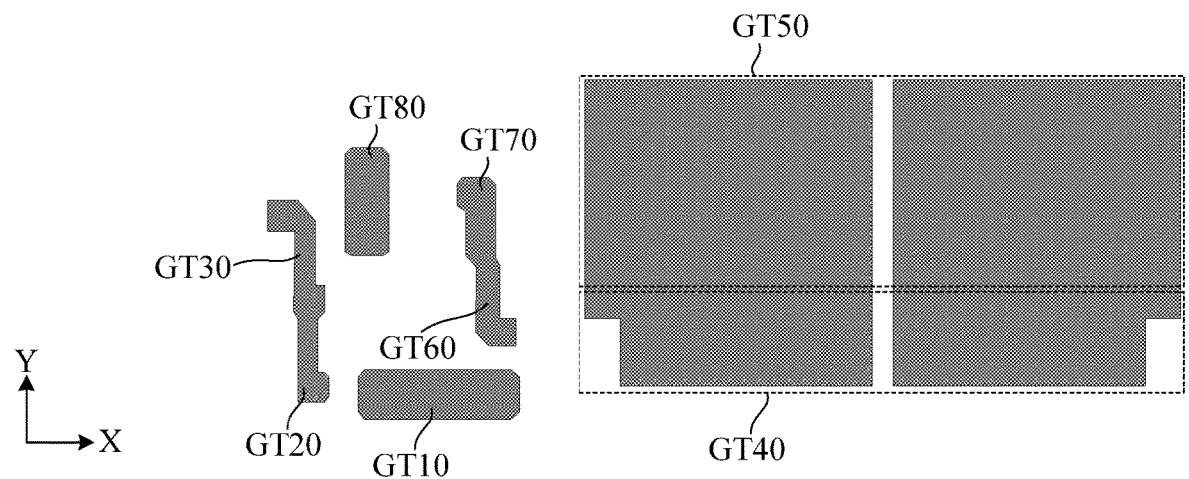
FIG. 15A is a schematic partial planar view of a second circuit area after a semiconductor layer is formed according to at least one embodiment of the present disclosure.

FIG. 15A is a schematic partial planar view of a second circuit area after a semiconductor layer is formed according to at least one embodiment of the present disclosure. In some exemplary implementations, as shown in FIG. 15A, a semiconductor layer of the second circuit area of the peripheral region at least includes: an active layer of multiple transistors of a scan drive circuit (e.g., an active layer GT10 of the first shift transistor, an active layer GT20 of the second shift transistor, an active layer GT30 of the third shift transistor, an active layer GT40 of the fourth shift transistor, an active layer GT50 of the fifth shift transistor, an active layer GT60 of the sixth shift transistor, an active layer GT70 of the seventh shift transistor, and an active layer GT80 of the eighth shift transistor). The active layer GT20 of the second shift transistor and the active layer GT30 of the third shift transistor may be formed into an integrated structure. The active layer GT60 of the sixth shift transistor and the active layer GT70 of the seventh shift transistor may be formed into an integrated structure. The active layer GT40 of the fourth shift transistor and the active layer GT50 of the fifth shift transistor may be formed into an integrated structure. However, this embodiment is not limited thereto.

Figure 15B:
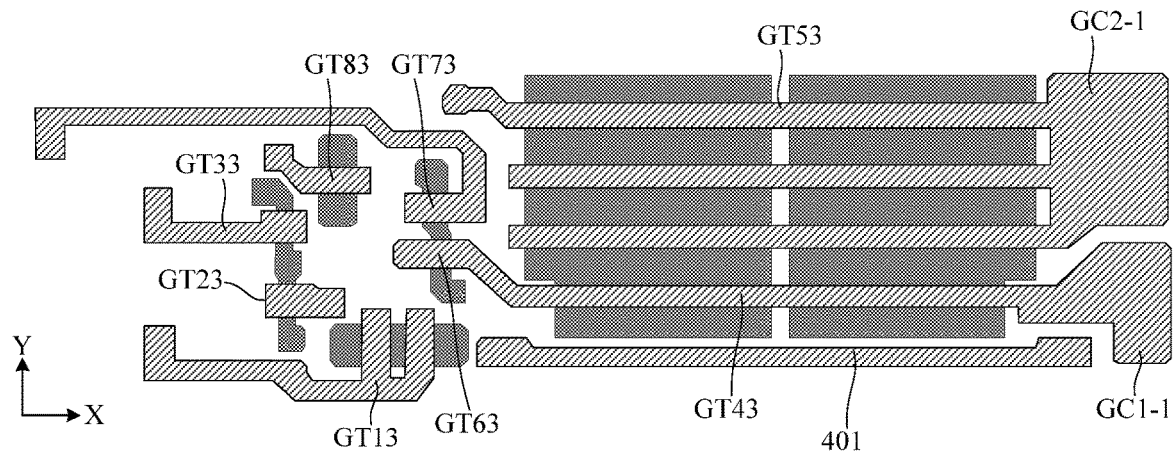
FIG. 15B is a schematic partial planar view of a second circuit area after a first conductive layer is formed according to at least one embodiment of the present disclosure.

FIG. 15B is a schematic partial planar view of a second circuit area after a first conductive layer is formed according to at least one embodiment of the present disclosure. In some exemplary embodiments, as shown in FIG. 15B, a first conductive layer of the second circuit area includes at least: control electrodes of multiple transistors of a scan drive circuit (e.g., a control electrode GT13 of the first shift transistor, a control electrode GT23 of the second shift transistor, the control electrode GT33 of the third shift transistor, a control electrode GT43 of the fourth shift transistor, a control electrode GT53 of the fifth shift transistor, the control electrode GT63 of the sixth shift transistor, a control electrode GT73 of the seventh shift transistor, and a control electrode GT83 of the eighth shift transistor), a first electrode GC1-1 of a first shift storage capacitor, a second electrode GC2-1 of a second shift storage capacitor, and an input connection line 401. The input connection line 401 is located at a side of the active layer GT40 of the fourth shift transistor away from the active layer GT50 of the fifth shift transistor. The control electrode GT63 of the sixth shift transistor, the control electrode GT43 of the fourth shift transistor, and the first electrode GC1-1 of the first shift storage capacitor may be formed into an integrated structure. The control electrode GT53 of the fifth shift transistor and the first electrode GC2-1 of the second shift storage capacitor may be formed into an integrated structure.

Figure 15C:
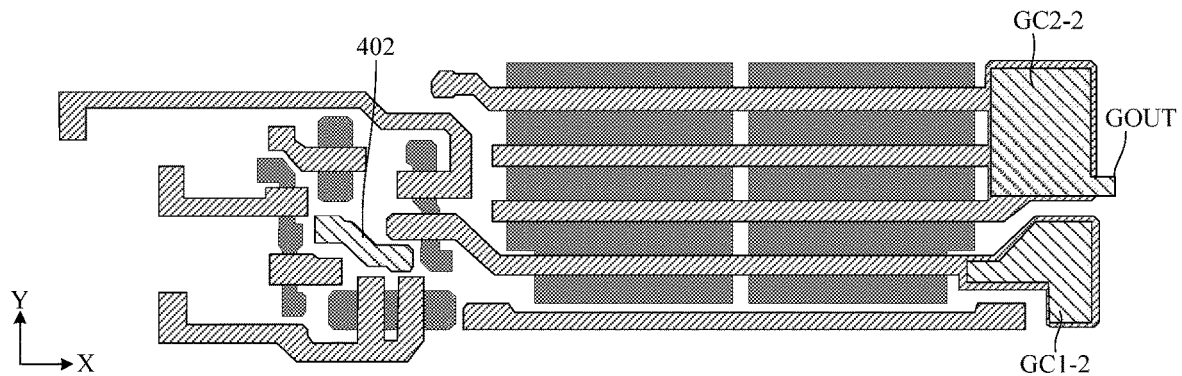
FIG. 15C is a schematic partial planar view of a second circuit area after a second conductive layer is formed according to at least one embodiment of the present disclosure.

FIG. 15C is a schematic partial planar view of a second circuit area after a second conductive layer is formed according to at least one embodiment of the present disclosure. In some exemplary implementations, as shown in FIG. 15C, a second conductive layer of the second circuit area at least includes: a second electrode GC1-2 of the first shift storage capacitor of the scan drive circuit, a second electrode GC2-2 of the second shift storage capacitor, a second output terminal GOUT, and a third connection electrode 402. The third connection electrode 402 is located between the control electrode GT23 of the second shift transistor and the control electrode GT63 of the sixth shift transistor. The second electrode GC2-2 of the second shift storage capacitor and the second output terminal GOUT may be formed into an integrated structure. An orthographic projection of the second electrode GC1-2 of the first shift storage capacitor on the base substrate is within an orthographic projection of the first electrode GC1-1 of the first shift storage capacitor on the base substrate. An orthographic projection of the second electrode GC2-2 of the second shift storage capacitor on the base substrate is within an orthographic projection of the first electrode GC2-1 of the second shift storage capacitor on the base substrate. The second output terminal GOUT may be connected to a scan line of the display region and configured to provide a scan signal for a pixel circuit of a row of sub-pixels in the display region.

Figure 15D:
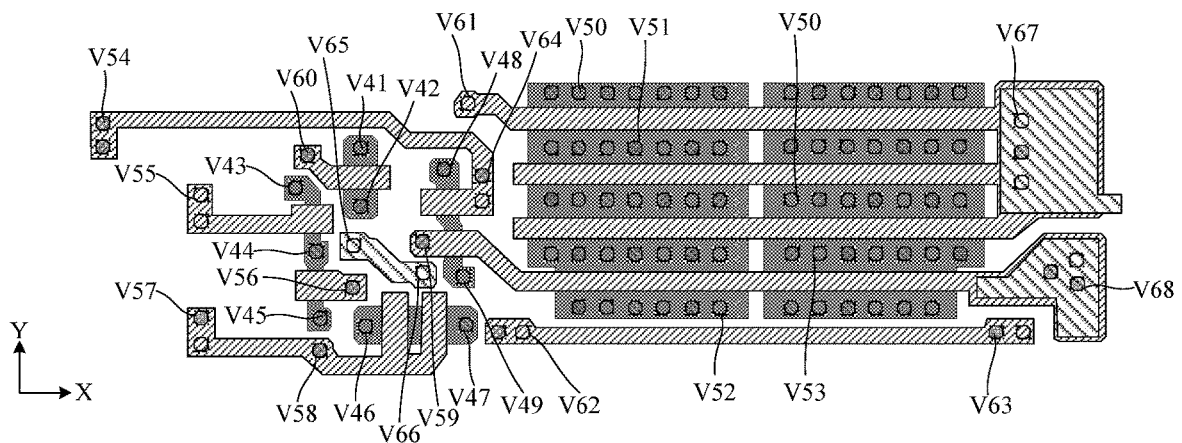
FIG. 15D is a schematic partial planar view of a second circuit area after a third insulation layer is formed according to at least one embodiment of the present disclosure.

FIG. 15D is a schematic partial planar view of a second circuit area after a third insulation layer is formed according to at least one embodiment of the present disclosure. In some exemplary implementations, as shown in FIG. 15D, the third insulation layer of the second circuit area is provided with multiple vias, which may include, for example, a forty-first via V41 to a sixty-eighth via V68. The third insulation layer, the second insulation layer and the first insulation layer in the forty-first via V41 to the fifty-third via V53 are etched away to expose a surface of the semiconductor layer. The third insulation layer and the second insulation layer in the fifty-fourth via V54 to the sixty-fourth via V64 are etched away to expose a surface of the first conductive layer. The third insulation layer in the sixty-fifth via V65 to the sixty-eighth via V68 is etched away to expose a surface of the second conductive layer.

Figure 15E:
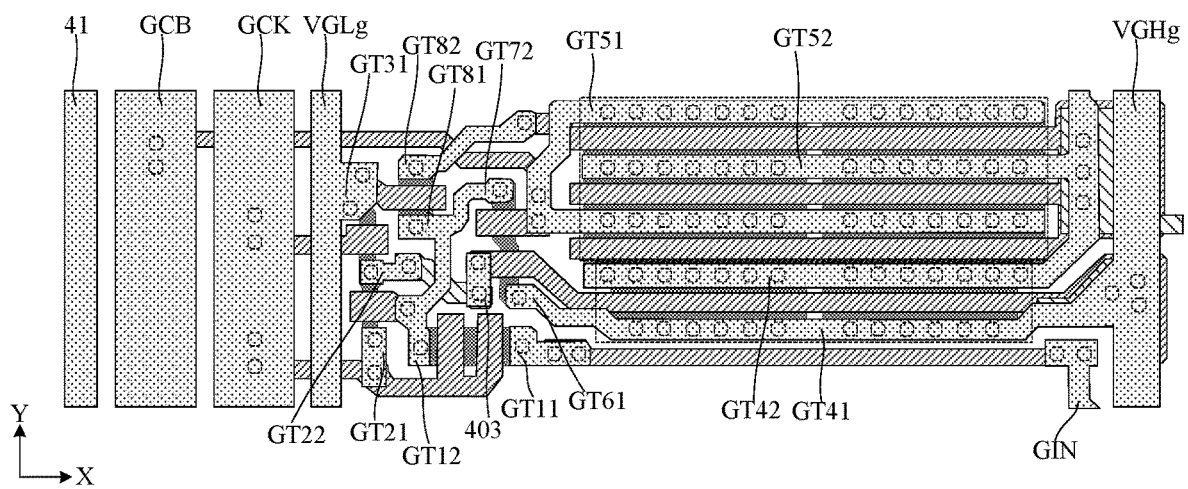
FIG. 15E is a schematic partial planar view of a second circuit area after a third conductive layer is formed according to at least one embodiment of the present disclosure.

FIG. 15E is a schematic partial planar view of a second circuit area after a third conductive layer is formed according to at least one embodiment of the present disclosure. In some exemplary implementations, as shown in FIG. 15E, the third conductive layer of the second circuit area at least includes: first electrodes and second electrodes of multiple transistors of a scan drive circuit (e.g., a first electrode GT11 and a second electrode GT12 of the first shift transistor, a first electrode GT21 and a second electrode GT22 of the second shift transistor, a first electrode GT31 of the third shift transistor, a first electrode GT41 and a second electrode GT42 of the fourth shift transistor, a first electrode GT51 and a second electrode GT52 of the fifth shift transistor, a first electrode GT61 of the sixth shift transistor, a second electrode GT72 of the seventh shift transistor, a first electrode GT81 and a second electrode GT82 of the eighth shift transistor), a fourth connection electrode 403, a second input terminal GIN, a third clock signal line GCK, a fourth clock signal line GCB, a third power supply line VGHg, a fourth power supply line VGLg, and a test connection line 41.

In some exemplary implementations, as shown in FIG. 15E, the first electrode GT11 of the first shift transistor is electrically connected to a first doped area of the active layer GT10 of the first shift transistor through the forty-seventh via V47, and is also electrically connected to one end of the input connection line 401 through two sixty-second vias V62 horizontally arranged. The other end of the input connection line 401 is electrically connected to the second input terminal GIN through two sixty-third vias V63 horizontally arranged. The second input terminal GIN and the second electrode of the fifth shift transistor of the scan drive circuit in the previous stage may be formed into an integrated structure. The second electrode GT12 of the first shift transistor is electrically connected to a second doped area of the active layer GT10 of the first shift transistor through the forty-sixth via V46, and is electrically connected to the control electrode GT23 of the second shift transistor through the fifty-sixth via V56. The second electrode GT12 of the first shift transistor, the first electrode GT81 of the eighth shift transistor, and the second electrode GT72 of the seventh shift transistor may be formed into an integrated structure. The first electrode GT21 of the second shift transistor is electrically connected to a first doped area of the active layer GT20 of the second shift transistor through the forty-fifth via V45, and is also electrically connected to the control electrode GT13 of the first shift transistor through the fifty-eighth via V58. The control electrode GT13 of the first shift transistor is electrically connected to the third clock signal line GCK through two fifty-seventh vias V57 vertically arranged. The second electrode GT22 of the second shift transistor is electrically connected to a second doped area of the active layer GT20 of the second shift transistor through the forty-fourth via V44, and is electrically connected to the third connection electrode through the sixty-fifth via V65. The third connection electrode 402 is also electrically connected to the fourth connection electrode 403 through the sixty-sixth via V66. The fourth connection electrode 403 is also electrically connected to the control electrode GT43 of the fourth shift transistor through the fifty-ninth via V59. The first electrode GT31 of the third shift transistor is electrically connected to a first doped area of the active layer GT30 of the third shift transistor through the forty-third via V43, and is also electrically connected to the control electrode GT83 of the eighth shift transistor through the sixtieth via V60. The first electrode GT31 of the third shift transistor and the fourth power supply line VGLg may be formed into an integrated structure. The control electrode GT33 of the third shift transistor is electrically connected to the third clock signal line GCK through two fifty-fifth vias V55 arranged vertically. The first electrode GT41 of the fourth shift transistor is electrically connected to a first doped area of the active layer GT40 of the fourth shift transistor through two groups of fifty-second vias V52 (e.g., each group includes six vias horizontally arranged), and is also electrically connected to a second electrode GC1-2 of the first shift storage capacitor through three sixty-eighth vias V68. The first electrode GT41 of the fourth shift transistor, the first electrode GT61 of the sixth shift transistor, and the third power supply line VGHg may be formed into an integrated structure. The first electrode GT61 of the sixth shift transistor is electrically connected to a first doped area of the active layer GT60 of the sixth shift transistor through the forty-ninth via V49. The second electrode GT42 of the fourth shift transistor is electrically connected to a second doped area of the active layer GT40 of the fourth shift transistor through two groups of fifty-third vias V53 (for example, each group includes seven vias horizontally arranged). The second electrode GT42 of the fourth shift transistor and the second electrode GT52 of the fifth shift transistor may be formed into an integrated structure. The first electrode GT51 of the fifth shift transistor is electrically connected to a first doped area of the active layer GT50 of the fifth shift transistor through four groups of fiftieth vias V50 (for example, each group includes seven via V64 horizontally arranged), and is also electrically connected to the control electrode GT73 of the seventh shift transistor through two sixty-fourth vias V64 vertically arranged. The control electrode GT73 of the seventh shift transistor is electrically connected to the fourth clock signal line GCB through two fifty-fourth vias V54 arranged vertically. The second electrode GT52 of the fifth shift transistor is electrically connected to a second doped area of the active layer GT50 of the fifth shift transistor through two groups of fifty-first via V51 (for example, each group includes seven vias V67 horizontally arranged), and is also electrically connected to a second electrode GC2-2 of the second shift storage capacitor through three sixty-seventh vias V67 vertically arranged. The second electrode GT72 of the seventh shift transistor is electrically connected to a second doped area of the active layer GT70 of the seventh shift transistor through the forty-eighth via V48. The first electrode GT81 of the eighth shift transistor is electrically connected to a first doped area of the active layer GT80 of the eighth shift transistor through the forty-second via V42. The second electrode GT82 of the eighth shift transistor is electrically connected to a second doped area of the active layer GT80 of the eighth shift transistor through the forty-first via V41, and is also electrically connected to the control electrode GT53 of the fifth shift transistor through the sixty-first via V61.

Figure 16:
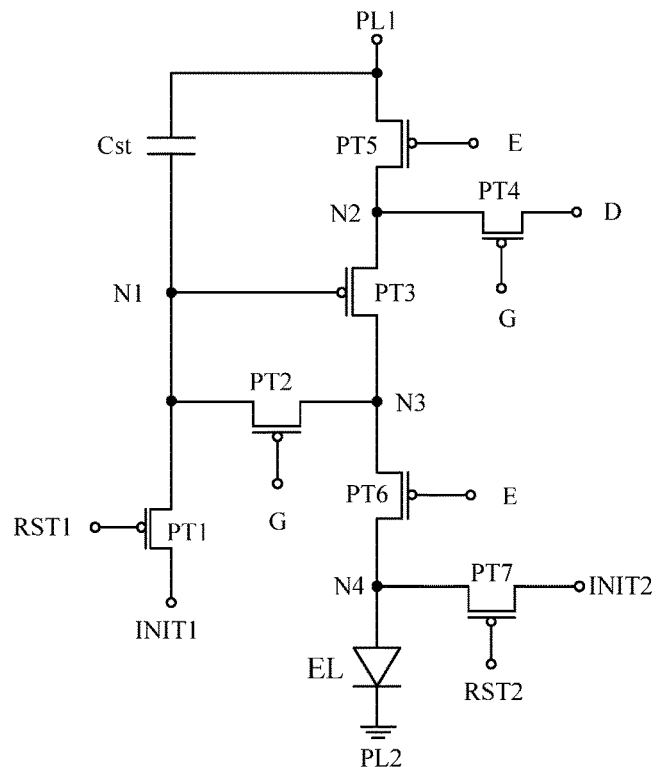
FIG. 16 is an equivalent circuit diagram of a pixel circuit according to at least one embodiment of the present disclosure.

FIG. 16 is an equivalent circuit diagram of a pixel circuit according to at least one embodiment of the present disclosure. As shown in FIG. 16, pixel circuit in this exemplary embodiment includes six switching transistors (PT1, PT2, and PT4 to PT7), one drive transistor PT3, and one storage capacitor Cst. The six switching transistors are a data writing transistor PT4, a threshold compensation transistor PT2, a first light-emitting control transistor PT5, a second light-emitting control transistor PT6, a first reset transistor PT1, and a second reset transistor PT7 respectively. A light-emitting element EL includes an anode, a cathode and an organic light-emitting layer located between the anode and the cathode.

In some exemplary embodiments, the drive transistor and the six switching transistors may be P-type transistors or may be N-type transistors. Adopting a same type of transistors in a pixel circuit may simplify a process flow, reduce a process difficulty of a display substrate, and improve a yield of products. In some exemplary embodiments, the drive transistor and the six switching transistors may include a P-type transistor and an N-type transistor.

In some exemplary implementations, as shown in FIG. 16, the pixel circuit is electrically connected to a scan line G, a data line D, a fifth power supply line PL1, a sixth power supply line PL2, a light-emitting control line E, a first initial voltage line INIT1, a second initial voltage line INIT2, a first reset control line RST1, and a second reset control line RST2. In some examples, the fifth power supply line PL1 is configured to provide a constant first voltage signal VDD for a pixel circuit, the sixth power supply line PL2 is configured to provide a constant second voltage signal VSS to a pixel circuit, wherein the first voltage signal VDD is greater than the second voltage signal VSS. The scan line G is configured to provide a scan signal SCAN for a pixel circuit, the data line D is configured to provide a data signal DATA for a pixel circuit, the light-emitting control line E is configured to provide a light-emitting control signal EM for a pixel circuit, the first reset control line RST1 is configured to provide a first reset control signal RESET1 for a pixel circuit, and the second reset control line RST2 is configured to provide a second reset control signal RESET2 for a pixel circuit. In some examples, a second reset signal RESET2 (i) received by the pixel circuit in i-th row is a scan signal SCAN (i) received by the pixel circuit in the i-th row. However, this embodiment is not limited thereto.

In some examples, the scan drive circuit in the i-th stage in the above embodiments may provide a scan signal for the pixel circuit in i-th row through the scan line G, and may also provide a second reset control signal for the pixel circuit in the i-th row through the second reset control line, and may also provide a first reset control signal for the pixel circuit in the (i−i)th row through the first reset control line. The light-emitting drive circuit in any stage in the above embodiments may provide a light-emitting control signal for two rows of pixel circuits in the display region through the light-emitting control line. However, this embodiment is not limited thereto.

In some exemplary implementations, as shown in FIG. 16, a control electrode of the data writing transistor PT4 is electrically connected to the scan line G, a first electrode of the data writing transistor PT4 is electrically connected to the data line D, and a second electrode of the data writing transistor PT4 is electrically connected to a first electrode of the drive transistor PT3. A control electrode of the threshold compensation transistor PT2 is electrically connected to the scan line G, a first electrode of the threshold compensation transistor PT2 is electrically connected to a control electrode of the drive transistor PT3, and a second electrode of the threshold compensation transistor PT2 is electrically connected to a second electrode of the drive transistor PT3. A control electrode of the first light-emitting control transistor PT5 is electrically connected to the light-emitting control line E, a first electrode of the first light-emitting control transistor PT5 is electrically connected to the first power supply line PL1, and a second electrode of the first light-emitting control transistor PT5 is electrically connected to the first electrode of the drive transistor PT3. A control electrode of the second light-emitting control transistor PT6 is electrically connected to the light-emitting control line E, a first electrode of the second light-emitting control transistor PT6 is electrically connected to the second electrode of the drive transistor PT3, and a second electrode of the second light-emitting control transistor PT6 is electrically connected to an anode of the light-emitting element EL. The first reset transistor PT1 is electrically connected to the control electrode of the drive transistor PT3 and configured to reset the control electrode of the drive transistor PT3, and the second reset transistor PT7 is electrically connected to the anode of the light-emitting element EL and configured to reset the anode of the light-emitting element EL. A control electrode of the first reset transistor PT1 is electrically connected to the first reset control line RST1, a first electrode of the first reset transistor PT1 is electrically connected to a first initial voltage line INIT1, and a second electrode of the first reset transistor PT1 is electrically connected to the control electrode of the drive transistor PT3. A control electrode of the second reset transistor PT7 is electrically connected to a second reset control line RST2, a first electrode of the second reset transistor PT7 is electrically connected to the second initial voltage line INIT2, and a second electrode of the second reset transistor PT7 is electrically connected to the anode of the light-emitting element EL. A first electrode of the storage capacitor Cst is electrically connected to the control electrode of the drive transistor PT3, and a second electrode of the storage capacitor Cst is electrically connected to the first power supply line PL1.

In this example, a first node N1 is a connection point for the storage capacitor Cst, the first reset transistor PT1, the drive transistor PT3, and the threshold compensation transistor PT2, a second node N2 is a connection point for the first light-emitting control transistor PT5, the data writing transistor PT4, and the drive transistor PT3, a third node N3 is a connection point for the drive transistor PT3, the threshold compensation transistor PT2, and the second light-emitting control transistor PT6, and a fourth node N4 is a connection point for the second light-emitting control transistor PT6, the second reset transistor PT7, and the light-emitting element EL.

A working process of the pixel circuit illustrated in FIG. 16 will be described below with reference to FIG. 17. Illustration is made by taking an example in which the multiple transistors included in the pixel circuit are P-type transistors.

Figure 17:
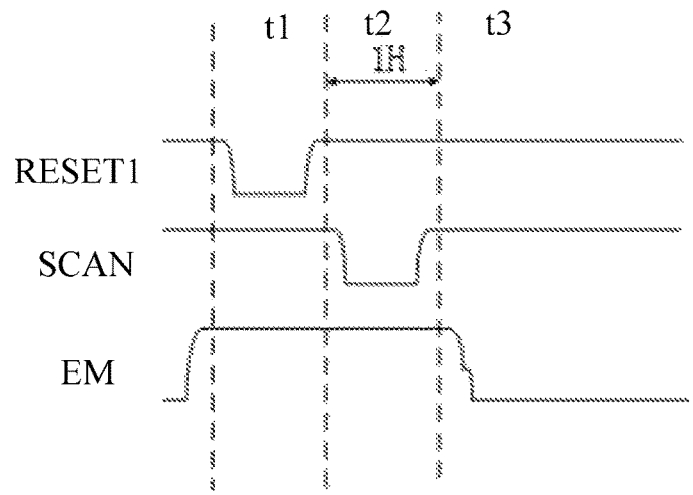
FIG. 17 is an operating timing diagram of the pixel circuit shown in FIG. 16.

In some exemplary implementations, as shown in FIG. 16 and FIG. 17, during one frame of display period, a working process of a pixel circuit may include: a reset phase t1, a data writing phase t2, and a light-emitting phase t3.

At the reset phase t1, a first reset control signal RESET1 provided by the first reset control line RST1 is a low-level signal, such that the first reset transistor PT1 is turned on, and a first initial voltage Vinit1 provided by the first initial voltage line INIT1 is provided for the first node N1 to initialize the first node N1 and clear an original data voltage in the storage capacitor Cst. A scan signal SCAN provided by the scan line G is a high-level signal, and a light-emitting control signal EM provided by the light-emitting control line E is a high-level signal, such that the data writing transistor PT4, the threshold compensation transistor PT2, the first light-emitting control transistor PT5, the second light-emitting control transistor PT6, and the second reset transistor PT7 are turned off. In this phase, the light-emitting element EL does not emit light.

The data writing phase t2 may also be called a threshold compensation phase, in which the scan signal SCAN provided by the scan line G is a low-level signal, the first reset control signal RESET1 provided by the first reset control line RST1 and the light-emitting control signal EM provided by the light-emitting control line EM are both high-level signals, and the data line D outputs a data signal DATA. In this phase, the first electrode of the storage capacitor Cst is at a low level, such that the drive transistor PT3 is turned on. The scan signal SCAN is a low-level signal, so that the threshold compensation transistor PT2, the data writing transistor PT4, and the second reset transistor PT7 are turned on. The threshold compensation transistor PT2 and the data writing transistor PT4 are turned on, such that a data voltage Vdata output by the data line D is provided for the first node N1 through the second node N2, the turned-on drive transistor PT3, the third node N3, and the turned-on threshold compensation transistor PT2, and the storage capacitor Cst is charged with a difference between the data voltage Vdata output by the data line D and a threshold voltage of the drive transistor PT3. A voltage of the first electrode (i.e., the first node N1) of the storage capacitor Cst is Vdata-|Vth|, wherein Vdata is the data voltage output by the data line D, and Vth is the threshold voltage of the drive transistor PT3. The second reset transistor PT7 is turned on, such that a second initial voltage Vinit2 provided by the second initial voltage line INIT2 is provided for the anode of the light-emitting element EL to initialize (reset) the anode of the light-emitting element EL and clear a pre-stored voltage therein, so as to complete initialization, thereby ensuring that the light-emitting element EL does not emit light. The first reset control signal RESET1 provided by the first reset control line RST1 is a high-level signal, such that the first reset transistor PT1 is turned off. The light-emitting control signal EM provided by the light-emitting control signal line E is a high-level signal, such that the first light-emitting control transistor PT5 and the second light-emitting control transistor PT6 are turned off.

In the light-emitting phase, the light-emitting control signal EM provided by the light-emitting control signal line E is a low-level signal, and the scan signal SCAN provided by the scan line G and the first reset control signal RESET1 provided by the first reset control line RST1 are high-level signals. The light-emitting control signal EM provided by the light-emitting control signal line E is a low-level signal, such that the first light-emitting control transistor PT5 and the second light-emitting control transistor PT6 are turned on, and a first voltage signal VDD output by the first power supply line PL1 provides a drive voltage for the anode of the light-emitting element EL through the turned-on first light-emitting control transistor PT5, the drive transistor PT3, and the second light-emitting control transistor PT6 to drive the light-emitting element EL to emit light.

In a drive process of the pixel circuit, a drive current flowing through the drive transistor PT3 is determined by a voltage difference between the control electrode and the first electrode of the drive transistor PT3. Since the voltage of the first node N1 is Vdata-|Vth|, the drive current of the drive transistor PT3 is as follows.

$$I=K\times(Vgs-Vth)^2=K\times[(Vdd-V\text{data}+|Vth|)-Vth]^2=K\times[(Vdd-V\text{data})]^2;$$

wherein I is the drive current flowing through the drive transistor PT3, that is, the drive current for driving the light-emitting element EL; K is a constant; Vgs is the voltage difference between the control electrode and the first electrode of the drive transistor PT3; Vth is the threshold voltage of the drive transistor PT3; Vdata is the data voltage output by the data line D; and VDD is the first voltage signal output by the first power supply line PL1.

It may be seen from the above formula that a current flowing through the light-emitting element EL is independent of the threshold voltage of the drive transistor PT3. Therefore, the pixel circuit of this embodiment may better compensate the threshold voltage of the drive transistor PT3.

Figure 18:
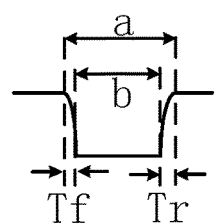
FIG. 18 is an enlarged oscillogram of a scan signal in a data writing phase.

FIG. 18 is an enlarged oscillogram of the scan signal in the data writing phase. As shown in FIG. 18, the theoretical pixel charging time is a, a is less than 1H, and 1H=1/(refresh frequency*number of rows). Due to an influence of signal attenuation and device load, the effective pixel charging time is b=a−Tr−Tf; where an rising edge Tr and an falling edge Tf are the signal delay duration generated after being affected. When the refresh frequency is same, as the number of pixel rows of the display substrate is increased, 1H will become shorter, which will lead to the corresponding shortening of the data writing time a, which will easily lead to insufficient pixel charging, thus affecting the display effect. For example, when the display substrate is a scroll screen, the number of pixel rows on the scroll screen is large, which easily leads to the situation that insufficient pixel charging affects the display effect.

According to the display substrate provided in this exemplary implementation, by optimizing the scan drive circuit and increasing the line widths of the third clock signal line and the fourth clock signal line, the rising edge and the falling edge of the scan signal output by the scan drive circuit can be reduced to improve the pixel charging time.

Figure 19:
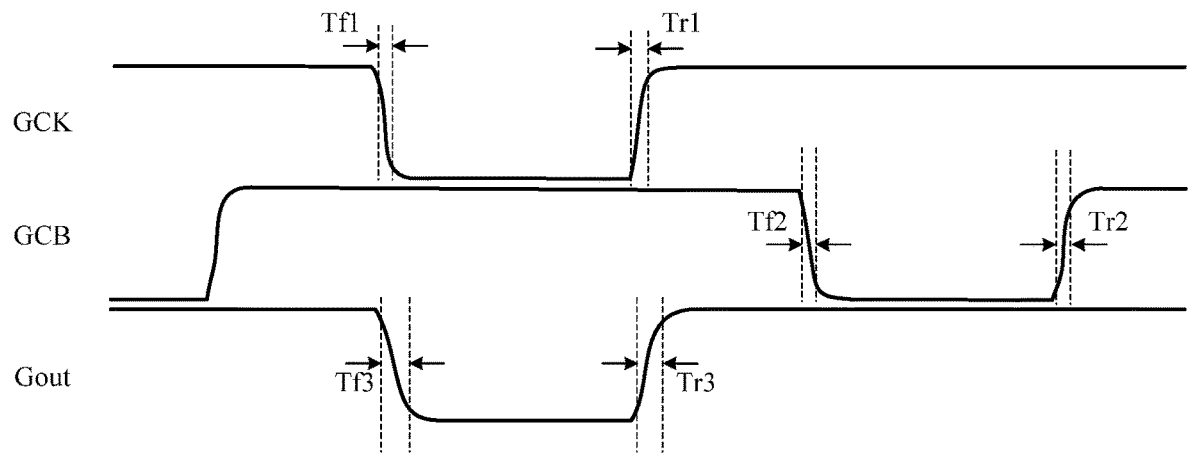
FIG. 19 is an oscillogram of a scan signal generated by a scan drive circuit according to this embodiment.

FIG. 19 is an oscillogram of a scan signal generated by the scan drive circuit provided by this embodiment. As shown in FIG. 19, illustration is made by taking an example in which the line widths of the third clock signal line GCK and the fourth clock signal line GCB are both 16 μm. A falling edge Tf1=111. 65 ns and a rising edge Tr1=117. 83 ns of the third clock signal are provided by the third clock signal line GCK. A falling edge Tf2=116. 62 ns and a rising edge Tr2=122. 17 ns of the fourth clock signal are provided by the fourth clock signal line GCB. The scan signal output by the scan drive circuit has a falling edge Tf3=212. 19 ns and a rising edge Tr3=194. 25 ns.

Illustration is made by taking an example in which the line widths of the third clock signal line GCK and the fourth clock signal line GCB are both 10 μm. The third clock signal provided by the third clock signal line GCK has a falling edge of about 198.15 ns and a rising edge of about 190.73 ns. The fourth clock signal provided by the fourth clock signal line GCB has a falling edge of about 203.69 ns and a rising edge of about 196.55 ns. The scan signal output by the scan drive circuit has a falling edge of about 251.61 ns and a rising edge of about 243.08 ns.

It can be seen that after the line widths of the third clock signal lines GCK and the fourth clock signal lines GCB are increased, the falling edge of the scan signal output by the scan drive circuit decreases by about 15.7%. The rising edge is reduced by about 20%. In this way, the charging time of pixels can be increased and the display effect can be improved.

Exemplary description is made below for a preparation process of a display substrate. A "patterning process" mentioned in the present disclosure includes coating with a photoresist, mask exposure, development, etching, photoresist stripping, and other treatments for a metal material, an inorganic material, or a transparent conductive material, and includes coating with an organic material, mask exposure, development, and other treatments for an organic material. The deposition may be any one or more of sputtering, evaporation, and chemical vapor deposition. The coating may be any one or more of spray coating, spin coating, and ink-jet printing. The etching may be any one or more of dry etching and wet etching, which is not limited in present disclosure. "A and B being disposed on a same layer" mentioned in the present disclosure means that A and B are formed simultaneously through a same patterning process, and a "thickness" of a film layer is a dimension of the film layer in a direction perpendicular to a display substrate. Herein, "an orthographic projection of A including an orthographic projection of B" or "an orthographic projection of B is within a range of an orthographic projection of A" means that a boundary of the orthographic projection of B falls within a range of a boundary of the orthographic projection of A, or the boundary of the orthographic projection of A overlaps with the boundary of the orthographic projection of B.

In some exemplary embodiments, a preparation process of a display substrate may include following operations.

(1) A base substrate is provided.

In some exemplary implementations, the base substrate 20 may be a flexible substrate. For example, the base substrate 50 may include a first flexible material layer, a first inorganic material layer, a second flexible material layer and a second inorganic material layer which are stacked. A material of the first flexible material layer and the second flexible material layer may be Polyimide (PI), Polyethylene Terephthalate (PET), or a polymer soft film subjected to a surface treatment, etc. A material of the first inorganic material layer and the second inorganic material layer may be Silicon Nitride (SiNx) or Silicon Oxide (SiOx), etc., which are used for improving water and oxygen resistance of the base substrate. The first inorganic material layer and the second inorganic material layer may be referred to as barrier layers. However, this embodiment is not limited thereto. For example, the base substrate may be a hard substrate.

(2) A semiconductor layer is prepared on the base substrate.

In some exemplary implementations, a semiconductor thin film is deposited on the base substrate 20, and the semiconductor thin film is patterned by a patterning process to form a semiconductor layer, as shown in FIG. 7A and FIG. 15A.

(3) A first conductive layer is prepared on the base substrate.

In some exemplary implementations, a first insulation thin film and a first metal thin film are sequentially deposited on the base substrate 20 on which the aforementioned structure are formed, so as to form a first insulation layer 21 covering the semiconductor layer, and the first metal thin film is patterned by a patterning process to form a first conductive layer, as shown in FIG. 7B and FIG. 15B.

(4) A second conductive layer is prepared on the base substrate.

In some exemplary implementations, a second insulation thin film and a second metal thin film are sequentially deposited on the base substrate 20 on which the aforementioned structures are formed, so as to form a second insulation layer 22 covering the first conductive layer, and the second metal thin film is patterned by a patterning process to form a second conductive layer, as shown in FIG. 7C and FIG. 15C.

(5) A third insulation layer is prepared on the base substrate. In some exemplary implementations, a third insulation thin film is deposited on the base substrate 20 on which the aforementioned structures are formed, and the third insulation thin film is patterned by a patterning process to form a third insulation layer 23, wherein the third insulation layer 23 is provided with multiple vias, as shown in FIG. 7D and FIG. 15D.

(6) A third conductive layer is prepared on the base substrate. In some exemplary implementations, a third metal thin film is deposited on the base substrate 20 on which the aforementioned structures are formed, and the third metal thin film is patterned by a patterning process to form a third conductive layer, as shown in FIG. 7E and FIG. 15E.

In some exemplary implementations, the first conductive layer, the second conductive layer, and the third conductive layer may be made of metal materials, e.g., any one or more of Argentum (Ag), Copper (Cu), Aluminum (Al), and Molybdenum (Mo), or alloy materials of the aforementioned metals, e.g., an Aluminum-Neodymium alloy (AlNd) or a Molybdenum-Niobium alloy (MoNb), and may have a single-layer structure, or a multilayer composite structure such as Mo/Cu/Mo. The first insulation layer 21, the second insulation layer 22, and the third insulation layer 23 may be made of any one or more of Silicon Oxide (SiOx), Silicon Nitride (SiNx), and Silicon Oxynitride (SiON), and may be in a single layer, a multi-layer, or a composite layer. However, this embodiment is not limited thereto.

In some exemplary implementations, the preparation of light-emitting elements of sub-pixels may continue in the display region. A light-emitting element of a sub-pixel may include: an anode, a pixel definition layer, an organic light-emitting layer, and a cathode. The pixel definition layer has a pixel opening exposing the anode, and an organic light-emitting layer is formed in the pixel opening. The organic light-emitting layer of the light-emitting element is connected to the anode, the cathode is connected to the organic light-emitting layer, and the organic light-emitting layer is driven by the anode and the cathode to emit light with a corresponding color. An encapsulation layer may be provided at a side of the cathode away from the base substrate. The encapsulation layer may include a first encapsulation layer, a second encapsulation layer, and a third encapsulation layer that are stacked. The first encapsulation layer and the third encapsulation layer may be made of an inorganic material, and the second encapsulation layer may be made of an organic material. The second encapsulation layer is provided between the first encapsulation layer and the third encapsulation layer to ensure that external water vapor cannot enter the light-emitting layer.

The structure of the display substrate and the preparation process thereof according to this exemplary embodiment are merely described as an example. In some exemplary implementations, corresponding structures may be changed and processes may be added or reduced depending on actual requirements.

Figure 20:
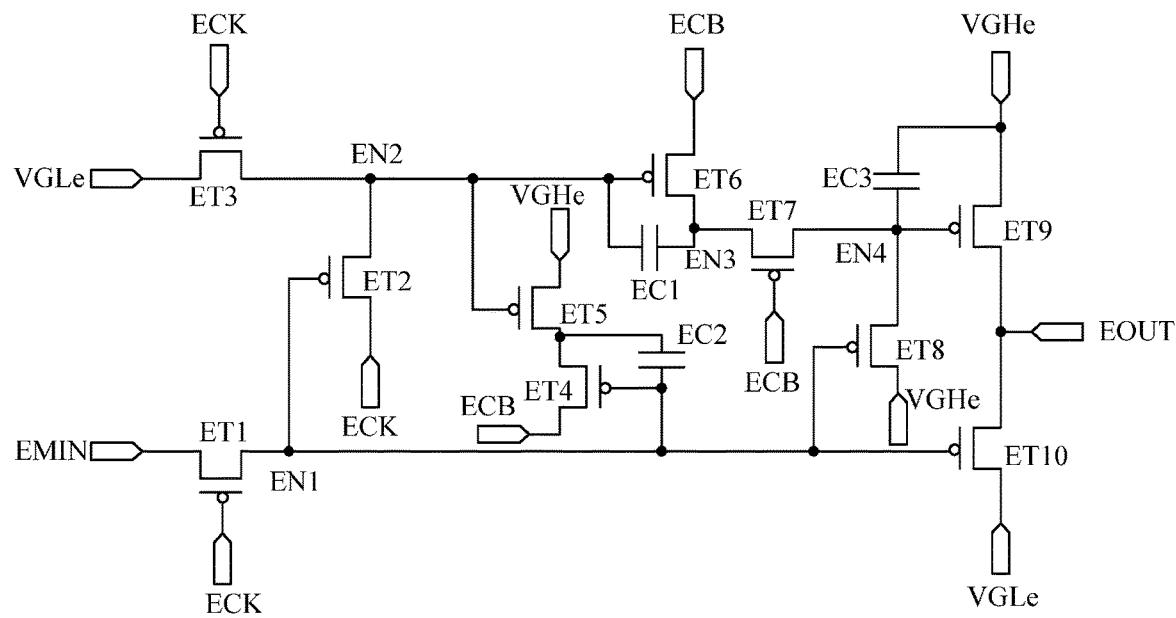
FIG. 20 is an equivalent circuit diagram of another light-emitting drive circuit according to at least one embodiment of the present disclosure.

FIG. 20 is an equivalent circuit diagram of another light-emitting drive circuit according to at least one embodiment of the present disclosure. In some exemplary implementations, as shown in FIG. 20, the light-emitting drive circuit provided by this exemplary embodiment may include: a first control transistor ET1 to a tenth control transistor ET10, a first control storage capacitor EC1, a second control storage capacitor EC2, and a third control storage capacitor EC3. The ninth control transistor ET9 and the tenth control transistor ET10 are output transistors of the light-emitting drive circuit. The first control transistor ET1 is an input transistor of the light-emitting drive circuit.

In this example, as shown in FIG. 20, a control electrode of the first control transistor ET1 is electrically connected to a first clock signal terminal ECK1, a first electrode of the first control transistor ET1 is electrically connected to a first input terminal EMIN, and a second electrode of the first control transistor ET1 is electrically connected to a first control node EN1. A control electrode of the second control transistor ET2 is electrically connected to the first control node EN1, a first electrode of the second control transistor ET2 is electrically connected to the first clock signal line ECK, and a second electrode of the second control transistor ET2 is electrically connected to a second control node EN2. A control electrode of the second control transistor ET3 is electrically connected to the first clock signal line ECK, a first electrode of the second control transistor ET3 is electrically connected to a second power supply line VGLe, and a second electrode of the second control transistor ET3 is electrically connected to the second control node EN2. A control electrode of the fourth control transistor ET4 is electrically connected to the first control node EN1, a first electrode of the fourth control transistor ET4 is electrically connected to a second clock signal line ECB, and a second electrode of the fourth control transistor ET4 is electrically connected to a second electrode of the fifth control transistor ET5. A control electrode of the ninth transistor ET5 is electrically connected to the second control node EN2, and a first electrode of the ninth transistor ET5 is electrically connected to a first power supply line VGHe. A control electrode of the sixth control transistor ET6 is electrically connected to the second control node EN2, a first electrode of the sixth control transistor ET6 is electrically connected to the second clock signal line ECB, and a second electrode of the sixth control transistor ET6 is electrically connected to a third control node EN3. A control electrode of the seventh control transistor ET7 is electrically connected to the second clock signal line ECB, a first electrode of the seventh control transistor ET7 is electrically connected to the third control node EN3, and a second electrode of the seventh control transistor ET7 is electrically connected to a fourth control node EN4. A control electrode of the eighth control transistor ET8 is electrically connected to the first control node EN1, a first electrode of the eighth control transistor ET8 is electrically connected to the first power supply line VGHe, and a second electrode of the eighth control transistor ET8 is electrically connected to the fourth control node EN4. A control electrode of the ninth control transistor ET9 is electrically connected to the fourth control node EN4, a first electrode of the ninth control transistor ET9 is electrically connected to the first power supply line VGHe, and a second electrode of the ninth control transistor ET9 is electrically connected to the first output terminal EOUT. A control electrode of the tenth control transistor ET10 is electrically connected to the first control node EN1, a first electrode of the tenth control transistor ET10 is electrically connected to a second power supply line VGLe, and a second electrode of the tenth control transistor ET10 is electrically connected to the first output terminal EOUT. A first electrode of the first control storage capacitor EC1 is electrically connected to the control electrode of the sixth control transistor ET6, and a second electrode of the first control storage capacitor EC1 is electrically connected to the third control node EN3. The first electrode of the second control storage capacitor EC2 is electrically connected to the first control node EN1, and the second electrode of the second control storage capacitor EC2 is electrically connected to the second electrode of the fifth control transistor ET5. A first electrode of the third control storage capacitor EC3 is electrically connected to the control electrode of the ninth control transistor ET9, and a second electrode of the third control storage capacitor EC3 is electrically connected to the first power supply line VGHe.

Arrangement mode of the light-emitting drive circuit in the peripheral region and arrangement of the auxiliary structure according to this embodiment may be referred to the description of the foregoing embodiment, so the details will not be repeated here.

Figure 21:
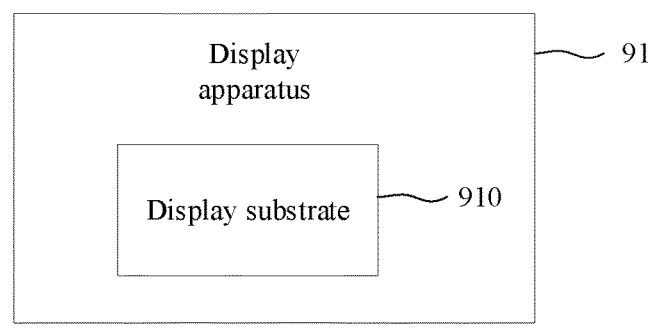
FIG. 21 is a schematic diagram of a display apparatus according to at least one embodiment of the present disclosure.

FIG. 21 is a schematic diagram of a display apparatus according to at least one embodiment of the present disclosure. As shown in FIG. 21, a display apparatus 91 provided in this embodiment includes a display substrate 910. The display substrate 910 may be an OLED display substrate, a QLED display substrate, a micro-LED display substrate, or a mini-LED display substrate. The display apparatus 91 may be any product or component with a display function, such as an OLED display apparatus, a watch, a mobile phone, a tablet computer, a television, a display, a laptop computer, a digital photo frame, and a navigator. However, this embodiment is not limited thereto.

The drawings of the present disclosure only involve structures involved in the present disclosure, and other structures may refer to conventional designs. The embodiments of the present disclosure and features in the embodiments may be combined to each other to obtain new embodiments if there is no conflict. Those of ordinary skills in the art should understand that modifications or equivalent replacements may be made to the technical solutions of the present disclosure without departing from the spirit and scope of the technical solutions of the present disclosure, and shall all fall within the scope of the claims of the present disclosure.

The invention claimed is:

1. A display substrate, comprising:
a base substrate, comprising a display region and a peripheral region located at a periphery of the display region;
a plurality of sub-pixels, located in the display region;
a plurality of first gate drive circuits and at least one auxiliary structure, which are located in the peripheral region; wherein
the plurality of first gate drive circuits are configured to provide a first gate drive signal for the plurality of sub-pixels;
the at least one auxiliary structure is disposed between adjacent first gate drive circuits;
the at least one auxiliary structure comprises: at least one first auxiliary structure;
a first auxiliary structure is located between a first gate drive circuit in n-th stage and a first gate drive circuit in (n−1)-th stage, the first gate drive circuit in the n-th stage and the first gate drive circuit in the (n−1)-th stage are not cascaded;
the first gate drive circuit in the n-th stage is electrically connected to a first start signal line through the first auxiliary structure, where n is an integer;
the first auxiliary structure comprises: a first auxiliary semiconductor block, a first connection electrode, and a second connection electrode; and
the first auxiliary semiconductor block is electrically connected to an output terminal of the first gate drive circuit in the n-th stage and the second connection electrode, the second connection electrode is electrically connected to the first connection electrode, and the first connection electrode is electrically connected to the first start signal line.

2. The display substrate according to claim 1, wherein the auxiliary structure is located between output transistors of the adjacent first gate drive circuits.

3. The display substrate according to claim 1, wherein the first start signal line is located at a side of the plurality of first gate drive circuits close to the display region.

4. The display substrate according to claim 3, wherein the first gate drive circuits are electrically connected to a first power supply line located at a side of the first gate drive circuits away from the display region and a second power supply line located at a side of the first gate drive circuits close to the display region, and the first start signal line is located at a side of the second power supply line close to the display region.

5. The display substrate according to claim 4, further comprising: at least one third auxiliary structure located on a side of two output transistors of at least one first gate drive circuit close to the first power supply line; and
the at least one third auxiliary structure includes at least one second auxiliary conductive block electrically connected to a first output terminal of the at least one first gate drive circuit.

6. The display substrate according to claim 1, wherein the second connection electrode and the first start signal line are in a same layer, and the first auxiliary semiconductor block and the first connection electrode are located at a side of the second connection electrode close to the base substrate.

7. The display substrate according to claim 1, wherein the at least one auxiliary structure comprises at least one second auxiliary structure located between two first gate drive circuits that are cascaded.

8. The display substrate according to claim 7, wherein the second auxiliary structure comprises at least one second auxiliary semiconductor block, and an inorganic composite insulation layer covering the second auxiliary semiconductor block is provided with at least one auxiliary via exposing a surface of the second auxiliary semiconductor block.

9. The display substrate according to claim 8, wherein an orthographic projection of the second auxiliary semiconductor block is rectangular, and a length of the orthographic projection along a first direction is greater than a length of the orthographic projection along a second direction, and the plurality of first gate drive circuits are sequentially arranged along the second direction, wherein the first direction intersects the second direction; or
wherein a density of the at least one auxiliary vias of the second auxiliary structure is substantially the same as a density of vias formed on the inorganic composite insulation layer on an active layer of output transistors of the adjacent first gate drive circuits; or
wherein the second auxiliary structure comprises two second auxiliary semiconductor blocks with a substantially same shape, or, the two second auxiliary semiconductor blocks are formed into an integrated structure.

10. The display substrate according to claim 7, wherein the at least one second auxiliary structure is electrically connected to a second power supply line; wherein
the at least one second auxiliary structure comprises: at least one third auxiliary semiconductor block, and the at least one third auxiliary semiconductor block is electrically connected to the second power supply line; or the at least one second auxiliary structure comprises: at least one first auxiliary conductive block, and the at least one first auxiliary conductive block is electrically connected to the second power supply line.

11. The display substrate according to claim 7, wherein the at least one second auxiliary structure is electrically connected to a first start signal line;
   wherein the at least one second auxiliary structure comprises: a fourth auxiliary semiconductor block, a fifth connection electrode, and a sixth connection electrode; and
   the fourth auxiliary semiconductor block is electrically connected to the fifth connection electrode, the fifth connection electrode is electrically connected to the sixth connection electrode, and the sixth connection electrode is electrically connected to the first start signal line.

12. The display substrate according to claim 3, wherein the plurality of first gate drive circuits are divided into two groups with each group comprising a plurality of cascaded first gate drive circuits; a first group of first gate drive circuits comprises first gate drive circuits from a first stage to the (n−1)-th stage, and the second group of first gate drive circuits comprises first gate drive circuits from the n-th stage to k-th stage;
   in the first group of first gate drive circuits, a first input terminal of the first gate drive circuit in the first stage is electrically connected to a second start signal line, a first output terminal of the first gate drive circuit in the k-th stage is electrically connected to a first input terminal of a first gate drive circuit in (k+1)-th stage, where k is an integer greater than 0 and less than (n−1), and K is an integer greater than n.

13. The display substrate according to claim 1, wherein the base substrate further comprises a bonding region located at a side of the display region;
   in the peripheral region, a first gate drive circuit in i-th stage is located at a side of a first gate drive circuit in (i−1)-th stage away from the bonding region, where i is an integer.

14. The display substrate according to claim 13, wherein the first gate drive circuit at least comprises an input transistor, an output transistor, and a plurality of storage capacitors, the input transistor is located at a side of the output transistor away from the display region and at a side of the plurality of storage capacitors close to the bonding region.

15. The display substrate according to claim 1, further comprising a plurality of cascaded second gate drive circuits located in the peripheral region, and the second gate drive circuits are electrically connected to a second group of clock signal lines;
   the first gate drive circuits are electrically connected to a first group of clock signal lines, wherein a line width of at least one clock signal line in the second group of clock signal lines is larger than 1.4 times of a line width of at least one clock signal line in the first group of clock signal lines.

16. The display substrate according to claim 15, wherein the line width of the at least one clock signal line in the second group of clock signal lines is about 15 microns to 25 microns; or
   the line width of the at least one clock signal line in the first group of clock signal lines is about 10 microns, and the line width of the at least one clock signal line in the second group of clock signal lines is about 15 microns; or
   the second gate drive circuits are located at a side of the first gate drive circuits close to the display region, the second group of clock signal lines are located at a side of the second gate drive circuits close to the first gate drive circuits, and the first group of clock signal lines are located at a side of the first gate drive circuits away from the second gate drive circuits.

17. The display substrate according to claim 16, wherein the first gate drive signal provided by the first gate drive circuits for the plurality of sub-pixels is a light-emitting control signal, and the second gate drive circuits are configured to provide a scan signal for the plurality of sub-pixels.

18. A display apparatus, comprising the display substrate according to claim 1.

* * * * *

UNITED STATES PATENT AND TRADEMARK OFFICE
CERTIFICATE OF CORRECTION

PATENT NO. : 11,955,088 B2
APPLICATION NO. : 18/086524
DATED : April 9, 2024
INVENTOR(S) : Lu Bai et al.

It is certified that error appears in the above-identified patent and that said Letters Patent is hereby corrected as shown below:

In the Claims

Column 47, Lines 18-33 Claim 12 should be:
12. The display substrate according to claim 1, wherein the plurality of first gate drive circuits are divided into two groups with each group comprising a plurality of cascaded first gate drive circuits; a first group of first gate drive circuits comprises first gate drive circuits from a first stage to the (n–1)-th stage, and the second group of first gate drive circuits comprises first gate drive circuits from the n-th stage to k-th stage;
in the first group of first gate drive circuits, a first input terminal of the first gate drive circuit in the first stage is electrically connected to a second start signal line, a first output terminal of the first gate drive circuit in the k-th stage is electrically connected to a first input terminal of a first gate drive circuit in (k+1)-th stage,
where k is an integer greater than 0 and less than (n–1), and K is an integer greater than n.

Signed and Sealed this
Fourth Day of June, 2024

Katherine Kelly Vidal
Director of the United States Patent and Trademark Office